United States Patent [19]

Sakamoto et al.

[11] Patent Number: 5,251,122
[45] Date of Patent: Oct. 5, 1993

[54] SYSTEM FOR AUTOMATICALLY GENERATING A SEQUENTIAL CONTROL PROGRAM

[75] Inventors: Shunji Sakamoto; Toshihiko Hoshino, both of Hiroshima, Japan

[73] Assignee: Mazda Motor Corporation, Hiroshima, Japan

[21] Appl. No.: 590,079

[22] Filed: Sep. 28, 1990

[30] Foreign Application Priority Data

| Sep. 29, 1989 | [JP] | Japan | 1-253991 |
| Feb. 9, 1990 | [JP] | Japan | 2-30378 |
| Feb. 9, 1990 | [JP] | Japan | 2-30379 |
| Aug. 31, 1990 | [JP] | Japan | 2-231843 |
| Aug. 31, 1990 | [JP] | Japan | 2-231845 |

[51] Int. Cl.$^5$ ............................................. G06F 15/46
[52] U.S. Cl. ................................ 364/147; 364/192; 364/468
[58] Field of Search .......................... 364/140-147, 364/191-193, 468

[56] References Cited

U.S. PATENT DOCUMENTS

| 4,455,619 | 6/1984 | Masui et al. | 364/147 |
| 4,488,258 | 12/1984 | Struger et al. | 364/147 |
| 4,703,414 | 10/1987 | Inoue et al. | 364/147 |
| 4,858,102 | 8/1989 | Lovrenich | 364/141 |
| 5,097,405 | 3/1992 | Sato | 364/147 |
| 5,148,363 | 9/1992 | Sakamoto et al. | 364/147 |

FOREIGN PATENT DOCUMENTS

| 0067446 | 12/1982 | European Pat. Off. . |
| 63-106004 | 5/1988 | Japan . |
| 2077966 | 12/1981 | United Kingdom . |

OTHER PUBLICATIONS

Proceedings IECON 1987, vol. 2, Nov. 1987, U.S.A., "Distributed Emulation of Flexible Manufacturing Systems", Courvoisier et al., pp. 957-964.

Primary Examiner—Jerry Smith
Assistant Examiner—Thomas E. Brown

[57] ABSTRACT

A method and an apparatus for automatically composing a program for conducting sequential control of operations which are successively performed by various equipment units for a production line. These operations are grouped into operation blocks each having a sequence of unit operations so that each operation block can be conducted independently of the other blocks. Standardized step ladder patterns for the operation steps constituting each operation block is stored before the program composition. First data for describing the operation blocks and the ordinal relationship between the operation blocks is input. Second data for describing specific operations of the operation steps constituting each of the operation blocks and third data designating the order of execution of the operation steps are input and stored. The step ladder pattern corresponding to one of the operation steps constituting each operation block and the second data for this operation step are read out. The second data is appended to the read step ladder pattern to form a step ladder element. These operations of reading and step ladder element formation are repeated with respect to the operation steps in order of upper to lower operation steps based on the third data. This operation is performed with respect to all the operation blocks based on the first data.

8 Claims, 43 Drawing Sheets

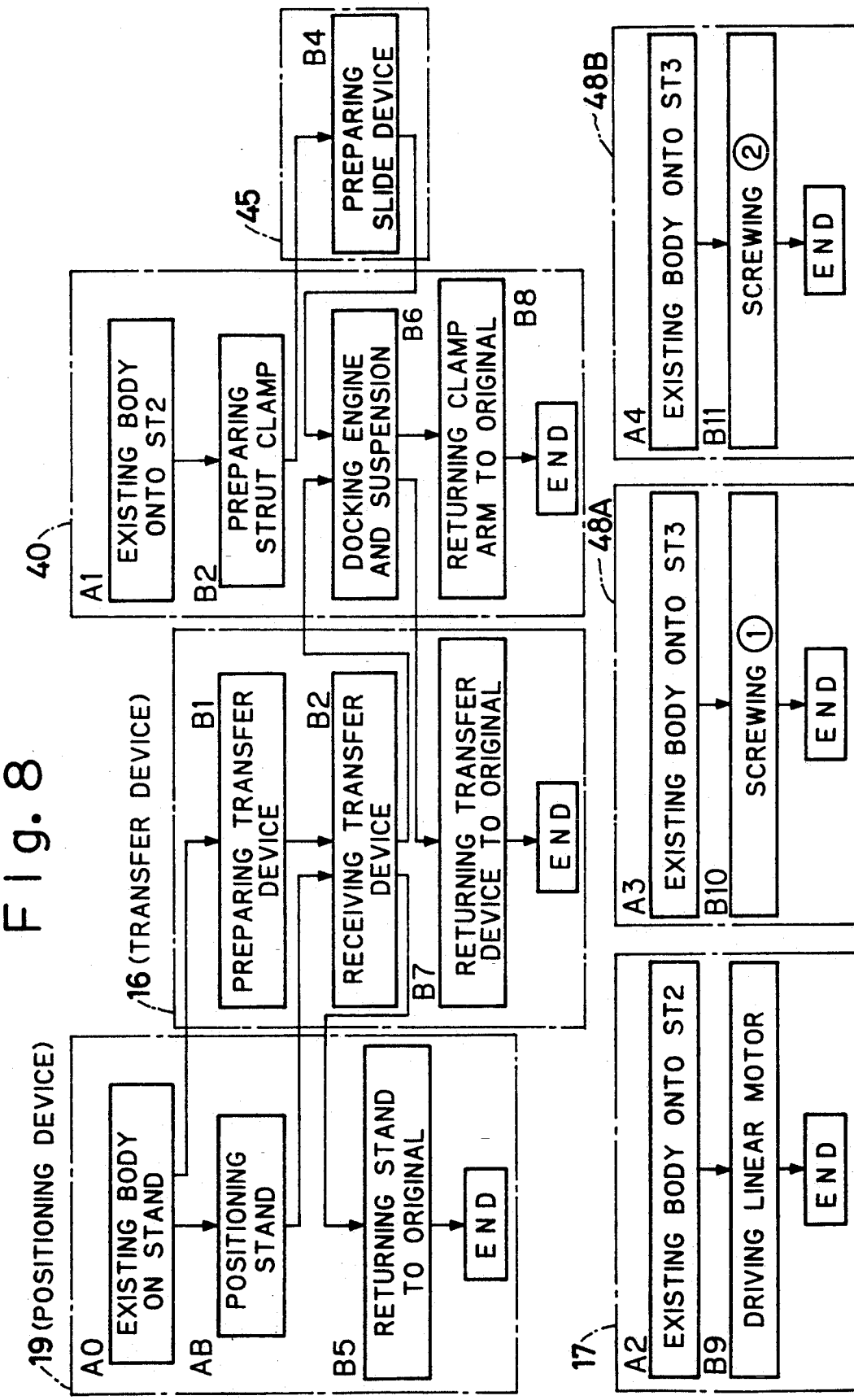

| No. | SC-REG | BLOCK NAME | FROM | TO | CLEAR CONDITION | EQUIPMENT |
|---|---|---|---|---|---|---|
| B0 | D1000 | RECEIVING STAND POSITIONING | BODY PRESENT ON STAND | B3 | B5 | 119 |
| B1 | D1001 | TRANSFER DEVICE PREPARING | BODY PRESENT ON STAND | B3 | B7 | 116 |
| B2 | D1002 | STRUT CLAMPING PREPARING | BODY PRESENT IN ST2 | B4 | B8 | 140 |
| B3 | D1003 | TRANSFER DEVICE RECEIVING | B0, B1 | B5, B6 | B7 | 119, 116 |
| B4 | D1004 | SLIDE DEVICE PREPARING | B2 | B6 | B7, B8 | 145 |
| B5 | D1005 | RECEIVING STAND RETURNING | B3 | - | B5 | 119 |
| B6 | D1006 | ENGINE/SUSPENSION DOCKING | B3, B4 | B7, B8 | B7, B8 | 116, 140, 145 |
| B7 | D1007 | TRASNFER DEVICE RETURNING | B6 | - | B7 | 116 |
| B8 | D1008 | CLAMP ARM RETURNING | B6 | - | B8 | 140 |
| B9 | D1009 | LINEAR MOTOR DRIVING | BODY PRESENT IN ST2 | - | B9 | 117 |
| B10 | D1010 | SCREWING ① | BODY PRESENT IN ST3 | - | B10 | 148A |
| B11 | D1011 | SCREWING ② | BODY PRESENT IN ST3 | - | B11 | 148B |

Fig. 13

| 119 | POSITIONING DEVICE B0, B3, B5 | | | | | |
|---|---|---|---|---|---|---|
| NO. | COMMENT | OPERATION | OUTPUT COIL DEVICE | CONF. INPUT CONTACT | MANUAL INPUT CONTACT | ORIGINAL POSITION |
| A01 | WORK PRESENT | | | X0 | X1 | · |
| A02 | BF(POSITIONING) | OUT | Y1 | X1 | XB | |
| A03 | BF(POSITIONING) | RETURN | Y2 | X2 | XC | o |
| A04 | BR(POSITIONING) | OUT | Y3 | X3 | XD | |
| A05 | BR(POSITIONING) | RETURN | Y4 | X4 | XE | o |
| A06 | TL(POSITIONING) | OUT | T5 | X5 | XF | |
| A07 | TL(POSITIONING) | RETURN | Y6 | X6 | X10 | o |
| A08 | FR (REF. PIN) | OUT | Y7 | X7 | X11 | |
| A09 | FR (REF. PIN) | RETURN | Y8 | X8 | X12 | o |
| A10 | FL (REF. PIN) | OUT | Y9 | X9 | X13 | |
| A11 | FL (REF. PIN) | RETURN | YA | XA | X14 | o |
| A12 | RR (REF. PIN) | OUT | YB | XB | X15 | |
| A13 | RR (REF. PIN) | RETURN | YC | XC | X16 | o |
| A14 | RL (REF. PIN) | OUT | YD | XD | X17 | |
| A15 | RL (REF. PIN) | RETURN | YE | XE | X18 | o |

Fig. 14

| NO. | COMMENT | OPERATION | OUTPUT COIL | CONFIRMATION INPUT CONTACT | MANUAL INPUT CONTACT | ORIGINAL POSITION | RETURN CONFIRMATION CONTACT | SIMULTANEOUS OPERATION |
|---|---|---|---|---|---|---|---|---|
| B0000 | OPERATION BLK. PREPARING | | | | | | | |
| B0S0 | CONDITION CONFIRMATION | - | Y0 | X0 | XA | | | |
| B0S1 | BF(POSITIONING) | OUT | Y1 | X1 | XB | | X8 | |
| B0S2 | BR(POSITIONING) | OUT | Y2 | X2 | XC | | X9 | |
| B0S3 | TL(POSITIONING) | OUT | Y3 | X3 | XD | | | |
| B0S4 | FR (REF. PIN) | OUT | Y4 | X4 | XE | | | 1 |
| B0S5 | FL (REF. PIN) | OUT | Y5 | X5 | XF | | | 1 |
| B0S6 | RR (REF. PIN) | OUT | Y6 | X6 | X10 | | | 1 |
| B0S7 | RL (REF. PIN) | OUT | Y7 | X7 | X11 | | | 1 |
| B0S8 | BF (RETURNING) | RETURN | Y8 | X8 | X12 | o | | |
| B0S9 | BR (RETURNING) | RETURN | Y9 | X9 | X13 | o | | |
| B999 | OPERATION BLK COMPLETED | | | | | | | |

Fig. 15

BLOCK B1

| STEP No. | OUTPUT OPERATION ELEMENT | CONFIRMATION OPERATION ELEMENT | CONFIRMATION OPERATION ELEMENT STATUS |
|---|---|---|---|
| B1S0 | Y0 | X0 | N |
| B1S1 | Y1 | X1 | N |
| B1S2 | Y2 | X2 | N |

Fig. 18

BLOCK B3

| STEP No. | OUTPUT OPERATION ELEMENT | CONFIRMATION OPERATION ELEMENT | CONFIRMATION OPERATION ELEMENT STATUS |
|---|---|---|---|
| B3S0 | YA | XA | N |
| B3S1 | YB | XB | N |
| B3S2 | YC | XC | N |
| B3S3 | YD | XD | N |
| B3S4 | YE | XE | N |
| B3S5 | YF | XF | N |

Fig. 19

Fig. 23
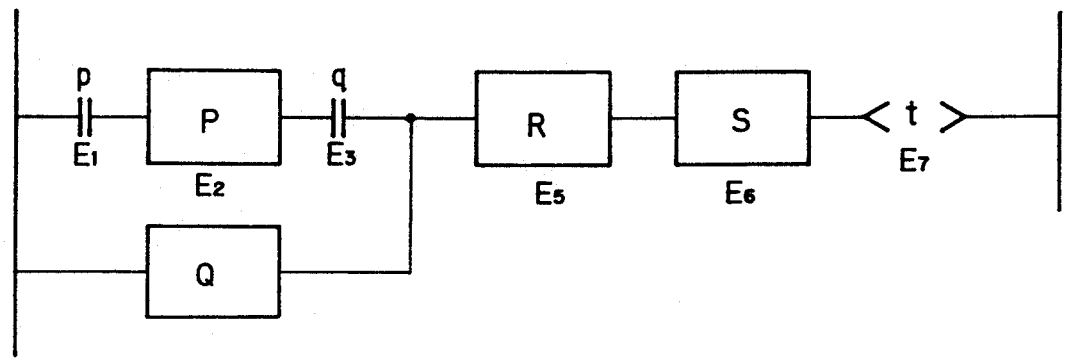
Fig. 24A   P : 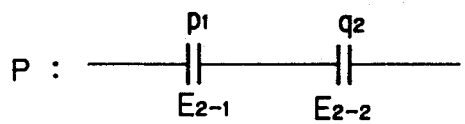
Fig. 24B   Q : 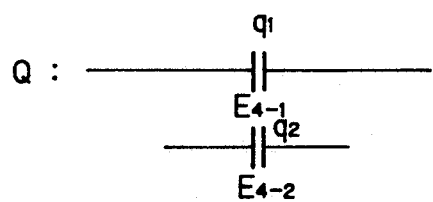
Fig. 24C   R : 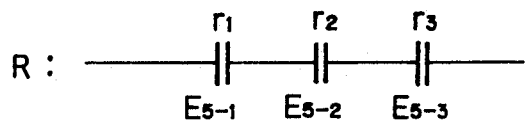
Fig. 24D   S : 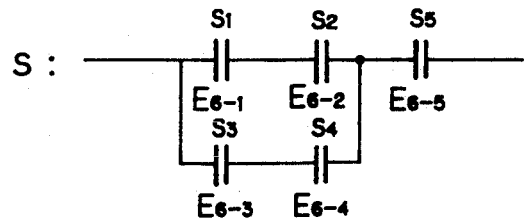

Fig. 25

| | | |
|---|---|---|
| $E_1$ | LOAD | p |
| $E_2$ | AND | p |
| $E_{2-1}$ | AND | $p_1$ |
| $E_{2-2}$ | AND | $p_2$ |
| $E_3$ | AND | q |
| $E_4$ | OR | Q |
| $E_{4-1}$ | OR | $q_1$ |
| $E_{4-2}$ | OR | $q_2$ |
| $E_5$ | AND | R |
| $E_{5-1}$ | AND | $r_1$ |
| $E_{5-2}$ | AND | $r_2$ |
| $E_{5-3}$ | AND | $r_3$ |
| $E_6$ | AND | S |
| $E_{6-1}$ | AND | $s_1$ |
| $E_{6-2}$ | AND | $s_2$ |
| $E_{6-3}$ | OR | $s_3$ |
| $E_{6-4}$ | AND | $s_4$ |
| $E_{6-5}$ | AND | $s_5$ |
| $E_7$ | OUT | t |

| | | SET OF OPERATION CONFIRMATION DEVICES | SET OF MANUAL OUTPUT DEVICES |
|---|---|---|---|
| OUTPUT | Y1 | X100, X101, X102 | M10, M20 |
| | Bx Sy | ......... | ......... |
| | | ......... | |
| | | ......... | |

| SYMBOL | | PARTICULAR DEVICE | STATUS |
|---|---|---|---|
| P | | MA | N |
| P | $P_1$ | $X_4$ | N |
|   | $P_2$ | $X_5$ | N |
| q | | MS | I |
| Q | $q_1$ | $M_{10}$ | I |
|   | $q_2$ | $M_{20}$ | N |
| R | $r_1$ | $X_{100}$ | I |
|   | $r_2$ | $X_{101}$ | N |
|   | $r_3$ | $X_{102}$ | N |
| S | $S_1$ | $M_{30}$ | I |
|   | $S_2$ | $M_{31}$ | N |
|   | $S_3$ | $M_{32}$ | I |
|   | $S_4$ | $M_{33}$ | N |
|   | $S_5$ | $M_{34}$ | N |
| t | | $Y_1$ | |

Fig. 30

| | | | |
|---|---|---|---|
| n=1 | E₁ | LOAD | MA |
| n,m=2,1 | E₂₁ | AND | X₄ |
| n=2 m=2 | E₂₂ | AND | X₅ |
| n=3 | E₂₋₃ | I AND | MS |
| n=4 m=1 | E₄₋₁ | OR | M₁₀ |
| n=4 m=2 | E₄₋₂ | OR | M₂₀ |
| n=5 m=1 | E₅₋₁ | I AND | X₁₀₀ |
| n=5 m=2 | E₅₋₂ | AND | X₁₀₁ |
| n=5 m=3 | E₅₋₃ | AND | X₁₀₂ |
| n=6 m=1 | E₆₋₁ | I AND | M₃₀ |
| n=6 m=2 | E₆₋₂ | AND | M₃₁ |
| n=6 m=3 | E₆₋₃ | OR | M₃₂ |
| n=6 m=4 | E₆₋₄ | AND | M₃₃ |
| n=6 m=5 | E₆₋₅ | AND | M₃₄ |
| n=7 | E₇ | OUT | Y₁ |

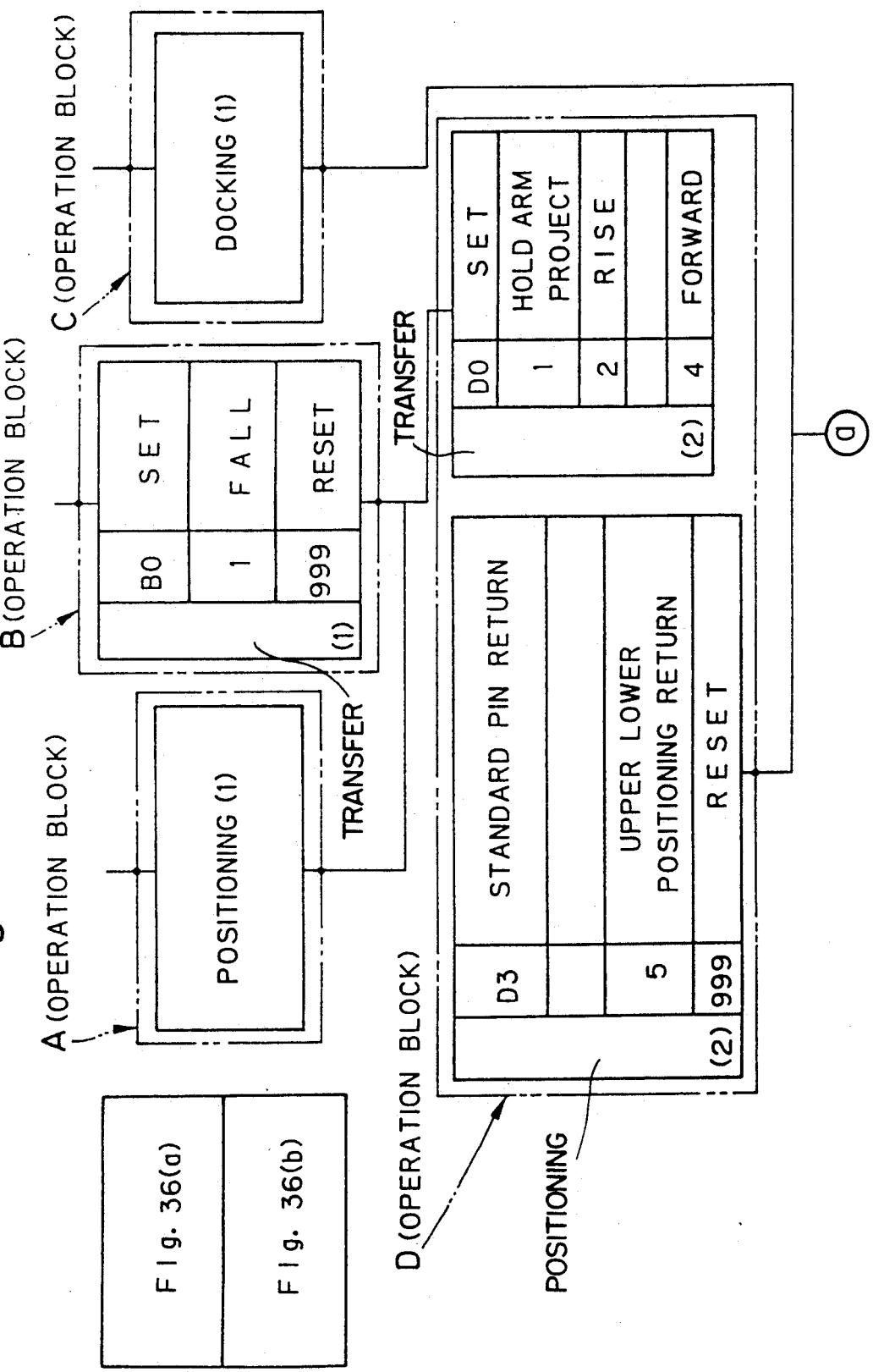

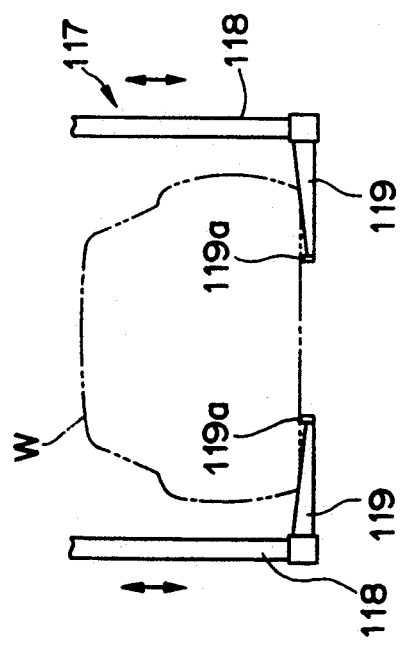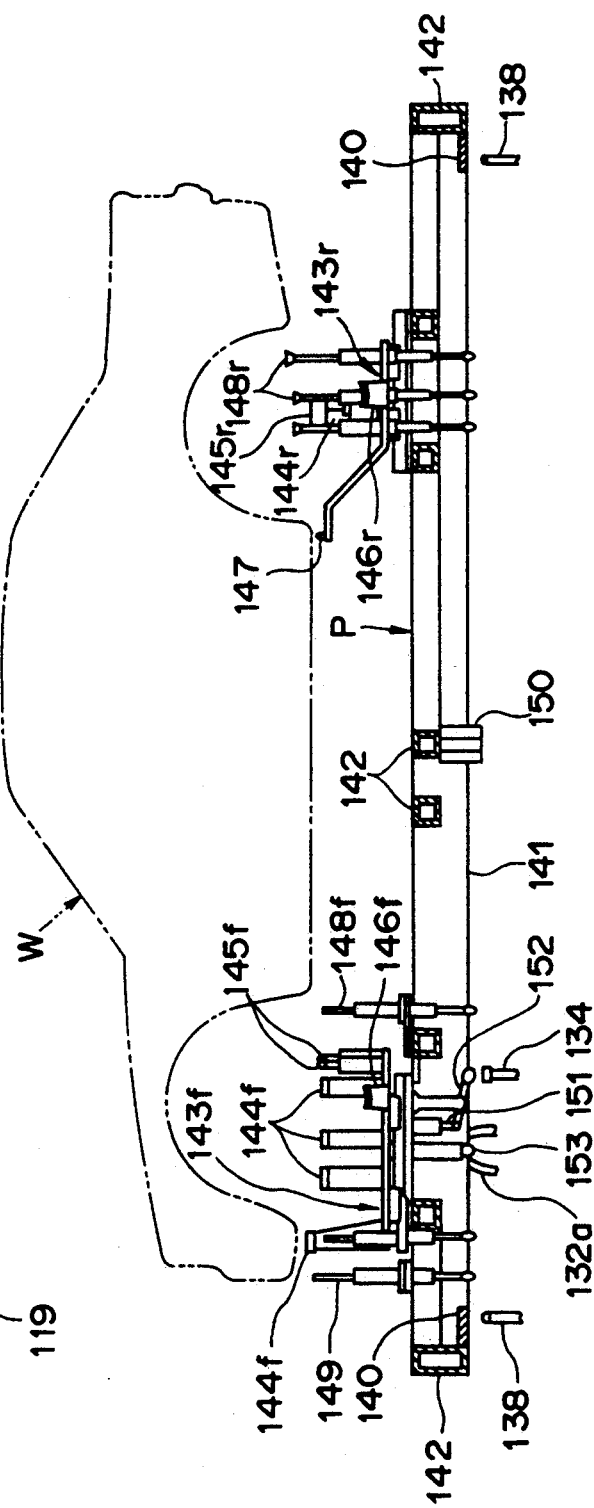

SYSTEM FOR AUTOMATICALLY GENERATING A SEQUENTIAL CONTROL PROGRAM

BACKGROUND OF THE INVENTION

This invention relates to a method and an apparatus for automatically composing or generating a program for conducting computer-based sequential control of operations which are to be effected by equipment for a production line. This program is written and output as, for example, a ladder program.

A method of controlling a production line such as a motor vehicle assembly line is known which uses a sequential control unit incorporating a computer to effect sequential control of various equipment units provided for the production line with respect to operations which are to be successively effected by the equipment. To perform such sequential control, the computer incorporated in the sequential control unit is loaded with a sequential control program, and successively conducts steps of control of the operations of equipment units provided along the production line in accordance with the sequential control program.

For composition of a computer program provided as a sequential control program used for such a sequential control system, a great deal of labor is ordinarily required. It is therefore desirable to reduce process steps for composing the program. From this viewpoint, computer program automation has been proposed such as described in Japanese Patent Laid-Open 63-106004, and Japanese Patent Publication 1-28962.

In the computer program automation apparatus previously proposed, however, even though a computer is provided, automatic formation of a sequential control program using the computer depends comparatively greatly upon manual operations such as data input operations, and the number of composition steps cannot be reduced sufficiently.

SUMMARY OF THE INVENTION

An object of the present invention is to provide a method and an apparatus for program automation which ensure that a sequential control program used for sequential control of operations which are to be successively effected by various equipment units provided for a production line can be automatically composed by composition steps effectively reduced.

Another object of the present invention is to provide a method and an apparatus for automatically forming interlock portions of a sequential control program used for sequential control of operations which are to be successively effected by various equipment units provided for a production line.

Still another object of the present invention is to provide a method and an apparatus for program automation which ensure that a sequential control program used for sequential control of operations which are to be successively effected by various equipment units provided for a production line can be automatically composed with respect to its predetermined portions by composition steps effectively reduced.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such example, however, it not exhaustive of the various embodiments of the invention, and therefore reference is made to the claims which follow the description for determining the scope of the invention.

BRIEF DESCRIPTION OF THE DRAWINGS

FIG. 8 is a block diagram in which the production line of FIG. 5 is divided into blocks by a method in accordance with the embodiment;

FIG. 13 is a diagram showing an operation block map used in the embodiment;

FIG. 14 is a diagram showing an input/output map used in the embodiment;

FIG. 15 is a diagram showing an operation step map used in the embodiment;

FIGS. 18 through 19 are diagrams of operation step maps for explanation of an interlock condition production program;

FIG. 23 is a diagram of a standard ladder pattern used for a program for production of step operation description in accordance with the embodiment;

FIGS. 24A through 24D are diagrams of the constructions of sets of devices used for the step operation description production program in accordance with the embodiment;

FIG. 25 is a diagram of connection logic for explanation of the pattern of FIG. 23;

FIG. 27 is a diagram of an operation step map used for the step operation description production program in accordance with the embodiment;

FIG. 28 is a diagram of a data map used for the step operation description production program in accordance with the embodiment;

FIGS. 30 and 31 are diagrams of the execution result of the flow charts of FIGS. 29A and 29B;

FIGS. 36(a) and 36(b) are flow-charts showing the operation block and operation step explanatory of the operation of an assembling apparatus according to the first embodiment of the malfunction diagnosis system;

FIG. 42 is a side elevational view of a holding arm of a carrier;

FIG. 45 is a side elevational view of the pallet;

DESCRIPTION OF THE PREFERRED EMBODIMENT

A preferred embodiment of the present invention will be described below with reference to the accompanying drawings. In the embodiment described below, the present invention is applied to a motor vehicle production line. That is, the object of control based on a sequential control program composed by a program automation system in accordance with the present invention relates to a motor vehicle production line.

Software Construction

Figure 1:
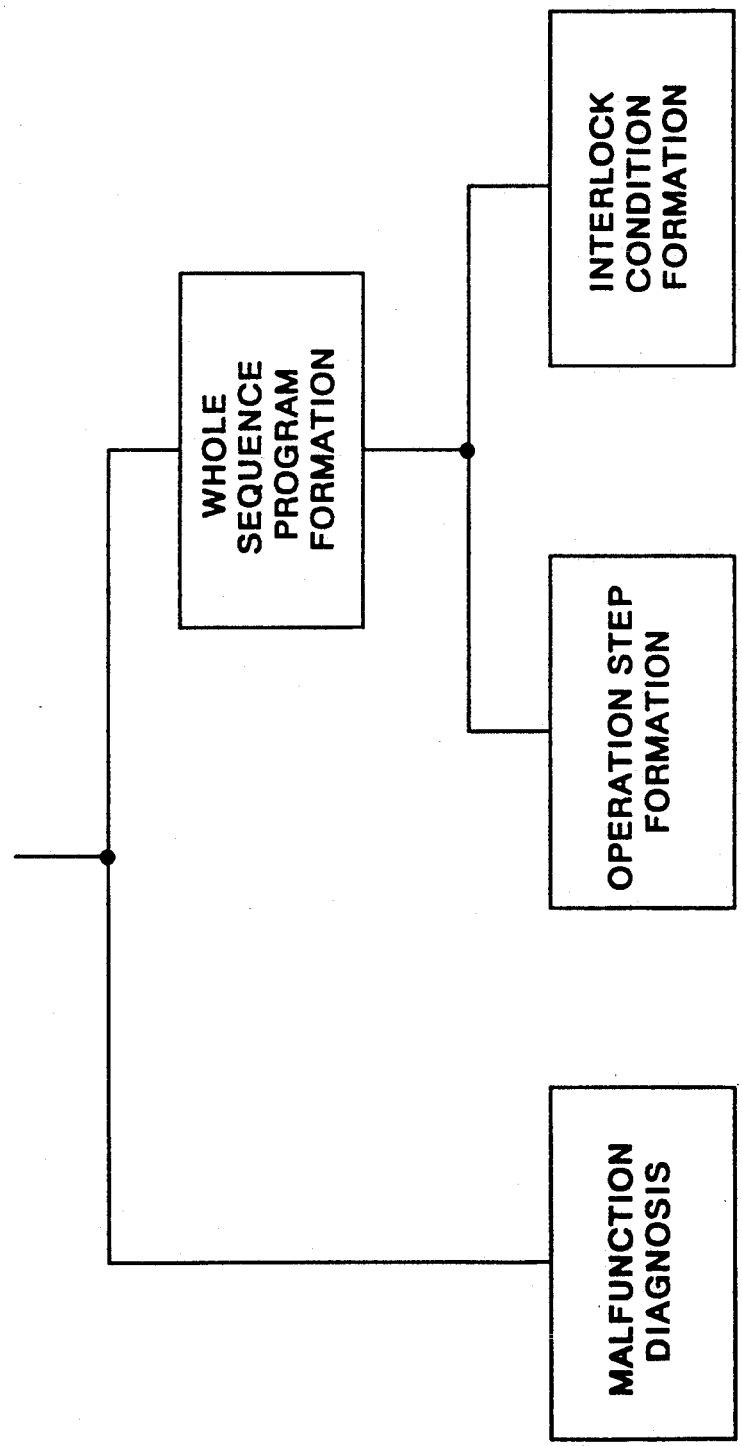
FIG. 1 is a diagram of the overall construction of software for a system for automatically composing a sequential program in accordance with an embodiment of the sequential program generating system according to the present invention.

FIG. 1 is a diagram of the construction of software for a program automation system in accordance with an embodiment of the present invention. This system is mainly formed of a system for automatically composing a sequential control program and a malfunction diagnosis system. These systems relate organically to each other.

The system for automatically composing a sequential control program has a "whole sequence formation program", an "operation step formation program" and an "interlock condition formation program". Two modified examples will be further described with respect to a malfunction diagnosis program.

The "whole sequence formation program" is a program of forming a structure (map) of a plurality of conceptually divided operation blocks of the overall sequential control of the production line, forming a structure (map) of a plurality of operation steps obtained by further dividing the operation block, and automatically forming a ladder program of the overall sequential control of the production line.

While the "whole sequence formation program" serves to form an overall program, the "operation step formation program" and the "interlock condition formation program" are utility programs. The "operating step formation program" serves to freely design, correct and change program elements in operation steps constituting an operation block, and the interlock condition formation program serves to automatically generate interlock conditions for the latter one of two sequential operations from the former operation.

For ease of understanding of the whole of this embodiment, a sequential control program will be schematically described below.

Figure 2:
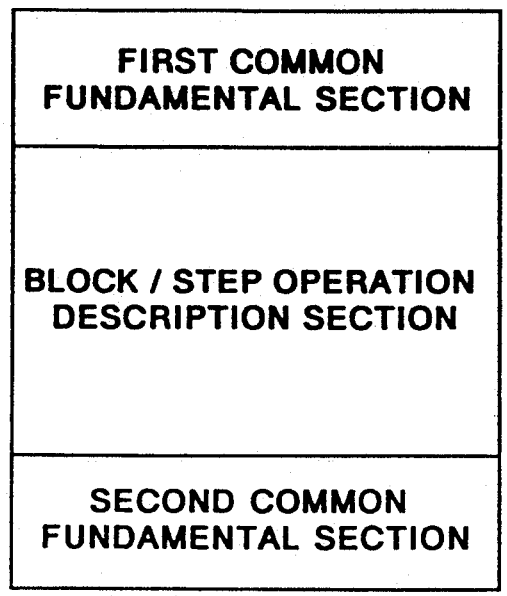
FIGS. 2, 3, and 4 are diagrams of the general structure of a sequential control program in accordance with the embodiment.
Figure 3:
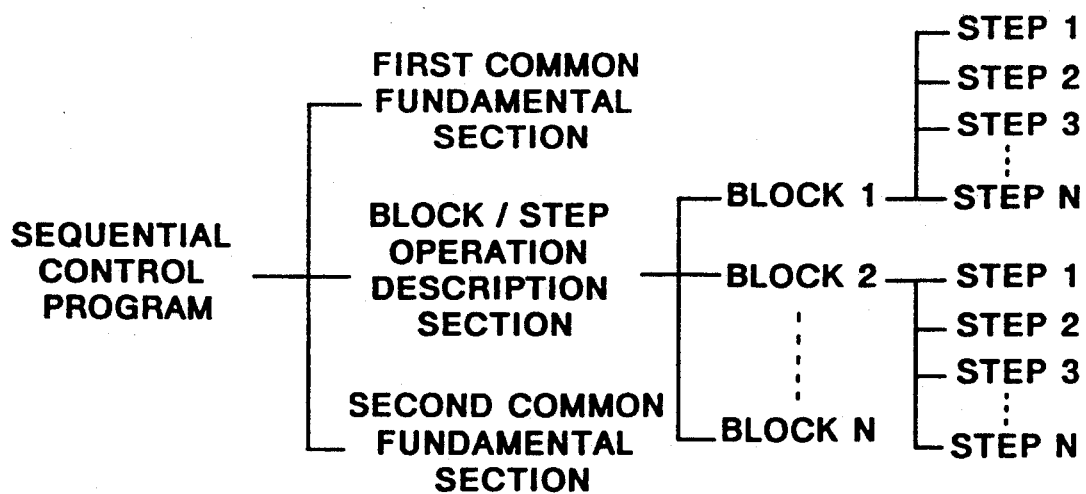
Figure 4:
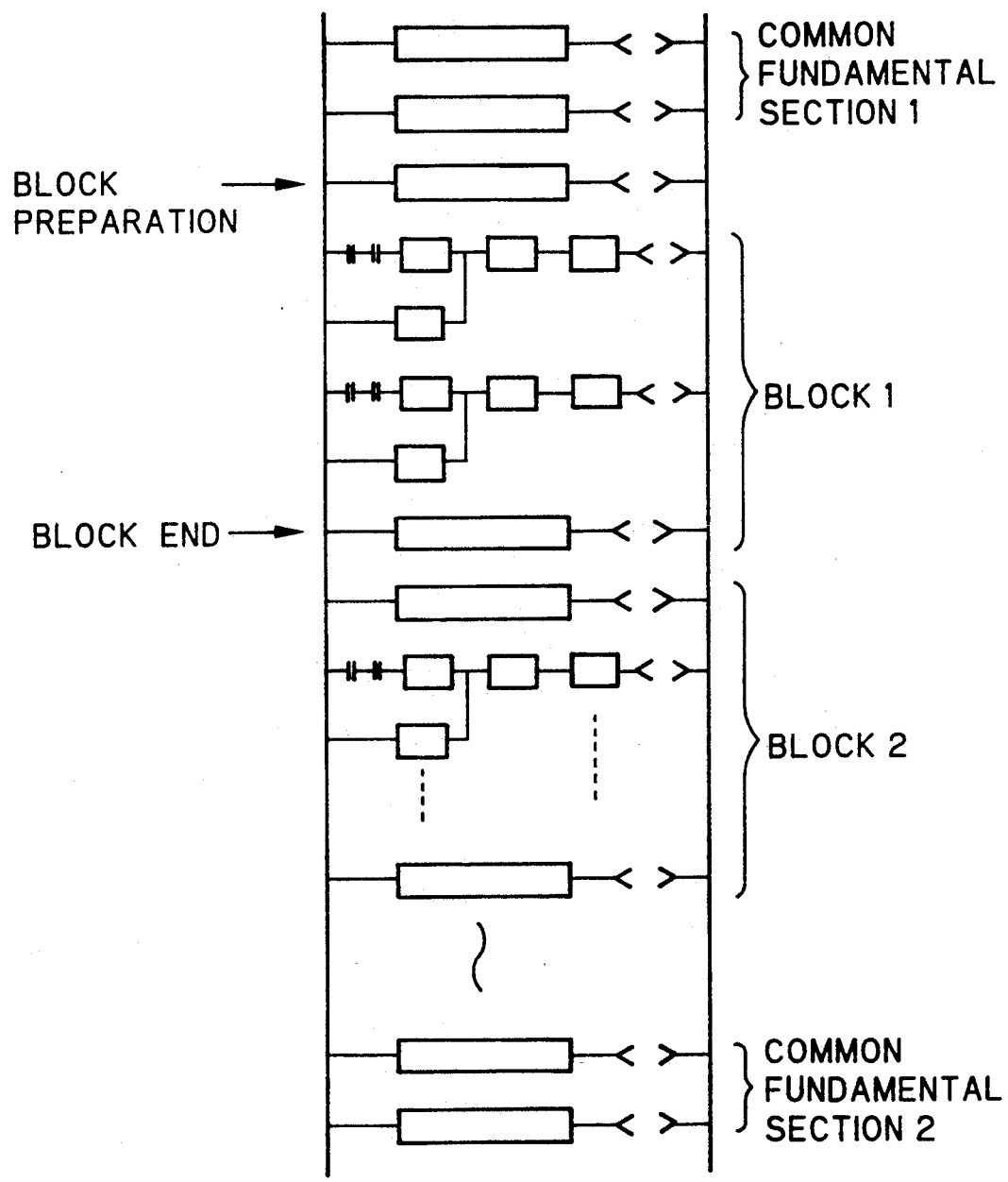

FIGS. 2 and 3 show the structure of a sequential control program in terms of composition and system, respectively. As shown in FIGS. 2 and 3, the sequential control program generally consists of a first common fundamental section, a block/step operation description section, and a second common fundamental section. As described later, the first common fundamental section is a section for controlling the start and stop of the line (later-mentioned SRT and STP), and the second common fundamental section is a section for controlling display and alarm. FIG. 4 shows a ladder program specifically written by breaking down the diagram of FIG. 3.

Program automation in accordance with the present invention resides in automatically providing certain devices (Xi, Yi, Mi) with respect to the block/sequence structure shown in FIG. 4.

Construction of Vehicle Assembly Line

An example of a vehicle assembly line to be controlled by the sequential control program formed in accordance with the present invention will be described below with reference to FIGS. 5 and 6.

Figure 5:
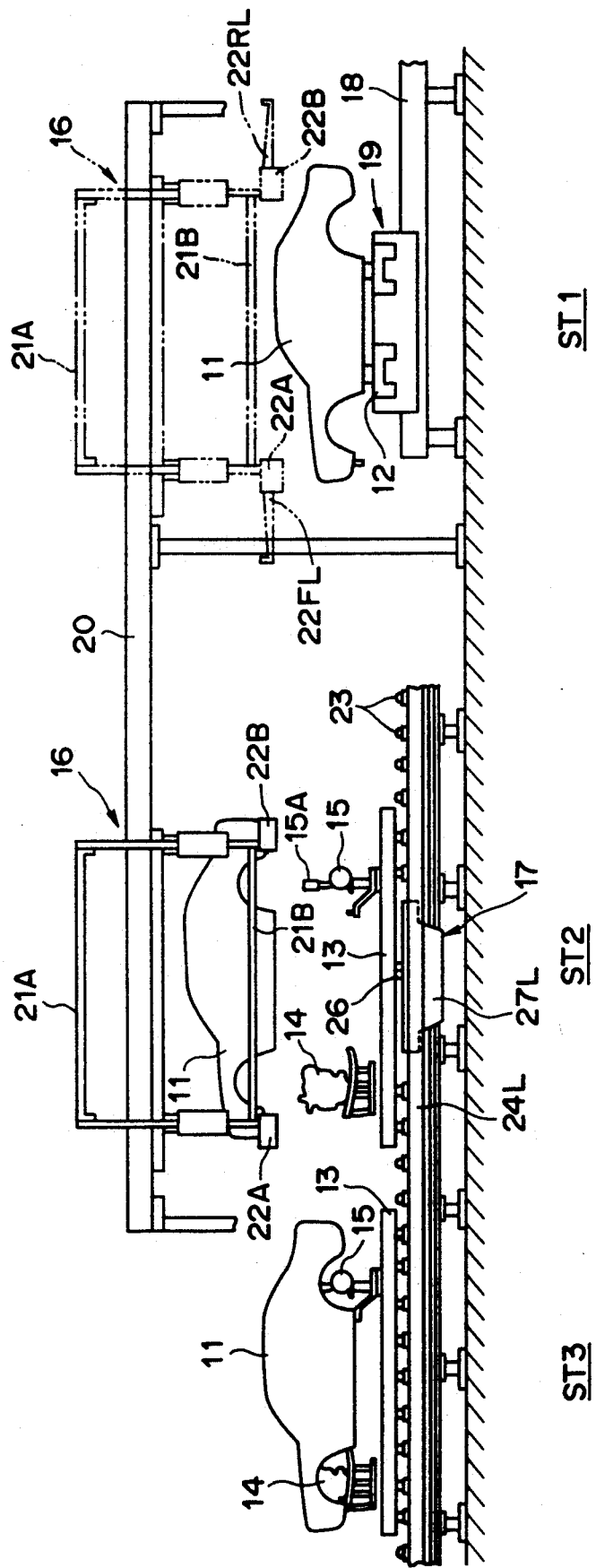
FIGS. 5 through 7 are schematic diagrams of the construction of an example of a vehicle assembly line which is controlled based on the sequential control program formed by a program automation apparatus in accordance with the embodiment.
Figure 6:
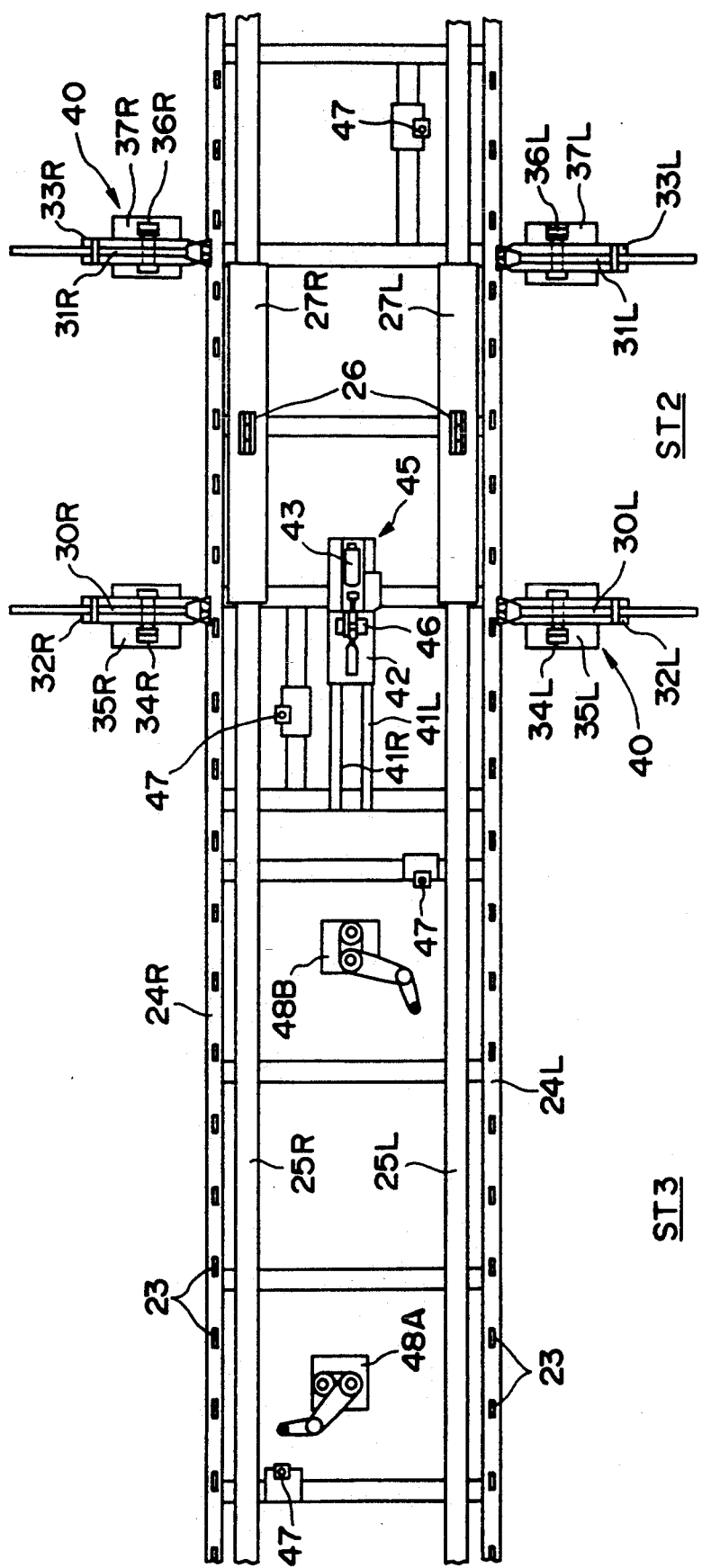

The vehicle assembly line shown in FIGS. 5 and 6 consisting of, for example, three stations: a positioning station ST1, a docking station ST2, and a screwing station ST3. At the positioning station ST1, a body 11 of a vehicle is placed on a receiving stand 12 and is positioned thereon by the control oft he position of the receiving stand 12 At the docking station ST2, an engine 14, a front suspension assembly (not shown) and a rear suspension assembly 15 placed in predetermined positions on a pallet 13 are set in combination with the body 11. At the screwing station T3, the engine 14, the front suspension assembly and the rear suspension assembly 15 set at the station ST2 are fixed to the body 11 by screwing with screws. An overhead type transfer device 16 for holding and transporting the body 11 is provided between the positioning station ST1 and the docking station ST2. A pallet carrier 17 for transporting the pallet 13 is provided between the docking station ST2 and the screwing station ST3.

The receiving stand 12 in the positioning station ST1 is reciprocatively moved along a rail 18. In the positioning station ST1 are provided a positioning means (BF) for positioning the body 11 placed on the receiving stand 12 with respect to a front portion of the body 11 in the widthwise direction of the vehicle by moving the receiving stand 12 in a direction perpendicular to the rail 18 (in the (widthwise direction of the vehicle), another positioning means (BR) for positioning a rear portion of the body 11 in the widthwise direction of the vehicle, and a further positioning means (TL) for positioning the body 11 in the direction of the front or rear of the body 11 by moving the receiving stand along the rail 18 (in the direction of the front or rear end of the body 11). In the station ST1 are further provided lifting reference pins (FL, FR, RL, and RR) which are used to position the body 11 relative to the receiving stand 12 by being brought into engagement with left and right front portions and left and right rear portions of the body 11. These positioning means and the lifting reference pins constitute a positioning unit 19 in the positioning station ST1. That is, the positioning means and the lifting reference pins are objects of control based on the sequential control program with respect to the positioning unit 19.

Figure 7:
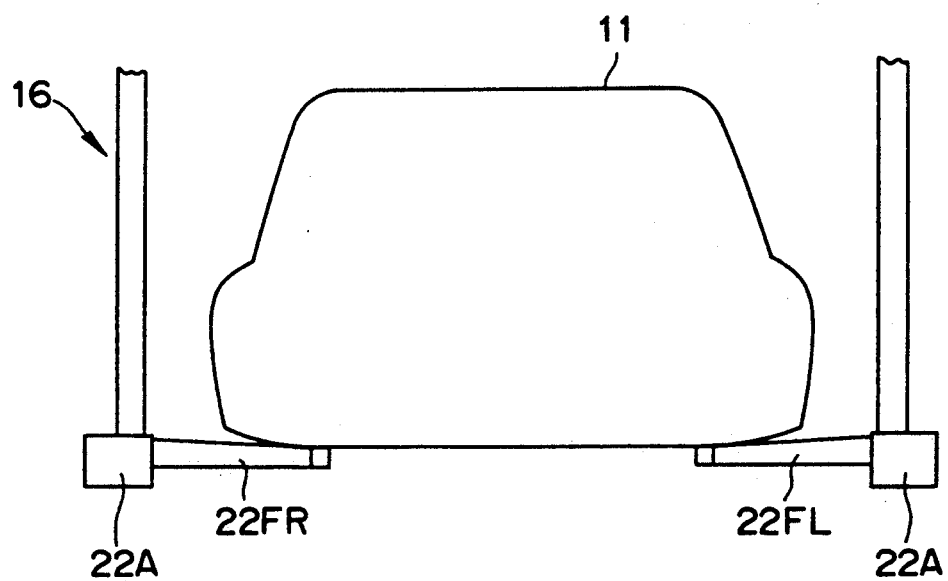

The transfer device 16 has a guide rail 20 extending over the positioning station ST1 and the docking station ST2, and a carrier 21 capable of moving along the guide rail 20. A lifting hanger frame 21B is attached to the carrier 21, and the body 11 is supported by the lifting hanger frame 22. As shown in FIG. 7, a left fore support arm 22FL and a right fore support arm 22FR are attached to the lifting hanger frame 22 through a pair of fore arm clamps 22A, and a left rear support arm 22RL and a right rear support arm 22RR (not shown) are also attached to the lifting hanger frame 22 through a pair of rear arm clamps 22B.

Each of the left fore support arm 22FL and the right fore support arm 22FR is rotated on the corresponding fore arm clamp 22A and is positioned such as to extend along the guide rail 20 when released from the state of being clamped by the fore arm clamp 22A, or is positioned such as to extend in a direction perpendicular to the guide rail 20 when clamped by the fore arm clamp 22A, as shown in FIG. 7. Similarly, each of the left rear support arm 22RL and the right rear support arm 22RR is rotated on the corresponding rear arm clamp 22B and is positioned such as to extend along the guide rail 20 when released from the state of being clamped by the rear arm clamp 22B, or is positioned such as to extend in a direction perpendicular to the guide rail 20 when clamped by the rear arm clamp 22B.

To load the transfer device 16 with the body 11, the transfer device 16 is moved to a position (starting position) indicated by a dot-dash line shown in FIG. 5, at which its front end is located right above the front end of the rail 18, and the left fore support arm 22FL and the right fore support arm 22FR are released from the state of being clamped by the clamps 22A to extend along the guide rail 20. The lifting hanger frame 21B is thereafter moved downward. In this state, the receiving stand 12 on which the body 11 is placed is moved along the rail 18 the front end of the rail 18 to be set in a position corresponding to that of the lifting hanger frame 21B of the transfer device 16 which has been moved downward. The left fore support arm 22FL and the right fore support arm 22FR are respectively rotated to the position of extending in the direction perpendicular to the guide rail 20 below the front portion of the body 11, and are clamped by the front arm clamps 22A. Also, the right rear support arm 22RL and the left rear support arm 22RR are respectively rotated to the position of extending in the direction perpendicular to the guide rail 20 below the rear portion of the body 11, and are clamped by the rear arm clamps 22B. Thereafter, the lifting hanger frame 21B is moved upward and the body 11 is supported by the left fore support arm 22FL, the right fore support arm 22FR, the left rear support arm 22RL and the right rear support arm 22RR attached to the lifting hanger frame 21B of the transfer device 16, as shown in FIG. 7.

The pallet carrier 17 has a pair of guide members 24L and 24R on which a multiplicity of support rollers 23 for supporting the lower surface of the pallet 13 are mounted, a pair of transport rails 25L and 25R extending parallel to the guide members 24L and 24R, pallet transport bases 27L and 27R having pallet engagement portions 26 for engagement with the pallet 13 and movable along the transport rails 25L and 25R, and a linear motor mechanism (not shown) for driving the pallet transport bases 27L and 27R.

In the docking station ST2 are provided a pair of left and right fore clamp arms 30L and 30R and a pair of left and right rear clamp arms 31L and 31R which respectively support struts of the front suspension assembly and struts 15A of the rear suspension assembly 15 to set the same in assembled positions at the time of fitting of the front suspension assembly and the rear suspension assembly 15. The left and right fore clamp arms 30L and 30R are respectively attached to attachment plate members 32L and 32R so that they can advance or retreat in a direction perpendicular to the transport rails 25L and 25R, while the left and right rear clamp arms 31L and 31R are respectively attached to attachment plate members 33L and 33R so that they can also advance or retreat in a direction perpendicular to the transport rails 25L and 25R. The left and right fore clamp arms 30L and 30R and the left and right rear clamp arms 31L and 31R have, at their respective opposite extreme ends, engagement portions engagable with the struts of the front suspension assembly and the rear suspension assembly 15. An arm slide 34L enables the attachment plate member 32L to move relative to a fixed base 35L in a direction parallel to the transport rails 25L and 25R. An arm slide 34R enables the attachment plate member 32R to move relative to a fixed base 35R in a direction parallel to the transport rails 25L and 25R. An arm slide 36L enables the attachment plate member 33L to move relative to a fixed base 37L in a direction parallel to the transport rails 25L and 25R. Further, an arm slide 36R enables the attachment plate member 33R to move relative to a fixed base 37R in a direction parallel to the transport rails 25L and 25R. Consequently, the left and right fore clamp arms 30L and 30R are movable in each of the longitudinal and widthwise directions of the carrier 17 while their extreme end portions are in engagement with the struts of the front suspension assembly. Also, the left and right rear clamp arms 31L and 31R are movable in each of the longitudinal and widthwise directions of the carrier 17 while their extreme end portions are in engagement with the struts 15A of the rear suspension assembly 15. The left and right fore clamp arms 30L and 30R, the arm slides 34L and 34R, the left and right rear clamp arms 31L and 31R, and the arm slides 36L and 36R constitute docking devices 40.

In the docking station ST2 are further provided a pair of slide rails 41L and 41R extending parallel to the transport rails 25L and 25R, and a slide device 45 including a movable member 42 slidable along the slide rails 41L and 41R and a motor 43 for driving the movable member 42. On the movable member 42 of the slide device 45 are provided an engagement means 46 for engagement with a movable engine support member (not shown) provided on the pallet 13, and a pair of lifting pallet reference pins 47 for setting the pallet in a predetermined position. When the engine 14, the front suspension assembly and the rear suspension assembly 15 placed on the pallet 13 are set in combination with the body 11 supported by the lifting hanger frame 22 of the transfer device 16, the engagement means 46 of the slide device 45 is moved along the rails 41L and 41R while engaging with the movable engine support member positioned by the lifting pallet reference pins 47 on the pallet 13 to move the engine 14 relative to the body 11 in the same direction, thereby avoiding interference between the body 11 and the engine 14.

In the screwing station ST3 are disposed a robot 48A for screwing operation of fixing to the body 11 the engine 14 and the front suspension assembly set in combination with the body 11, and another robot 48B for screwing operation of fixing to the body 11 the rear suspension assembly 15 set in combination with the body 11. A pair of lifting pallet reference pins 47 for setting the pallet 13 in a predetermined position are also provided in the screwing station ST3.

Formation of Whole Sequence Program

In the vehicle assembly line described with reference to FIGS. 5 through 7, the positioning unit 19 and the transfer device 16 in the positioning station ST1, the docking devices 40, the slide device 45 and the pallet carrier 17 in the docking station ST2, and the robots 48A and 48B in the screwing station ST3 are controlled by a sequential controller connected to these unit based on the sequential control program formed by the program composing apparatus in accordance with this embodiment. That is, the positioning unit 19, the transfer device 16 and so on are "equipment units" which are the objects of sequential control.

Operation Blocks

The assembling operation of the production line shown in FIG. 5, i.e., the operations effected by all the equipment units which are the objects of sequential control can be separated into a plurality of "operation blocks". Each operation block is defined as described below.

①: The operation block is a set of a plurality of unit operations. One of the most important properties of the operation block resides in that ②: the operation of each operation block can be completed independently of other operation blocks without any interference of the same during the intermediate process between the start and the end of the operation block.

Because of the properties ① and ②, each operation block can be described as a block (batch). In other words, each operation block relates to other operation blocks only at operation block level. To start the operation of one operation block, the termination of the operation of at least one other operation block is required. That is, the termination of the operation of one operation block is used as the condition for starting another operation block (or a plurality of operation blocks) connected to it, or the termination of the operation of a plurality of operation blocks is used as the condition for starting another operation block.

According to the above-mentioned properties, no intermediate stage of the operation of one operation block, initiates other blocks. Also, at any intermediate step of one operation block, no start-up from other blocks is waited.

The following incidental property ③ of the operation block can be induced from the definition of the operation block shown in ① and ②.

③ Preferably, each operation block is the greatest of possible sets of unit operations having the properties ① and ②.

The property ③ is not absolutely necessary. However, if the condition ③ is satisfied, the number of blocks with which the production line is described is reduced and the description of the whole process is simplified and is easy to read.

The production line shown in FIGS. 5 and 6 is described with operation blocks satisfying the conditions ① to ③, thereby obtaining 17 operation blocks A0 through A4 and B0 through B11 described below.

Of these 17 operation blocks, 12 operation blocks B0 through B11 are shown below.

Block B0: an operation block for positioning the receiving stand 12 and the body 11 on the receiving stand 12 with the positioning unit 19. This operation block is called a receiving stand positioning block.

Block B1: an operation block of preparing the transfer device 16 to carry the body 11. This operation block is called a transfer device preparation block.

Block B2: an operation block of preparing the docking devices 40 to clamp the struts of the front suspension assembly by the left and right fore clamp arms 30L and 30R and to clamp the struts 15A of the rear suspension assembly 15 by the left and right rear clamp arms 31L and 31R. This operation block is called a strut clamping preparation block.

Block B3: an operation block of moving the body 11 positioned on the receiving stand 12 by the positioning unit 19 to the lifting hanger frame 22 of the transfer device 16. This operation block is called a transfer device reception block.

Block B4: an operation block of preparing the slide device 45 to engage the engagement means 46 provided on the movable member 42 with the movable engine support member on the pallet 13. This operation block is called a slide device preparation block.

Block B5: an operation block of returning the receiving stand 12 to the starting position with the positioning unit 19. This operation block is called a receiving stand returning block.

Block B6: an operation block of combining the engine 14 disposed on the pallet 13, the struts of the front suspension assembly disposed on the pallet 13 and clamped by the left and right fore clamp arms 30L and 30R and the struts 15A of the rear suspension assembly 15 clamped by the left and right rear clamp arms 31L and 31R with the body 11 supported by the lifting hanger frame 22 of the transfer device 16. This operation block is called an engine/suspension docking block.

Block B7: an operation block of returning the transfer device 16 to the starting position. This operation block is called a transfer device returning block.

Block B8: an operation block of making the docking devices 40 return the left and right fore clamp arms 30L and 30R and the left and right rear clamp arms 31L and 31R to the respective starting positions. This operation block is called a clamp arm returning block.

Block B9: an operation block of making the pallet carrier 17 operate the linear motor to transport the pallet 13 on which the body 11 in combination with the engine 14, the front suspension assembly and the rear suspension assembly 15 is placed to the screwing station ST3. This operation block is called a linear motor driving block.

Block B10: an operation block of performing screwing operation with the robot 48A to fix to the body 11 the engine 14 and the front suspension assembly set in combination with the body 11. This operation block is called a first screwing operation block.

Block B11: an operation block of performing screwing operation with the robot 48B to fix to the body 11 the rear suspension assembly 15 set in combination with the body 11. This operation block is called a second screwing operation block.

FIG. 8 shows the relationship between the 17 operation blocks A0 through A4 and B0 through B11 of the production line shown in FIGS. 5 through 7. The diagram of FIG. 8 is made by the programmer based on the analysis of the production line shown in FIGS. 5 through 7 in order to compose the sequential control program for this production line. In the program automation apparatus in accordance with the present invention, the block structure of the whole production line is displayed by a display unit in the same form as that shown in FIG. 8. In FIG. 8, two lines are drawn to the block B3 relating to the transfer device 16 from the operation block B0 relating to the positioning unit 19 and the operation block B1 relating to the transfer device 16. These lines denote that the block B3 is started provided that the positioning operation (operation block B0) of the positioning unit 19 for positioning the receiving stand 12 and the body 11 placed on the receiving stand is completed and that the preparation (operation block B1) for carrying the body 11 by the transfer device 16 is completed.

Operation Steps

Each of the above-described operation blocks B0 through B11 is divided into a plurality of operation steps each including an output operation. The provision of an output operation is a necessary condition for each operation step. However, since the operation steps are constituents of one operation block, each operation step in one operation block supplies no output to the operation steps of other operation blocks.

For example, the receiving stand positioning operation block B0 is divided into the following 10 operation steps B0S0 through B0S9.

B0S0: an operation step of confirming various conditions for starting the operation block B0 (called condition confirmation operation step).

B0S1: an operation step of moving the receiving stand 12 by the positioning means BF to position the front portion of the body 11 in the widthwise direction of the vehicle (BF positioning operation step).

B0S2: an operation step of moving the receiving stand 12 by the positioning means BR to position the rear portion of the body 11 in the widthwise direction of the vehicle (BR positioning operation step).

B0S3: an operation step of moving the receiving stand 12 by the positioning means TL to position the body 11 in the direction parallel to the rail 18 (TL positioning operation step).

B0S4: an operation step of bringing the lifting reference pin FR into engagement with a fore right side portion of the body 11 (FR engagement operation step).

B0S5: an operation step of bringing the lifting reference pin FL into engagement with a fore left side portion of the body 11 (FL engagement operation step).

B0S6: an operation step of bringing the lifting reference pin RR into engagement with a rear right side portion of the body 11 (RR engagement operation step).

B0S7: an operation step of bringing the lifting reference pin RL into engagement with a rear left side portion of the body 11 (RL engagement operation step).

B0S8: an operation step of returning the positioning means BF to the starting position after positioning the front portion of the body 11 in the widthwise direction of the vehicle (BF returning step).

B0S9: an operation step of returning the positioning means BR to the starting position after positioning the rear portion of the body 11 in the widthwise direction of the vehicle (BR returning step).

FIG. 15 shows details of these operation steps.

Operating Element

Figure 9A:
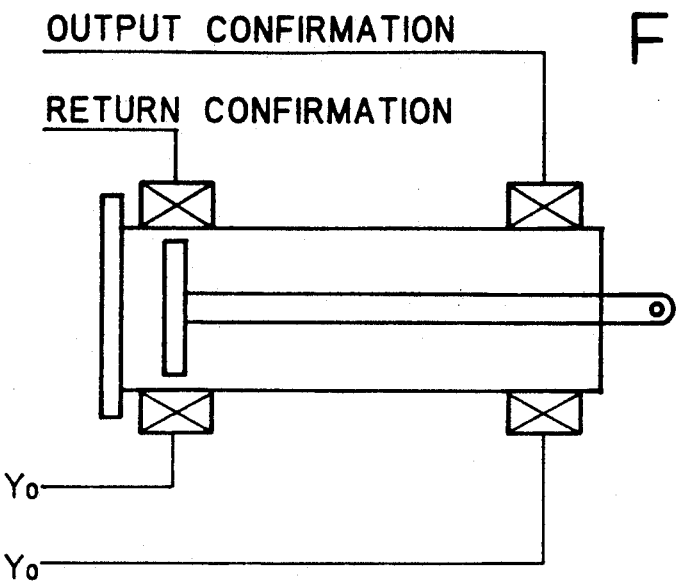
FIGS. 9A and 9B are general diagrams of operating devices used in the production line of the present embodiment.

FIG. 9A shows an operating element for driving, for example, each of the lifting reference pins of the production line of FIG. 5. This element has an output $Y_0$ for driving this element, and an Output $Y_R$ for returning this element to the home position. Also, there are other outputs for confirming the operating state of the elements: a limit switch (L/S) output for confirming the driven state (output confirmation L/S) and another limit switch output for confirming the return to the home position (return confirmation L/S).

Figure 9B:
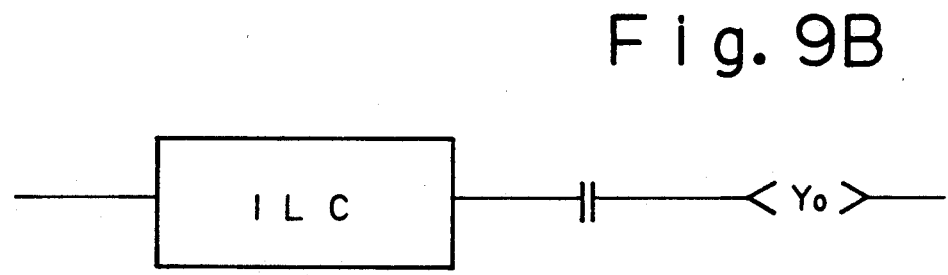

FIG. 9B is a diagram of the logic of the output drive operation of the element shown in FIG. 9A. To output $Y_0$, it is necessary to satisfy interlock conditions ILC.

Figure 9C:
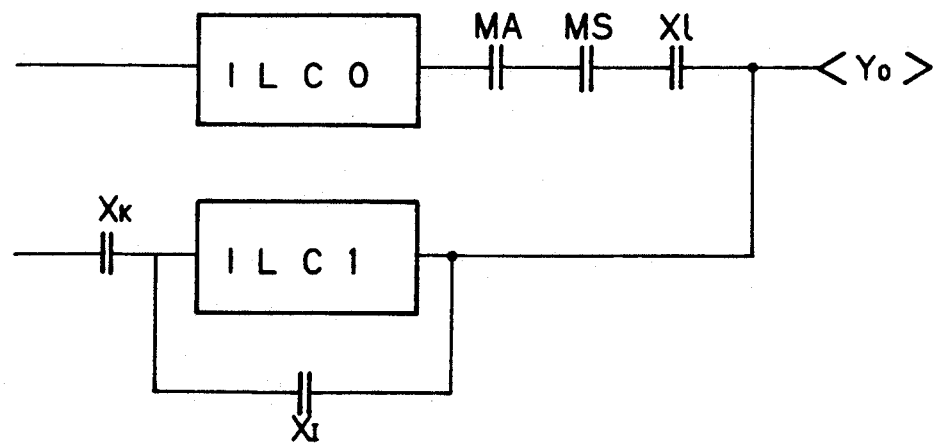
FIG. 9C is a diagram of the logic of operating devices in a ladder program.
Figure 11A:
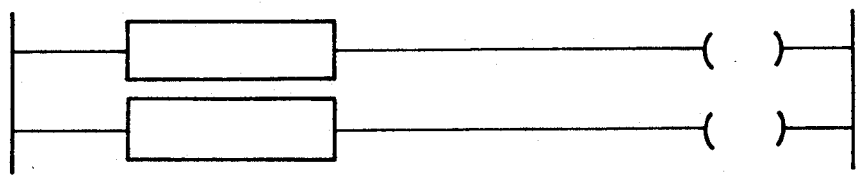
FIGS. 11A through 11C are diagrams of examples of ladder patterns used in the embodiment.
Figure 11B:
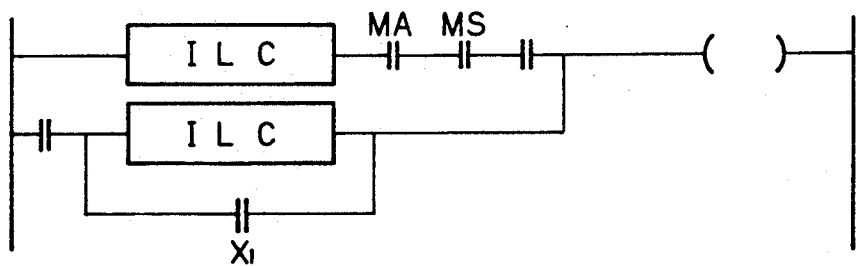
Figure 11C:
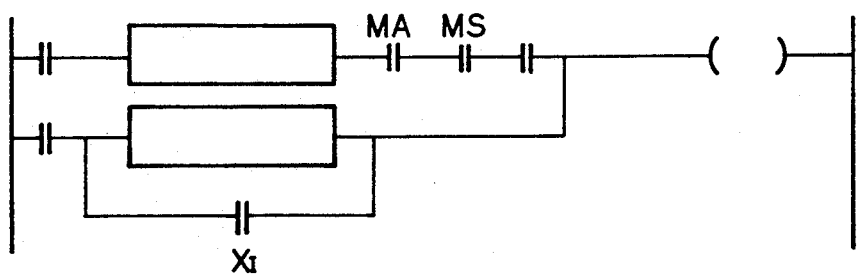

Ordinarily, the interlock conditions ILC include various conditions peculiar to the corresponding operation step. Such interlock conditions are automatically produced by the function of the "automatic interlock formation program" briefly described above with reference to FIG. 1. FIG. 9C shows an example of a typical operating element used for automatically forming the whole sequence. FIGS. 11A through 11C show examples of other elements.

Referring to FIG. 9C, a condition $M_A$ is closed in an automatic mode (in which the operations of the production line are performed in accordance with the sequential control program). A condition $M_S$ is closed when this operating circuit operates in a manual mode. The condition $M_S$ is ordinarily closed. Accordingly, in the ordinary automatic mode, output $Y_0$ is issued if an interlock condition $ILC_0$ and a condition $X_1$ are satisfied. On the other hand, $ILC_1$ describes the logic of an operating condition in the manual mode Since the contact $M_S$ is opened in the manual mode, $Y_0$ is output if conditions $X_k$ and $ILC_1$ are simultaneously satisfied or if the conditions $X_k$ and $X_l$ are simultaneously satisfied. Ordinarily, $X_l$ is a logic for nullifying the manual operation interlock condition $ILC_1$.

As is apparent from this relationship, the contact conditions $M_A$, $M_S$, $X_l$ and so on can be set by the system in a standardized manner without any troublesome manual programming work.

For the formation of the whole sequence program, the connection relationship between the operation blocks peculiar to the production line are determined as shown in FIG. 8, and the contact conditions $X_1$ and so on are thereafter automatically produced by the system in accordance with each of specific operation steps of the operation blocks, which process is the content of "Formation of whole sequence program".

Construction of Automatic Composing Apparatus

Figure 10:
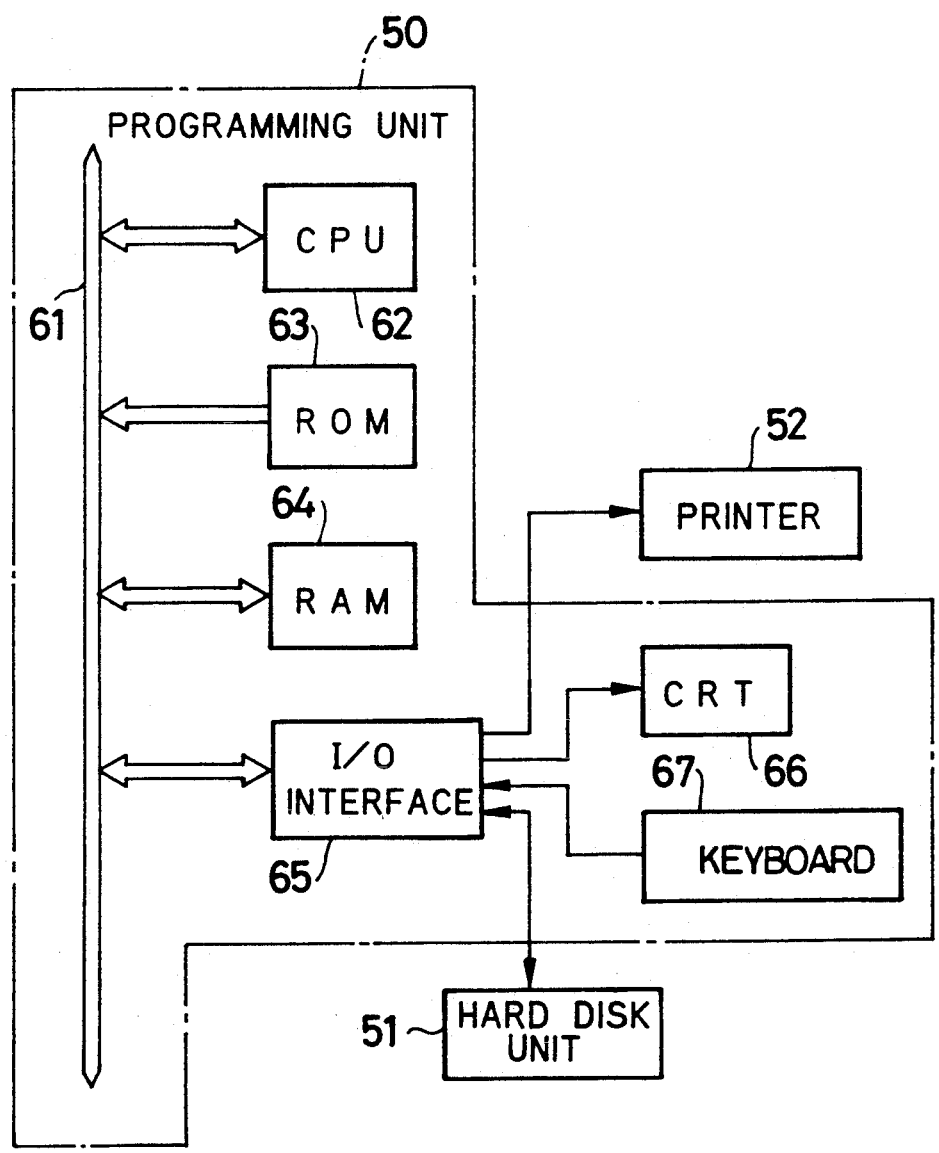
FIG. 10 is a schematic diagram of the sequential control program automation apparatus of the present invention.

FIG. 10 shows an example of the hardware construction of the sequential control program automation/malfunction diagnosis system in accordance with the present invention.

This program composing apparatus has a programming unit 50, a hard disk unit 51 provided as an external memory, and a printer 52. The programming unit 50 incorporates a central processing unit (CPU) 62, a read only memory (ROM) 63, a random access memory (RAM) 64 and an input/output interface (I/O interface) 65 which are connected through a bus line 61. The programming unit 50 further has a cathode ray tube (CRT) display 66 and a data/control code input keyboard 67 which are connected to the I/O interface 65. The hard disk unit 51 and the printer 52 are connected as external units to the CPU 62 through the I/O interface 65.

Outline of Formation of Whole Sequence

A procedure for automatically composing the whole sequence of the sequential control program will be schematically described below with reference to FIGS. 12 to 15, which program is used to conduct sequential control of the sequence control objects, i.e., the equipment units of the vehicle assembly line as described above.

Figure 12:
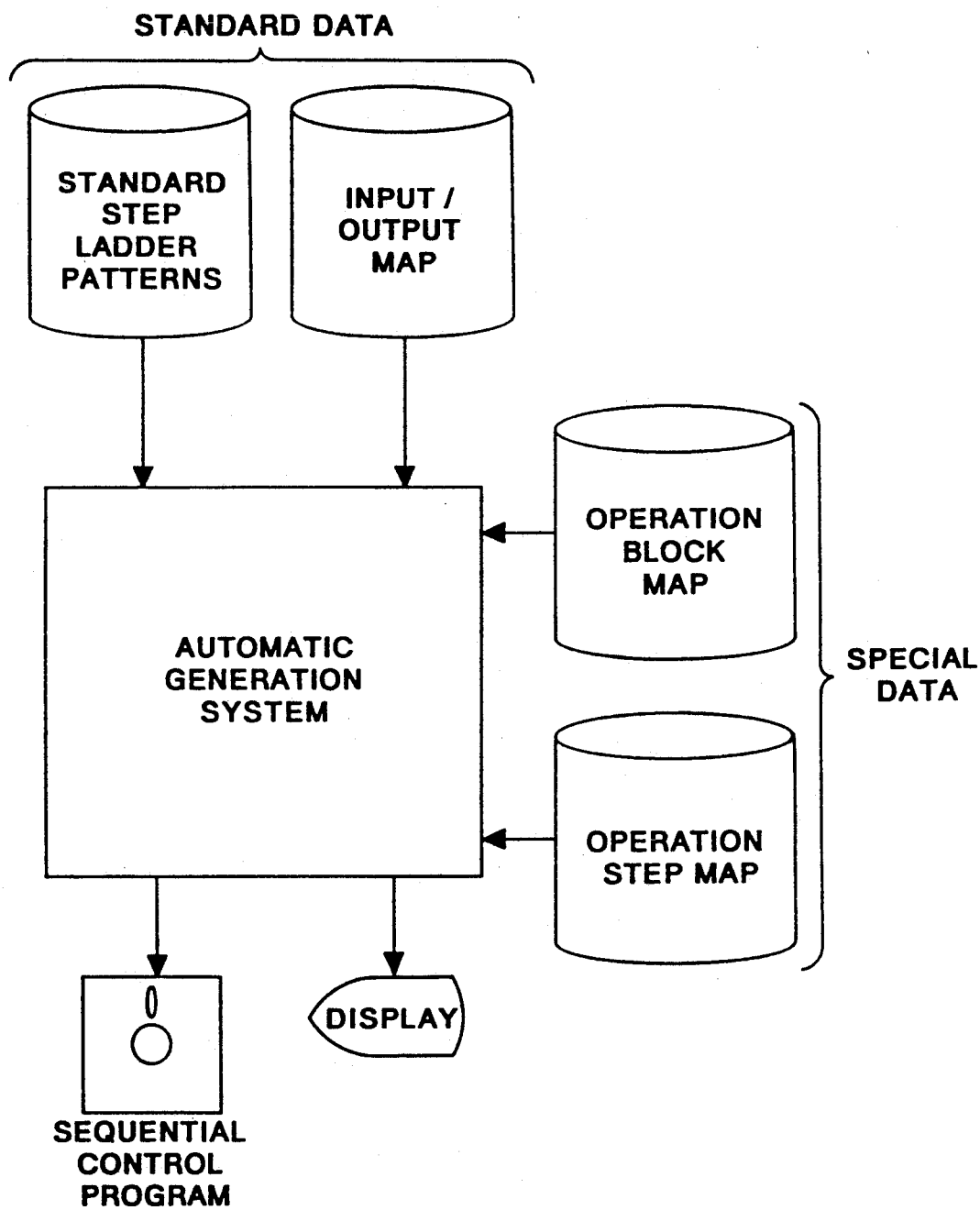
FIG. 12 is a diagram of a program construction relating to whole sequence program automation in accordance with the embodiment.

FIG. 12 shows categories of input data necessary for automatically composing the whole sequence of the sequential control program (block/sequence portions of FIGS. 2 through 4) as well as outputs from the system.

The standard step ladder patterns of FIG. 12 form a data base in which operating element symbols for expressing all operations necessary for the production line control program are stored. FIGS. 11A through 11C show examples of such a standard pattern.

The input/output map forms a data base in which the input/output relationship between a multiplicity of operating elements which may ordinarily be used for production lines. FIG. 14 shows an example of this input/output map data base.

The data in the above standard step ladder pattern data base and input/output map data base is common to various production lines and is not peculiar to a particular production line.

Referring to FIG. 12, there are two categories of peculiar data: operation block map data and operation step map data. The operation block map has data for describing each of the above-described operation blocks as well as the connection relationship between these operation blocks. FIG. 13 shows an example of operation block map data peculiar to the production line of FIG. 5. The operation step map has special data for describing operation steps contained in operation blocks peculiar to a particular production line. FIG. 15 shows an example of the operation step map peculiar to the production line of FIG. 5.

The sequential control program is composed based on the two standard data bases and the two categories of peculiar data shown in FIG. 12.

The standard step ladder pattern data base is as shown in FIGS. 11A through 11C. FIG. 11A shows a pattern of a standard type describing the start and stop of an operation block. FIG. 11B shows the same pattern as that described above with reference to FIG. 9C. FIG. 11C shows a pattern formed by adding a contact condition to the pattern shown in FIG. 11B.

The input/output map is as described below. In the input/output map, the input/output status of all the equipment units used for the production line are previously described in the form of a table. The input/output map shown in FIG. 14 is provided for the positioning unit 19 shown in FIG. 5. In this input/output map, the contents of input/output operation are shown in the column "COMMENT", the contents of the column "No." are automatically prepared, and the contents of the columns "COMMENT", "OPERATION" and "STARTING POSITION" are input by the operation of the keyboard 67. "OUTPUT COIL DEVICE", "CONFIRMATION INPUT CONTACT DEVICE" and "MANUAL INPUT CONTACT DEVICE" are set automatically.

For example, the operation type of the operating circuitry BF (positioning) of A02 is "OUTPUT" and the terminal of the output coil is Y1. The name of the contact for confirmation input at the time of outputting is "X1". The name of the contact for manual input is "XB".

The standard ladder pattern data base and the input/output map are stored in the hard disk 51.

Next, the operation block map data will be described below. This map data is obtained by analyzing the operation of the production line and expressing the steps of the production line with operation blocks in accordance with the above-described definition. The operation block map of FIG. 13 is a table expressing an operation block chart, such as that shown in FIG. 8, which is obtained as a result of analysis of the production line of FIG. 5. In other words, the table (map) of FIG. 13 is generally equal to the chart of FIG. 8.

In FIG. 13, the contents of "SC-REG" designate twelve 16-bit registers respectively provided for the operation blocks B0 through B11. Each register indicates that which operation step of the corresponding block is executed at present. For example, in a case where the operation step of B0S0 of the operation block B0 (refer to FIG. 15) is executed, "B0S0" is stored in the SC-REG area for the operation block B0.

Each of the contents of "FROM" of the operation block map designates an operation block which is placed in front of the corresponding operation block and which relates to the condition for starting the operation of the corresponding operation block. For example, the termination of the operation blocks B0 and B1 is a condition for starting the operation block B3. Each of the contents of "TO" designates an operation block which is immediately subsequent to the corresponding operation block and whose operation is started by the completion of the corresponding operation block. For example, the termination of the operation block B3 means the start of the operation blocks B5 and B7. Each of the contents of "CLEAR CONDITION" designates an operation block with which the equipment unit relating to the corresponding operation block is returned to the starting position. Further, "EQUIPMENT" designates the sequential control object equipment unit relating to each operation block.

The contents of "No." and "SC-REG" are formed automatically, while the contents of "BLOCK NAME", "FROM", "TO", "CLEAR CONDITION", and "EQUIPMENT" are input by the operation of the keyboard 67 effected by the programmer.

Next, the operation step map shown in FIG. 15 will be described below. As mentioned above, the contents of specific operations of each operation block are described as operation steps. In other words, the input-/output map (FIG. 14) do not represent any operation sequence. However, it expresses an operation sequence of each equipment unit in the operation step map. FIG. 15 shows an example of the operation step map for the operation block B0. In FIG. 15, the contents of "No." are automatically prepared by the system, that is, the contents of "No." are automatically prepared by the system. That is, each of the contents of "No." indicating the operation step order, e.g., "B000" and "B0S0" through "B0S9" with respect to the operation block B0, is formed by the system each time the programmer inputs "COMMENT" through the keyboard 67. "B000" designates an operation step corresponding to the preparation of this operation block and is placed at the top of each operation block of the ladder program of FIG. 4. "B999" designates an operation step corresponding to the completion of this operation block and is placed at the end of each operation block of the ladder program of FIG. 4. For formation of the operation step map, it is necessary to use at least items of "COMMENT" information which are input in order of the step sequence. For example, if the programmer inputs "BF(POSITIONING)" at the step number "B0S1" and inputs an operation type "OUTPUT", the data designated by the number "A02", having the comment name "BF(POSITIONING)" of the input/output map is read out. The data designated by "A02" of the input/output map indicates that the confirmation input contact is "X1" and that the manual input contact is "XB". These data items are written in the corresponding positions in FIG. 15. "Y0" of the output coil of the step "B0S1" is the name given to the top operation step of the operation block.

Thus, the system searches the input/output map (FIG. 14) for the data corresponding to the "COMMENT" and "OPERATION TYPE" input by the programmer to form the operation step map (FIG. 15). Similar operation step maps are formed for other operation blocks.

Details of Program for Forming Whole Sequence

Figure 16:
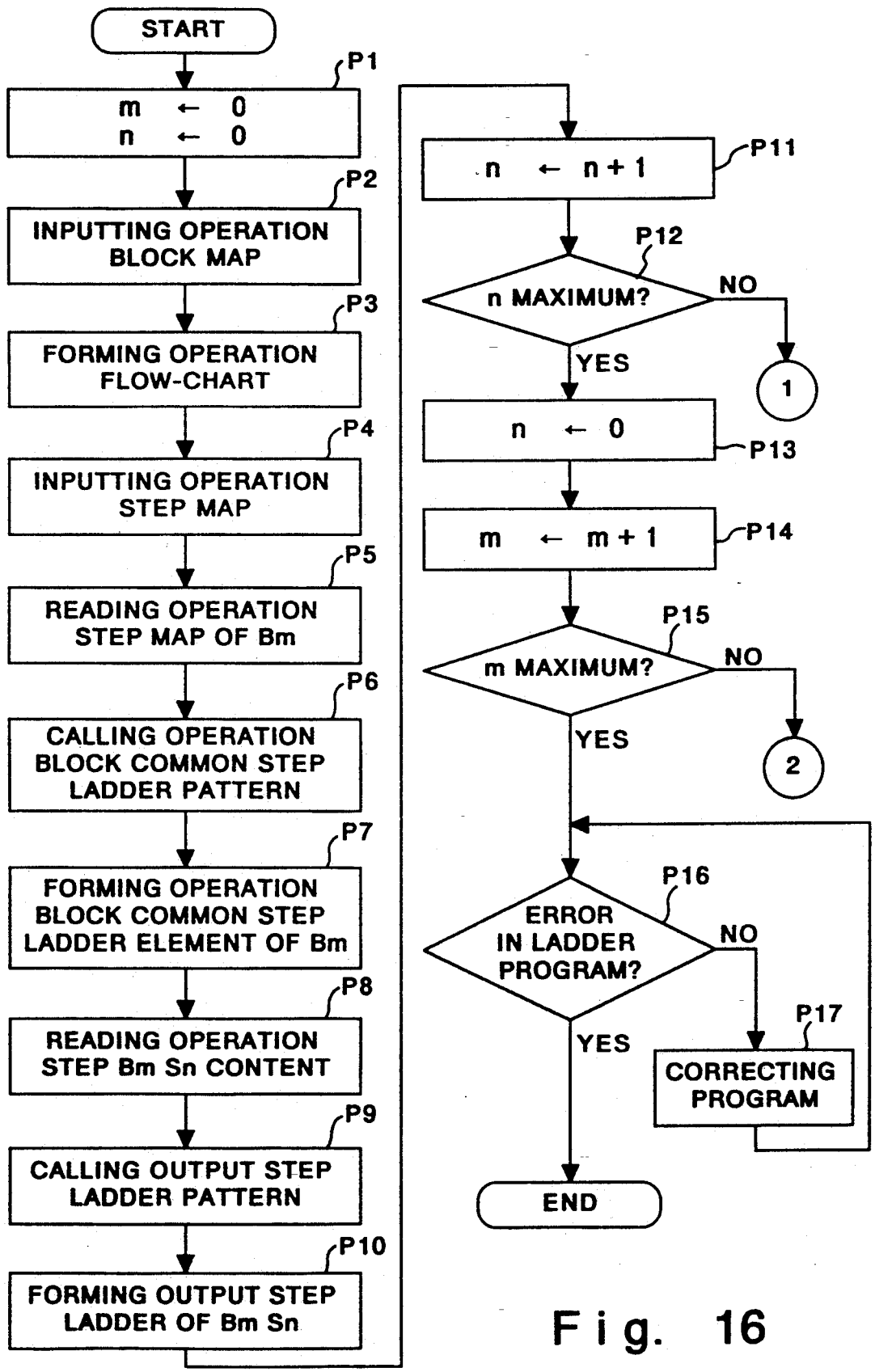
FIG. 16 is a flow chart of the execution sequence of a whole sequence automation program in accordance with the embodiment.

FIG. 16 is a flow chart of the control procedure of formation of the whole sequence of the sequential control program with the apparatus shown in FIG. 10. There are various methods of expressing the sequential control program. In this embodiment, however, the sequential control program is composed in the form of a ladder program.

Step P1:

First, for initial setting, each of variables m and n is set to 0. The variables m and n represent the operation block number and the operation step number, respectively.

Step P2:

Thereafter, the keyboard 67 is operated to input data peculiar to the operation blocks B0 through B11 as operation block maps each corresponding to the map of FIG. 13. Each operation block map is thereby formed on the CRT 66 as shown in FIG. 13 and is stored in the RAM 64.

Step P3:

Thereafter, an operation block flow chart is formed in accordance with a conversion program read out of the ROM 63 based on the data of the operation block maps stored in the RAM 64, and is stored in the RAM 64. This operation block flow chart expresses the connection relationship between the operation blocks and is therefore formed as a chart such as that shown in FIG. 8.

Step P4:

The keyboard 67 is operated again to form an operation step map in such a manner that, as described above, the input/output map (FIG. 14) is searched for the data corresponding to the "COMMENT" and "OPERATION TYPE" (refer to FIG. 15) input by the programmer to form a map such as that shown in FIG. 15. Such an operation step map is formed for all the operation blocks.

During the process of forming each operation step map, a map such as that shown in FIG. 15 is displayed on the CRT 66 and is stored in the RAM 64.

Twelve operation step maps for the operation blocks B0 through B11 are thereby stored in the RAM 64.

The loop of the steps P5 through P15 is a process of forming a ladder program for each operation block. In steps P5 through P7, a common step ladder elements of an operation block Bm is formed. In the loop of steps P8 through P12, operation steps represented by an operation step BmSn (n=0, 1, 2...) are formed.

Steps P5 through P7:

Data on a preparation step Bm00 of the operation block Bm is read from the operation step map (FIG. 15) (in step P5). Since m=0 at present, data of "B000" is read out. Since this operation step is a preparation step, a standard ladder pattern such as that shown in FIG. 11A is read out of the hard disk 51 (step P6). Parameters including a condition SRT for starting the operation block B0, an output contact device MA relating to this condition, a stop condition STP, and an output contact device MS relating to this condition are written in the read standard pattern, thereby preparing a common operation block step ladder element of the operation block B0, as shown in the section (a) of FIG. 17 (step P7).

Figure 17:
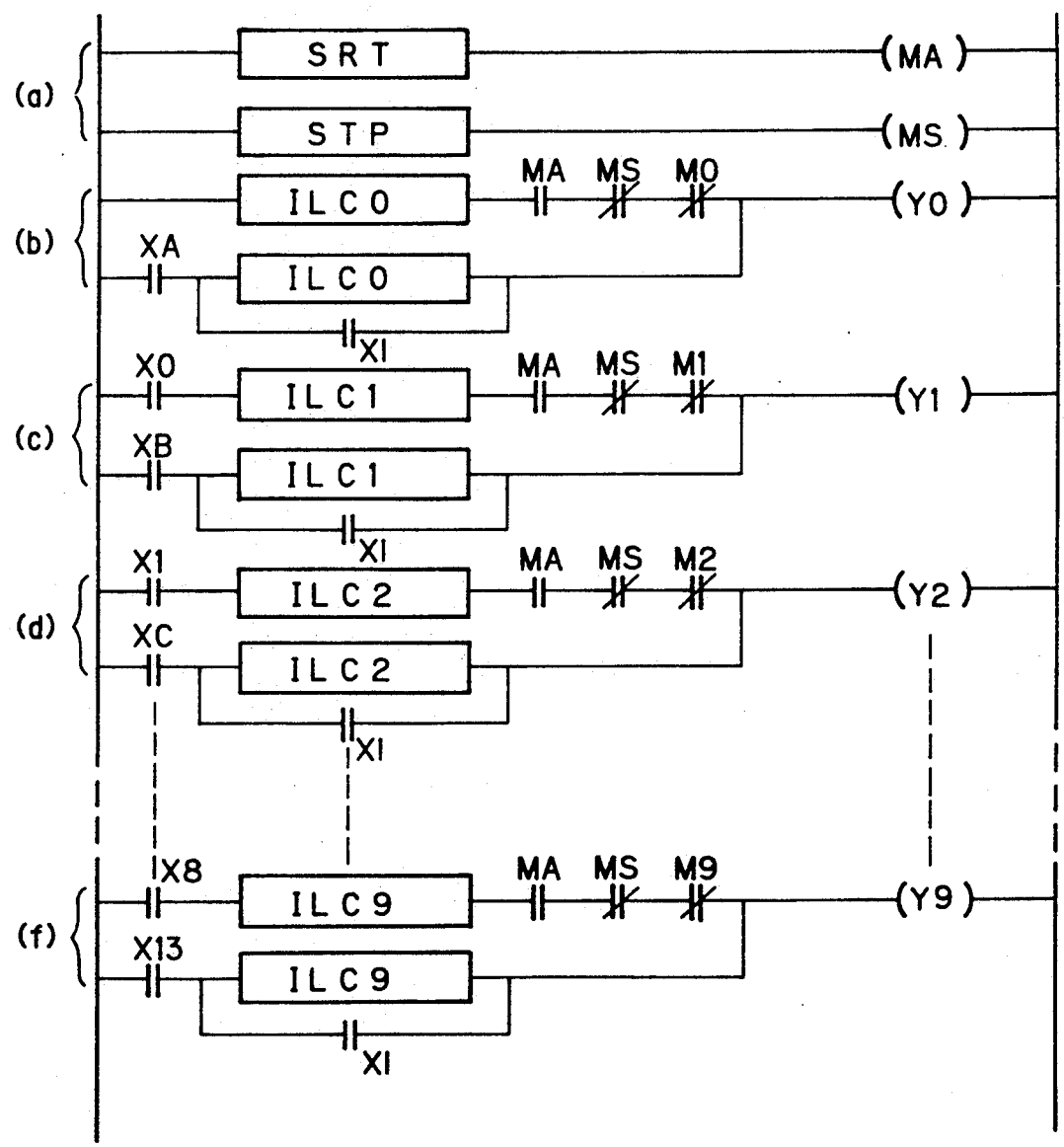
FIG. 17 is a diagram of an operation block ladder program formed by the whole sequence automation program in accordance with the embodiment.

The common ladder step element shown in (a) of FIG. 17 will be described below. The start condition SRT outputs MA provided that an interlock condition SRT is satisfied. On the other hand, the stop condition STP outputs MA provided that an interlock condition STP is satisfied. As mentioned above, MA is the condition indicating the automatic mode while MS is the condition indicating the manual mode. When the production line is started, the system supplies each operation block an input which satisfies the interlock condition SRT. Then, the contact MA is closed and each operation step is set in the automatic mode, as described above in connection with FIG. 9C. If the production line is changed over to the manual mode, the system supplies each operation block with an input which satisfies the interlock condition STP. Then, the contact MS is opened and each operation step is set in the manual mode.

Thus, the step ladder element common to the operation blocks are formed.

Steps P8 through P12:

In steps P8 through P12, ladder elements of the operation step BmSn are prepared.

First, in step P8, data on the operation step BmSn is read from the operation step map (FIG. 15) according to the present values of the variables m and n. In step P9, the ladder pattern data base (FIGS. 11A through 11C) is searched for a ladder pattern most suitable for the read data on the operation step. If the operation step is, for example, B0S0 ($m=0$, $n=0$), the pattern of FIG. 11B is selected and read from the data base in step P9. Parameters relating to the operation step "B0S0", including a confirmation contact device "X0", a manual contact device "XA" and an output contact device "Y0", are written in the read step ladder pattern, and output contact devices MA and MS, an interlock cancelling contact device XI and so on are added, thereby automatically forming an output step ladder element corresponding to the operation step B0S0. Thus, the ladder element for the operation step "B0S0" is prepared as shown in the section (b) of FIG. 17.

In step P11, a variable n is incremented and the process returns to step P8 through the step P12. A ladder element for the operation step "B0S1" is then prepared in steps of P8 through P12.

That is, data on the operation step "B0S1" is read from the operation step map (step P8) and it is determined from this data that the ladder pattern shown in FIG. 11C is the most suitable for "B0S1". This ladder pattern is read from the pattern data base (step P9). In step P10, the data of the operation step map is added to this ladder pattern. That is, parameters relating to the operation step B0S1, including a confirmation contact device X1, a manual contact device XB and an output contact device Y1, are written in the read step ladder pattern, and output contact devices MA and MS, an interlock cancelling contact device XI, a confirmation contact device X0 and so on are added, thereby automatically forming an output step ladder element corresponding to the operation step "B0S1". Thus, the ladder element for the operation step "B0S1" is prepared as shown in the section (c) of FIG. 17.

Thereafter, the same operation as that of preparing the output step ladder element corresponding to the operation step B0S1 is repeated while incrementing the variable by 1 at a time. Output step ladder elements corresponding to the operation steps B0S2 through B0S9 of the operation block B0 are thereby successively formed automatically. As a result, a ladder program for the operation block B0, such as that shown as the whole of FIG. 17, is formed.

Steps P5 through P15:

The determination is made in step P12 as to whether or not the variable n reaches the maximum and, hence, whether or not ladder elements have been prepared for all the operation steps of one operation block Bm designated by the variable m.

If YES in step P12, the variable n is reset to 0 in step P13, and the variable m is incremented in step P14. The process returns to step P5 through the step P15, and ladder elements for the operation steps of the block B1 are formed in the same manner as those for the operation block B0.

The above-described operations are repeated until it is determined in step P15 that the variable m reaches the maximum. A sequential control program is thereby formed which consists of successively connected ladder programs for the operation blocks B0 through B11.

In step P16, the thus-formed sequential control ladder program is grammatically checked. Any unsuitable portion thereby found is corrected to make the program usable (step P17).

The sequential control ladder program thus obtained is stored in the RAM 64 and is, if necessary, printed out by the printer 52.

As is apparent from the above, in the apparatus for automatically composing the whole sequence of the sequential control program, ①: the fundamental ladder patterns (FIGS. 11A through 11C) data with which various operations can be described are previously stored as a data base, and ②: the input/output patterns of all operating devices (FIG. 9A) which may be used for the production line are previously provided as a data base and are previously stored.

③: With respect to the operation blocks peculiar to the actual production line for which the control program is formed, the data on the attributes of the operation blocks and the data on the structure of connection between the operation blocks (FIG. 13) are input.

④: When each of the operation steps of each operation block is designated in accordance with the operation order of the operation steps of the actual production line, the input/output pattern of the corresponding operating devices is selected from the data base of input/output patterns, the ladder pattern is selected from the pattern data base, and the input/output pattern of the corresponding operating devices is added to the selected ladder pattern.

Thus, the number of steps of composing the sequential control program can be reduced effectively.

Formation of Interlock

Referring back to FIG. 1, automatic formation of the sequential control program in accordance with the present invention will be described again. As shown in FIG. 1, automatic formation of the sequential control program includes "formation of whole sequence program", "formation of operation step" and "formation of interlock condition". As can be also understood from the ladder program (FIG. 17) which is the result of output based on the "whole sequence formation" program (FIG. 16), interlock conditions are unknown. Each of the operation step ladder program elements shown in FIG. 17 describes the corresponding operation step alone. In other words, the relationship between the successive operation steps (between the operation blocks) is omitted. To achieve sequential operation of actual two successive operation steps (two operation blocks), it is necessary to confirm the completion of the operation of the preceding operation step (operation block). This confirmation corresponds to the interlock condition.

Outline of Formation of Interlock Conditions

As shown in FIG. 8, each operation block is sequentially connected to the upper operation blocks. Accordingly, the ladder program of one operation block necessarily waits the completion of the operation of some of the upper operation blocks. Also, as shown in the operation step map of FIG. 15, each operation step must be executed under the condition that the operation of some preceding operation step (not limited to the immediately preceding step) has been completed. Ordinarily, to ensure the continuity of the operation steps, each output unit is provided with a confirmation device as shown in FIG. 9A, and the output from this confirmation device is monitored. Consequently, the interlock condition for the output from one lower operation step (or operation block) may be logically based on confirmation of the completion of the operation of the upper operation step (operation block). In other words, the operation of setting the completion of the operation of some upper operation step (or operation block) as the interlock condition for the lower operation step may be performed successively from the upper operation step (or operation block) to automatically form the interlock logic of all the operation steps (or operation blocks).

The formation of interlock conditions will be described below concretely with respect to the example shown in FIG. 8. The operation blocks B0 and B1 are immediately above the operation block B3. The block B3 is not started unless both the operation blocks B0 and B1 are completed. Accordingly, for formation of interlocks of the ladder program for the operation steps of the operation block B3, it is necessary to analyze the operations steps of the upper blocks B0 and B1 as well as those of the lower block B3. Therefore the operations steps of the blocks B0, B1, and B3 will be schematically described below. With respect to the operation steps of the operation block B0, refer to FIG. 15 and the relating description.

B1S0: an operation step of confirming the starting position of the transfer device 16, i.e., confirming the position above the fore end of the rail 18. This step is called a transfer device position confirmation step.

B1S1: an operation step of setting the fore arm clamps 22A and the rear arm clamps 22B in the unclamping positions. This step is called an arm clamp release operation step.

B1S2: an operation step of moving the lifting hanger frame 21B of the transfer device 16 downward. This step is called a lifting hanger moving down step.

B3S0: an operation step of rotating the left fore support arm 22FL of the transfer device 16 to set this arm in the position of extending in the direction perpendicular to the guide rail 20. This step is called a left fore support arm rotating operation step.

B3S1: an operation step of rotating the right fore support arm 22FR of the transfer device 16 to set this arm in the position of extending in the direction perpendicular to the guide rail 20. This step is called a right fore support arm rotating operation step.

B3S2: an operation step of rotating the left rear support arm 22RL of the transfer device 16 to set this arm in the position of extending in the direction perpendicular to the guide rail 20. This step is called a left rear support arm rotating operation step.

B3S3: an operation step of rotating the right rear support arm 22RR of the transfer device 16 to set this arm in the position of extending in the direction perpendicular to the guide rail 20. This step is called a right rear support arm rotating operation step.

B3S4: an operation step of clamping the left and right fore support arms 22FL and 22FR and the left and right rear support arms 22RL and 22RR with the fore arm clamps 22A and the rear arm clamps 22B of the transfer device 16. This step is called an arm clamp operation step.

B3S5: an operation step of moving the lifting hanger frame 21B of the transfer device 16 upward. This step is one operation step (or operation block) as the interlock called a lifting hanger frame moving up operation step.

To effect the operation of setting the termination of one operation step (or operation block) as the interlock condition of some lower operation step, data on the device for confirming the completion of the output operation of the upper operation step (operation block) is required. In this embodiment, this data is appended to the operation step map of FIG. 15 in which the operation steps are described.

The same "operation step map" is formed for each operation block. Each operation step map therefore contains data on (one or a plurality of) output operation elements relating to each operation step, and data on (one or a plurality of) confirmation operation elements for confirming the operations of the output elements. The operation step map is as shown in FIG. 18 with respect to the operation block B1 or as shown in FIG. 19 with respect to the operation block B3. In FIGS. 18 and 19, the confirmation operation element correspond to the limit switch of FIG. 9A, and the confirmation operation status denotes the position at which the confirmation operation element is in the confirmation state. Status N means that the operation element is in the normal position when set in the confirmation state. Each of the operation steps of the "operation step maps" shown in FIGS. 18 and 19 involves only one output operation element and one confirmation operation element. This is because it is understood from the abovedescribed analysis of B1S0 through B1S2 and B3S0 through B3S5 that each of these operation steps can be expressed by one output operation element and one confirmation operation element alone. Accordingly, if each operation step is more complicated, the operation step map is also more complicated. However, the method of automatically forming the operation step interlocks in accordance with the present invention is sufficiently understandable even from the simple examples shown in FIGS. 18 and 19.

Figure 20:
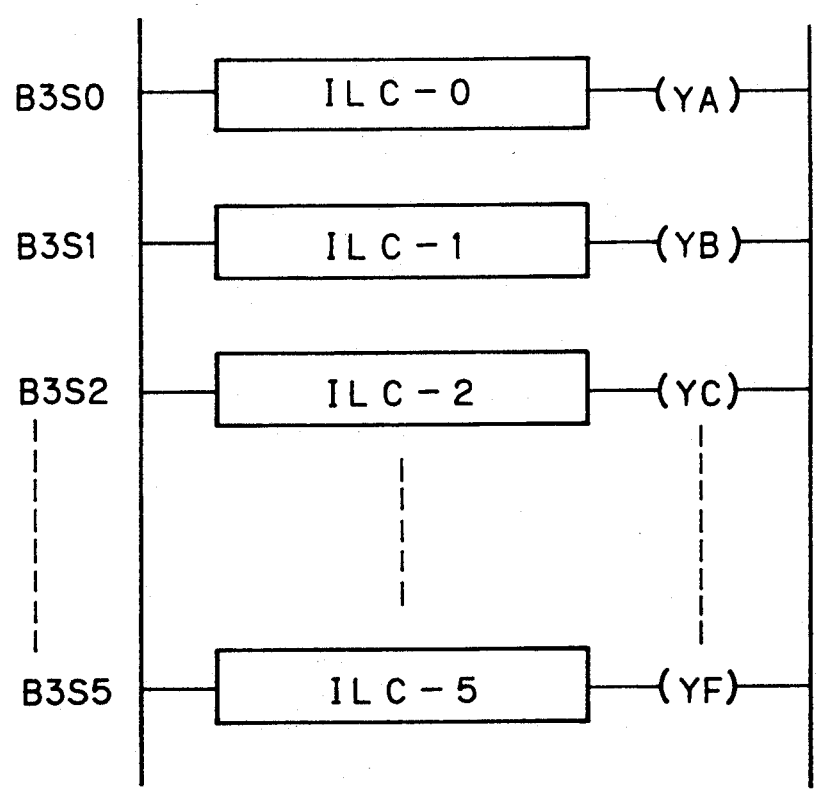
FIG. 20 is a diagram of a ladder pattern of an operation block B3 for explanation of the interlock condition production program.

FIG. 20 shows interlock conditions ILC and outputs Y of the steps B3S0 through B3S5 of the operation block B3. That is, each operation step can be expressed by a series connection of the interlock ILC and the output Y.

Figure 21:
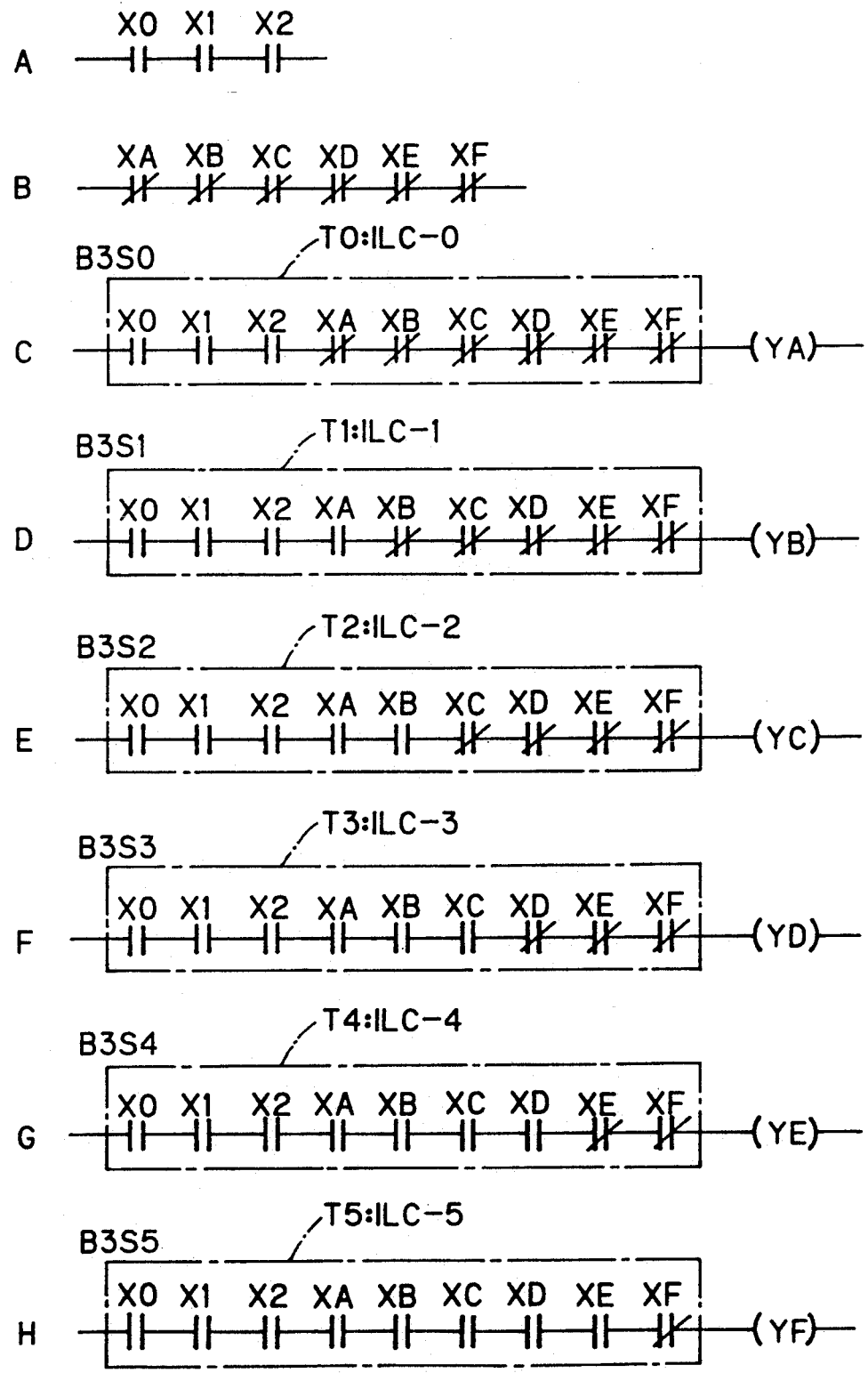
FIG. 21, consisting of A-H, is a diagram of the result of processing of the interlock condition production program.

Referring to FIG. 21, a pattern A represents a ladder program defining the operation block B1 completion condition. For ease of explanation, it is assumed that the pattern A is previously given because the logic of production of the interlock condition for each step of the block B3 from the block B1 can be directly applied to the method of producing the interlock condition for each step of the block B1 from the block in front of the block B0 (if this preceding block exists).

As is apparent from FIG. 19, the block B3 has confirmation operation elements XA, XB, ..., XF. When the block B3 is started after the block B1 has been completed, all the operation confirmation conditions XA, XB, ..., XF of the operation block B3 are in the inverse state. Accordingly, a pattern B of FIG. 21 represents the state of the block B3 when the same is started. Therefore the interlock condition for executing the step B3S0 in the block B3 is the one represented by a pattern C which is a series connection of the patterns A and B of FIG. 21. That is, the ladder program of B3S0 is formed by linking all the operation confirmation conditions XA, XB, ..., XF of the operation block B3 in the inverse state to the operation confirmation conditions X0, X1, and X2 of all the operation steps of the operation block B1.

Since the operation confirmation condition of B3S0 is to satisfy XA as shown in the data map of FIG. 19, the interface lock condition of B3S1 includes the inverse state of all the operation confirmation conditions X0, X1, X2, and XA of the operation block B3S1 and other subsequent steps as well as satisfying the operation confirmation conditions X0, X1, X2, and XA. That is, the interlock condition of the operation step B3S1 is as represented by ILC1 of a pattern D of FIG. 21.

Interlock conditions are produced for other operation steps by the same procedure.

Details of Interlock Condition Formation Program

The operation block B3 includes the six operation steps B3S0 through B3S5, and the ladder program for the operation block B3 is composed of connected six step ladder elements respectively corresponding to the operation steps B3S0 through B3S5, as shown in FIG. 20. Basically, each step ladder element is formed by connecting the operation element Y to the interlock. The step ladder elements corresponding to the operation steps B3S0 through B3S5 are formed by connecting output operation elements YA to YF shown in the B3 operation map of FIG. 19 to interlocks ILC-0 through ILC-5. Thus, the interlocks for the step ladder elements respectively corresponding to the operation steps B3S0 through B3S5 are automatically formed, thereby automatically obtaining the ladder map program for the operation block B3.

Since in the example shown in FIG. 8 the block B3 is subordinate to the blocks B0 and B1, the block B3 is started provided that the blocks B0 and B1 are completed. However, for simplification of description, the description relating to FIG. 21 has been made as if the block B3 is connected to the block B1 alone. If the block B0 is not omitted, the block 0 operation confirmation condition must be inserted in series in the pattern A of FIG. 21.

Figure 22:
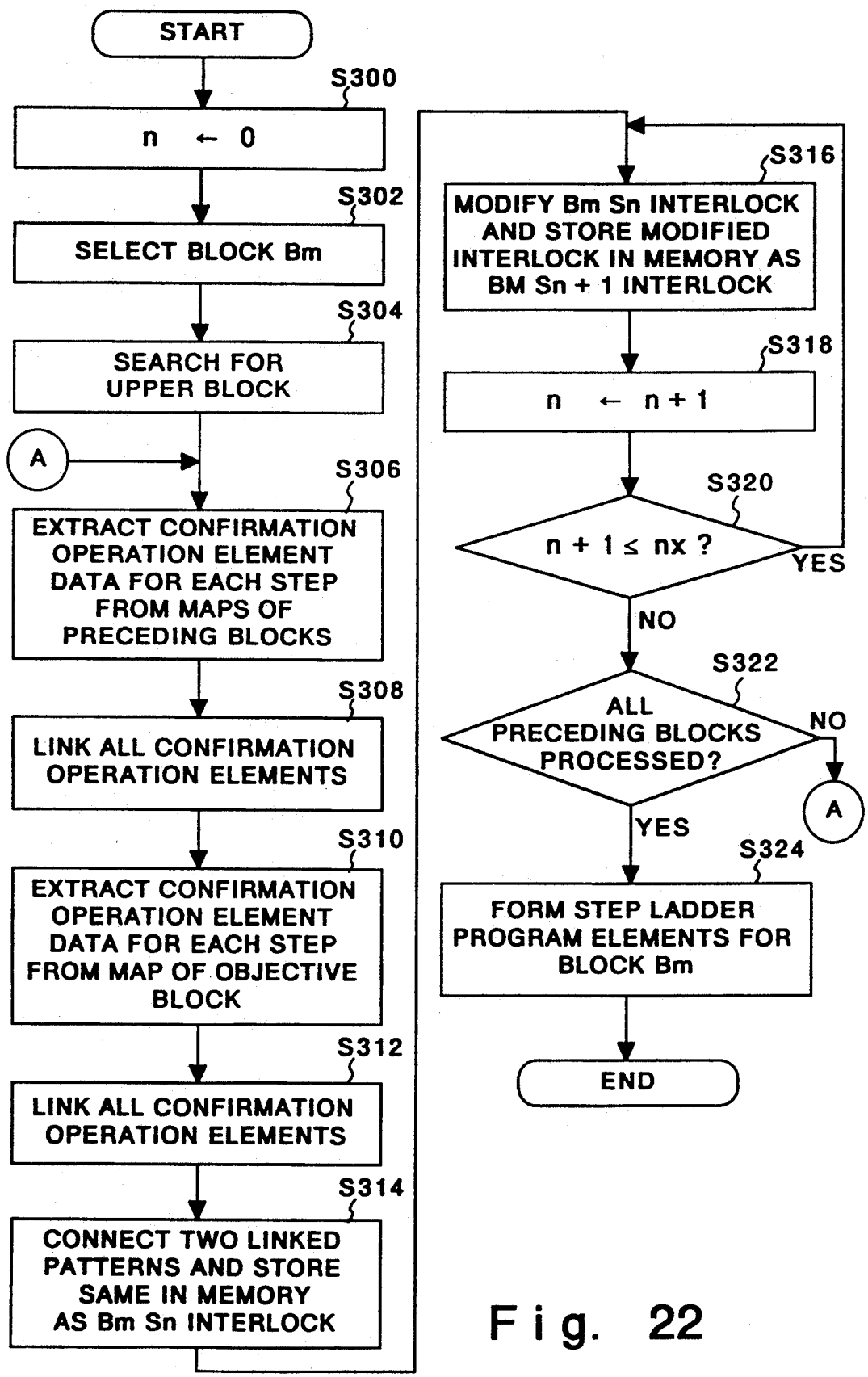
FIG. 22 is a flow chart of the execution sequence of the interlock condition production program.

A process of forming interlocks will be described below with reference to the flow chart of FIG. 22.

First, for initial setting, a variable n is set to 0 (step S300). Then, in step S302, an operation block which is the object of interlock formation is designated by the operation of the keyboard 67. In step S304, operation blocks preceding the operation block designated in step S302 is searched out of the chart of FIG. 8 (or the operation block map of FIG. 13). In a case where the block B3 is designated, the blocks B0 and B1 are found as immediately preceding blocks.

In step S306, data on confirmation operation elements of the operation steps of each preceding operation block is extracted. This operation is effected by extracting data on confirmation operation elements (e.g., X0, X1 and X2) from the preceding step operation step map (FIG. 18). In step S308, the data items representing the confirmation operation elements X0 through X2 of the preceding operation block extracted in step S306 are linked. In other words, the completion of the preceding operation block B1 is confirmed if it is confirmed that the output operation elements Y0, Y1 and Y2 of the operation steps B1S0 through B1S2 have been normally operated. That is, a display pattern (A of FIG. 21) is formed in which symbols X0 through X2 are linked in series and which indicates that all the confirmation operation elements X0 through X2 are in the confirmation state where they are set in the normal position N.

In step S310, confirmation operation element data is extracted from the operation step map (FIG. 19) of the operation block (block B3 in this example) which is the object of interlock formation. In this example, data on the confirmation operation elements XA, XB, XC, XD, XE, and XF of all the operation steps B3S0 through B3S5 of the block B3 is extracted and is stored in the RAM 64. In step S312, a pattern indicating that each of the confirmation operation elements XA through XF is in the non-confirmation state is formed as the series linkage pattern B of FIG. 21 based on the extracted data on the confirmation operation elements XA to XF. The non-confirmation state of each of the confirmation operation elements XA through XF means that the normal completion of the operation of the corresponding one of the output operation element YA, YB, YC, YD, YE, and YF of the operation steps B3S0 through B3S5 is not confirmed, and that the confirmation operation element is in the inverse position.

In step S314, the linkage pattern of the preceding block (B1) formed in step S308 and the linkage pattern of the object block (B3) formed in step S312 are connected, and the connected pattern is written in the memory as the interlock condition of the operation step B3S0. Thus, a pattern TO of linkage of the confirmation operation elements represented by the pattern C of FIG. 21 is formed. This linkage pattern TO is set as the interlock ILC-0 for the step ladder element corresponding to the operation step B3S0 and is stored in the RAM 64. This linkage pattern TO represents the state in which with respect to all the operation steps B1S0 to B1S2 of the operation block B1 preceding the operation block B3, the confirmation operation elements X0 through X2 confirm that the output operation elements Y0 through Y2 have been operated, and in which with respect to all the operation steps B3S0 through B3S5 of the operation block B3, the confirmation operation elements XA through XF indicates that all the output operation elements YA through YF have not been operated yet. Thus, the condition for starting the output operation element YA of the operation step B3S0 which is the first operation step of the operation block B3 is set.

In the loop of steps S316 through S320, the interlock conditions for the rest of the operation steps of the interlock formation object operation block are successively formed.

That is, in step S316, the interlock condition for the operation step BmSn of the object block (which is B3S0 in this case) formed in step S314 is changed to form the interlock condition for the step BmSn+1 (which is B3S1 in this case). In other words, the linkage pattern TO (=interlock ILC-0) stored in the RAM is read out and is changed so that the position of the nth (=first) element of the confirmation operation elements constituting the linkage pattern is changed to the normal position N by confirming that the corresponding output operation element YA has been operated. This is because the operation step BmSn+1 is started provided that the completion of the operation of the output operation element of the preceding operation step BmSn is confirmed. The changed pattern, i.e., a linkage pattern T1 such as that represented by the pattern D of FIG. 21 is formed and is set as the interlock ILC-1 for the step ladder element corresponding to the operation step B3Sn+1, i.e., the operation step B3S1 (in step S316).

In step S318, the variable n is incremented by 1. The operation of step S316 is repeated until it is executed for all the operation steps of the program formation object operation block $(n+1 \leq n_x)$.

Thus, the confirmation operation element linkage patterns T1 through T5 representing the interlocks ILC-1 through ILC-5 are successively obtained, thereby setting the conditions for starting the output operation elements YB to YF of the operation steps B3S1 through B3S5 which are second to fifth operation steps of the operation block B3. Thus, the interlocks ILC-0 through ILC-5 for the step ladder elements respectively corresponding to the operation steps B3S0 through B3S5 of the operation block B3 are formed automatically.

In step S322, examination is as to whether or not operation step ladder programs are formed with respect to all the preceding operation blocks directly connected to the program formation object operation block, thereby enabling the above operation to be repeated with respect to all the preceding operation blocks.

Thus, it is possible to successively determine the adder program elements including the interlocks of all the operation steps of the subordinate operation block from the interlock conditions of the operation steps of the preceding operation blocks. The interlocks are automatically formed by the system, and the programmer can be released from a laborious task requiring a consideration of interference between the interlock conditions of the operation steps and can concentrate on designation of the logic of the operation confirmation condition for each operation step of each operation block.

FORMATION OF STEP OPERATION

Role of Program For Step Operation Description Production

Referring back to FIG. 1, automatic formation of the sequential control program in accordance with the present invention will be described again. As shown in FIG. 1, automatic formation of the sequential control program includes "formation of whole sequence", "production of step operation description" and "formation of interlocks". The "whole sequence formation" program (FIG. 16) is used to form the ladder program which describes the connection between the blocks. In the ladder program (FIG. 17) formed by the "formation of whole sequence", however, the operation steps in the blocks are not related to each other. The program for interrelating the operation steps is the above-described "formation of interlocks".

If the production line is simple, that is, for example, only one operation confirmation device is provided for confirming the output device Y as in the case of the operation steps shown in FIGS. 18 and 19, the object of composing a sequential control program can be achieved only by the above-described "formation of whole sequence" and "formation of interlocks". This is because a specific operation of an operation step can be described by one confirmation limit switch (L/S of FIG. 9A) in the operation step map (FIG. 15, FIG. 18 or FIG. 19). However, the operations of actual operation steps are complicated. The object of the "production of step operation description" program of this system shown in FIG. 1 is given to form a ladder program in which various operations of actual operation steps are suitably described. In other words, in the "production of step operation description" program of this embodiment, various operations of actual operation steps can be suitably described.

Outline of Production of Step Operation Description

For program description of the operation of each operation step, it is not necessary to consider the relationship between the operation steps. In the production line shown in FIG. 5 and so on, a common operation step ladder pattern can be prepared with respect to each of the transfer device 16 and the docking unit 40. In this embodiment, a pattern such as that shown in FIG. 23 is used as a common ladder pattern for the transfer device 16. In FIG. 23, ─╂─ is a symbol representing a minimum unit operation confirmation device, □ is a symbol representing a set of a plurality of operation confirmation devices, and ⟨ ⟩ represents an output device. Characters p, q, t, P, Q, R, and S are operating device symbols. Symbols p, q, and t are attached to minimum unit operating devices. E1 through E7 are operating device numbering symbols.

The sets of operation device P, Q, R, and S respectively have patterns such as those shown in FIGS. 24A through 24D. For example, the set P consists of single operating devices p1 and p2. Operating device numbering symbols, e.g., E2-1 and E2-2 of FIG. 24A, are also attached to single operating devices which are components of a set of operating devices. The operating device numbering symbols are used for designating the devices of the ladder pattern shown in FIG. 23.

FIG. 25 is a diagram in which the ladder patterns shown in FIGS. 23 and 24 are rearranged so as to be easy to process by the CPU 62. Symbols LOAD, AND, OR and OUT respectively designate a first operation device of a block, an operating device of a series connection, an operating device of a parallel connection, and an operating device for outputting.

Figure 26:
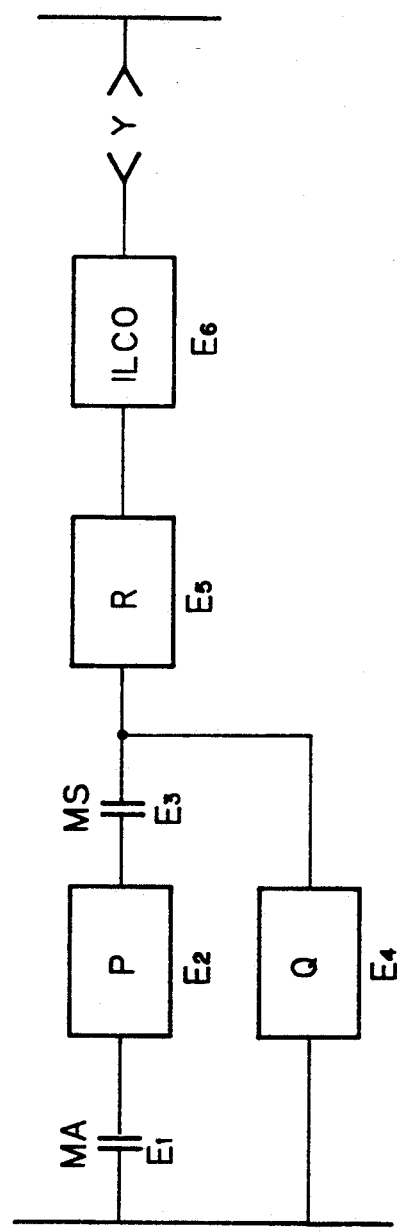
FIG. 26 is a diagram of the kinds of elements in the pattern of FIG. 23.

The ladder element of each operation step includes some operating device fixed for the system. This device corresponds to each of the devices MA and MS in the example shown in FIGS. 11. In the example shown in FIG. 23, the devices with the numbering symbols E1 and E2 correspond to the devices MA and MS. In FIG. 26, ILC0 with a numbering symbol E6 represents the above-described interlock logic.

For formation of the program describing the step operations, an operation step map such as that shown in FIG. 15 is used. FIG. 27 shows an example of the operation step map used for the "production of step operation description". The map of FIG. 27 differs from that of FIG. 15 mainly in that the set of operating confirmation devices consists of three devices. That is, with respect to an operation step BxSy, the specific operation of the step P is expressed by operation confirmation devices X100, X101, and X102. The three operation confirmation devices are necessary for the transfer device 16. In the case of other "equipment units", the number of devices may be different depending upon the definition of ladder patterns given to the equipment unit.

The standard pattern shown in FIG. 23 (or 25) does not expresses the peculiarity, i.e., particularity of an operation step because of its standard characteristics. The peculiarity, i.e., particularity of an operation step is expressed by the operation step map of FIG. 27. Accordingly, to assign the specific devices of the operation steps of this map to the devices of the standard ladder pattern of FIG. 23, it is necessary to describe the relationship between the elements of FIG. 23 and the data items shown in the operation step map of FIG. 27. Of the devices shown in FIG. 2, the devices MA, MS and so on are fixed by the system. The interlock ILC0 is given in accordance with the above-described formation of interlocks. Accordingly, of the data items of the operation step map of FIG. 27, the set of operation confirmation devices and the set of manual confirmation devices may be respectively assigned to the sets of devices R and Q. FIG. 28 shows a "data map" obtained in this manner in which is shown the relationship between the ladder pattern of FIG. 23 and the operation step map of FIG. 27. In other words, the operations of an operation step are expressed by the "data map" of FIG. 28.

Thus, a ladder program in which the operation of an operation step such that at least two devices are operated is automatically formed.

Procedure of Production of Step Operation Description

Figure 29A:
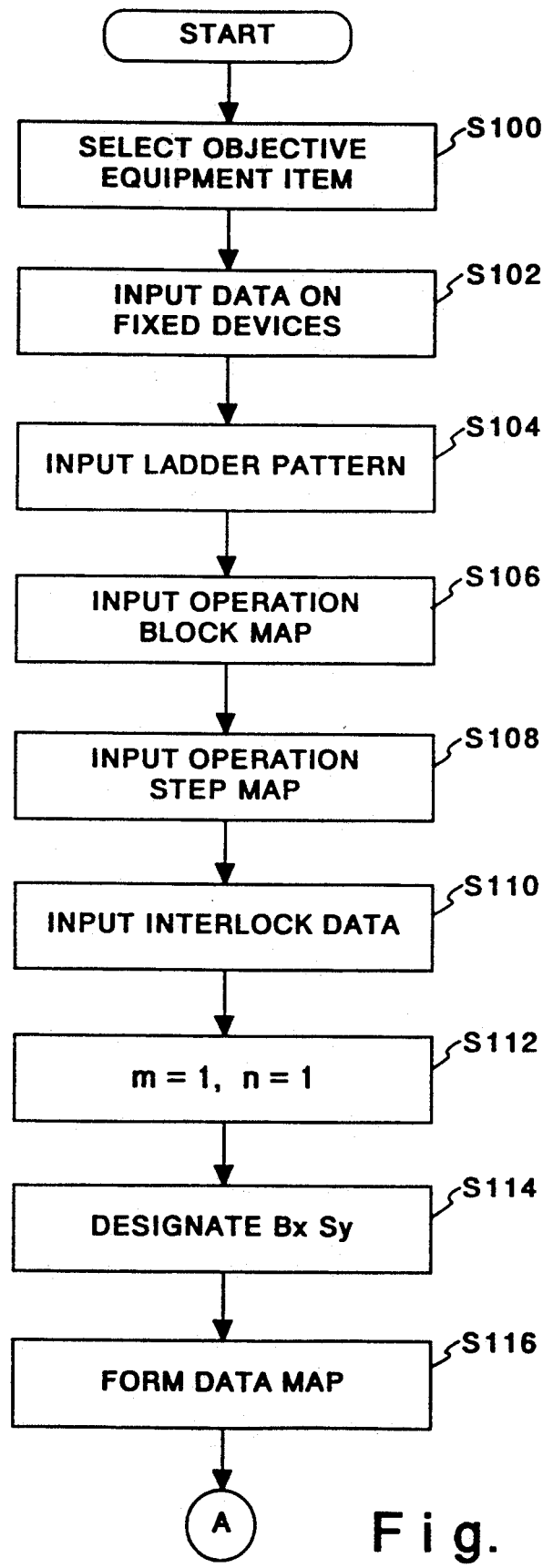
FIGS. 29A through 29B are flow charts of the execution sequence of the step operation description production program in accordance with the embodiment.
Figure 29B:
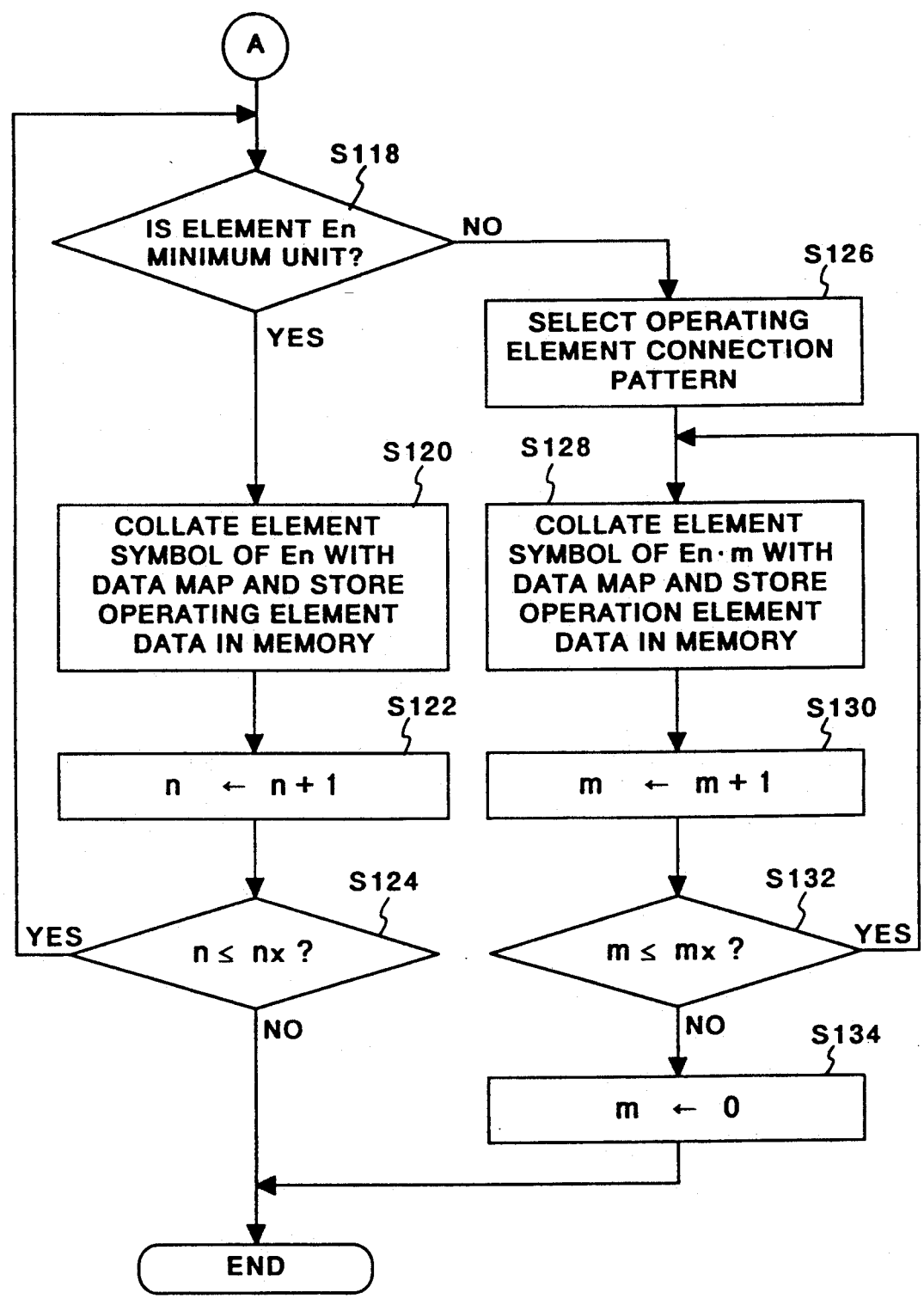

A procedure for producing operation step description will be described below with reference to FIG. 29.

In step S100, an equipment unit is selected because the ladder pattern of FIG. 23 differs with respect to equipment units. In step S102, data on the devices (MA and MS) fixed for the system is input from the disk 51. In step S104, a special standard ladder pattern for the selected equipment unit, such as that shown in FIG. 23, is input from the disk 51. In step S106, an operation block map such as that shown in FIG. 13 is input from the disk 51. In step S108, an operation step map such as that shown in FIG. 27 is input from the disk 51. In step S110, the interlock logic produced by the procedure of FIG. 22 is input from the hard disk 51. In step S112, variables m and n are respectively set to 1. Then, in step S114, the keyboard 67 is operated to select and input the program object operation step BxSy.

In step S116, the data map of FIG. 27 is formed based on the interlock logic of step S110 and so on.

In step S108 and other subsequent steps, elements En of the ladder pattern are assigned to the devices of the present operation step in order. If at this time the element En is a minimum unit device, processing of step S120 is effected, or if the element En is a set of devices processing of step S128 is effected.

Details of the subsequent part of the process will be described below.

n=1: With respect to the standardized step ladder pattern shown in FIG. 23, the process proceeds to step S120 since the operating device having device numbering symbol E1 is a minimum unit operating device to which symbol p is attached. In step S120, the operating device symbol p attached to the minimum unit operating device is collated with the data map (the map of FIG. 28 formed in step S116). The device MA is assigned to the device having the symbol p in accordance with the map of FIG. 28. Since a mnemonic command LOAD is assigned to the operating device numbering symbol E1 in accordance with the table of FIG. 25, device operating data corresponding to the minimum unit operating device to which the operating device symbol p is attached is

I LOAD MA (as shown at n=1 in FIG. 30). This data is stored in the RAM 64. The data item I denotes that the device MA is set in the inverse position.

n=2: Next, in step S122, the variable n is incremented by 1. Since the operating device having operating device numbering symbol E2 is not a minimum unit operating device but a set of operating devices, the process proceeds to step S126. In step S126, the pattern of the set of operating devices to which the operating device symbol p is attached, e.g., the pattern A of FIG. 24 in which two minimum unit operating devices are connected is read out of the hard disk unit 51. Device numbering symbols (E2-1, E2-2) are thereby given to the respective devices of the operating device set. Ordinarily, each of the elements of the operating device sets is specified by using En-m.

In step S128, the device symbol p1 attached to the device En-m (E2-1 in this example) is collated with the data map of FIG. 28, thereby obtaining operating device X4. Device operating data relating to the operating device having numbering symbol E2-1 is obtained as

AND X4 by reference to FIG. 25. This data is stored in the RAM 64 as indicated at m, n=2, 1 in FIG. 30.

Next, in step S130, the variable m is incremented by 1 to set m=2 in this case. In step S132, determination is made as to whether or not the value of the variable m is equal to or smaller than the maximum value $m_x$. Since the variable m is presently smaller than the maximum value $m_x$, device operating data corresponding to the device En-m is formed based on the data map (FIG. 28) and FIG. 25 in step S128. That is,

AND X5 is obtained.

$n \leq n_x$: The operation of steps S118 through S122 is repeated until the variable exceeds the maximum value $n_x$. The maximum values of the variables n and m are determined based on, for example, the list of FIG. 25. For example, $n_x=7$, in the case of the example shown in FIG. 23. However, $m_x$ varies depending upon the value of n For example, $m_x=5$ when $n=6$ in the example shown in FIG. 23.

Figure 31:
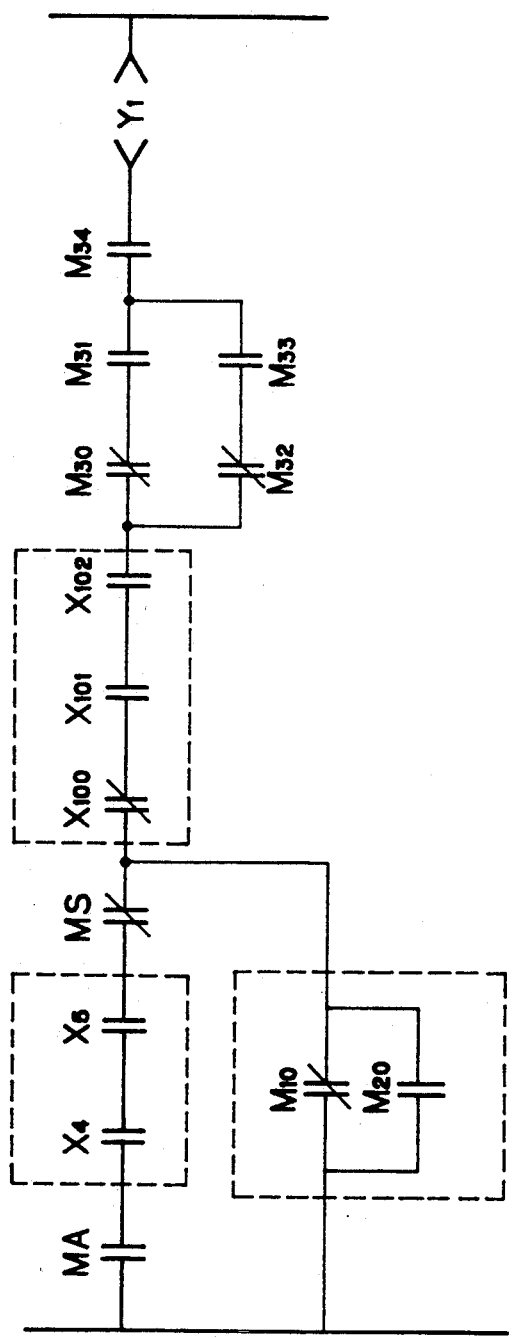

Thus, the device operating data for the minimum unit operating devices relating to the operation step BxSy selected as program composition object operating devices is stored in the RAM 64 as data on a step ladder element of the sequential control ladder program. That is, a step ladder element of the sequential control ladder program is automatically prepared with respect to the operation step BxSy. The sequential ladder program relating to the example shown in FIGS. 23 and 27 is shown in FIG. 30. A step ladder element of the sequential control ladder program obtained based on this data is shown in FIG. 31.

If BxSy is changed in step S114 BxSy, the whole of the sequential control ladder program can be formed by connecting the step ladder elements for the operation step BxSy and other operation steps of the sequential control ladder program.

As is apparent from the foregoing, in the "step operation description production" program of this embodiment, the operations which are to be successively effected by various equipment units provided for the production line are grouped into a plurality of operation blocks and, if each of the operation block is divided into a plurality of operation steps, ladder elements corresponding to the operation steps can be automatically prepared based on various items of data on minimum unit operating devices relating to each operation step, thereby effectively reducing the number of steps for composing the sequential control program.

FIRST EMBODIMENT OF MALFUNCTION DIAGNOSIS

The following description is related to a first embodiment of malfunction (breakdown) diagnosis. According to the first embodiment, a breakdown diagnosing method is applied to an assembling apparatus for mounting suspensions or the like components and an engine into the body of an automobile in an assembling line.

Figure 32:
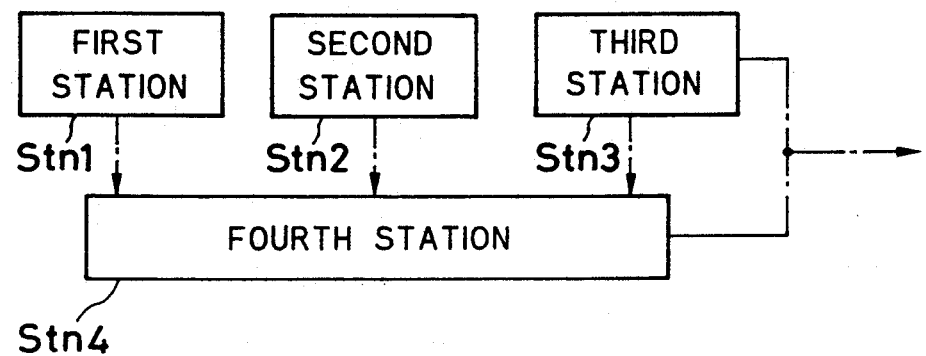
FIG. 32 is a diagram schematically showing the structure of one example of a production line explanatory for the fundamental concept of operation groups, operation blocks and operation steps used in a first and second embodiments of malfunction diagnosis system.

Referring first to FIG. 32, an assembling apparatus 101 is provided with a positioning station S1, a docking station S2 and a screwing station S3. An automobile body W is carried into positioning station S1 from a previous process to be arranged in a positioning state. Then, the body W is installed and docked with an engine 102 placed at a predetermined position on a pallet P and such components as front and rear suspensions 103 (only the rear suspension is shown in FIG. 32), etc. in docking station S2. After the body is docked, the engine 102 and suspensions 103 are tightened up in screwing station S3. An overhead transfer device Q2 is provided between stations S1 and S2, so that the body W is transferred from station S1 to station S2 while it is suspended. Moreover, a carrier device Q5 is provided between stations S2 and S3 for carrying the pallet P.

A relay stand 112 is mounted in station S1 which runs to and fro along a rail 11 so as to send the body W fed from the F previous process to a starting end of transfer device Q2. The relay stand 12 has a plurality of body receiving elements 13 for supporting the lower part of the body W. The receiving elements 13 are movable up and down. In station S1, there is further mounted a positioning device Q1 although it is not concretely shown in FIG. 37. The positioning device Q1 is comprised of a positioning means for positioning relay stand 112 at a predetermined position in a front-and-rear direction, a positioning means for positioning receiving elements 113 at a predetermined position in an up-and-down direction and a reference pin for positioning the body W at the relay stand 112, etc.

The transfer device Q2 consists of a guide rail 116 which is extended over stations S1 and S2 to connect therebetween, and a carrier 117 which reciprocally runs in a suspended state along the guide rail 116. As indicated in FIG. 42, the carrier 117 is provided with a hanger arm 118 which is manipulated up and down, and body holding arms 119 at lower four corners of the hanger arm 118 in a retractable and swinging manner. Each of these holding arms 119 is allowed to swing, for example, by an air cylinder (not shown), and has an engaging pin 119a at an end portion thereof which is to be engaged with the body W.

Figure 43:
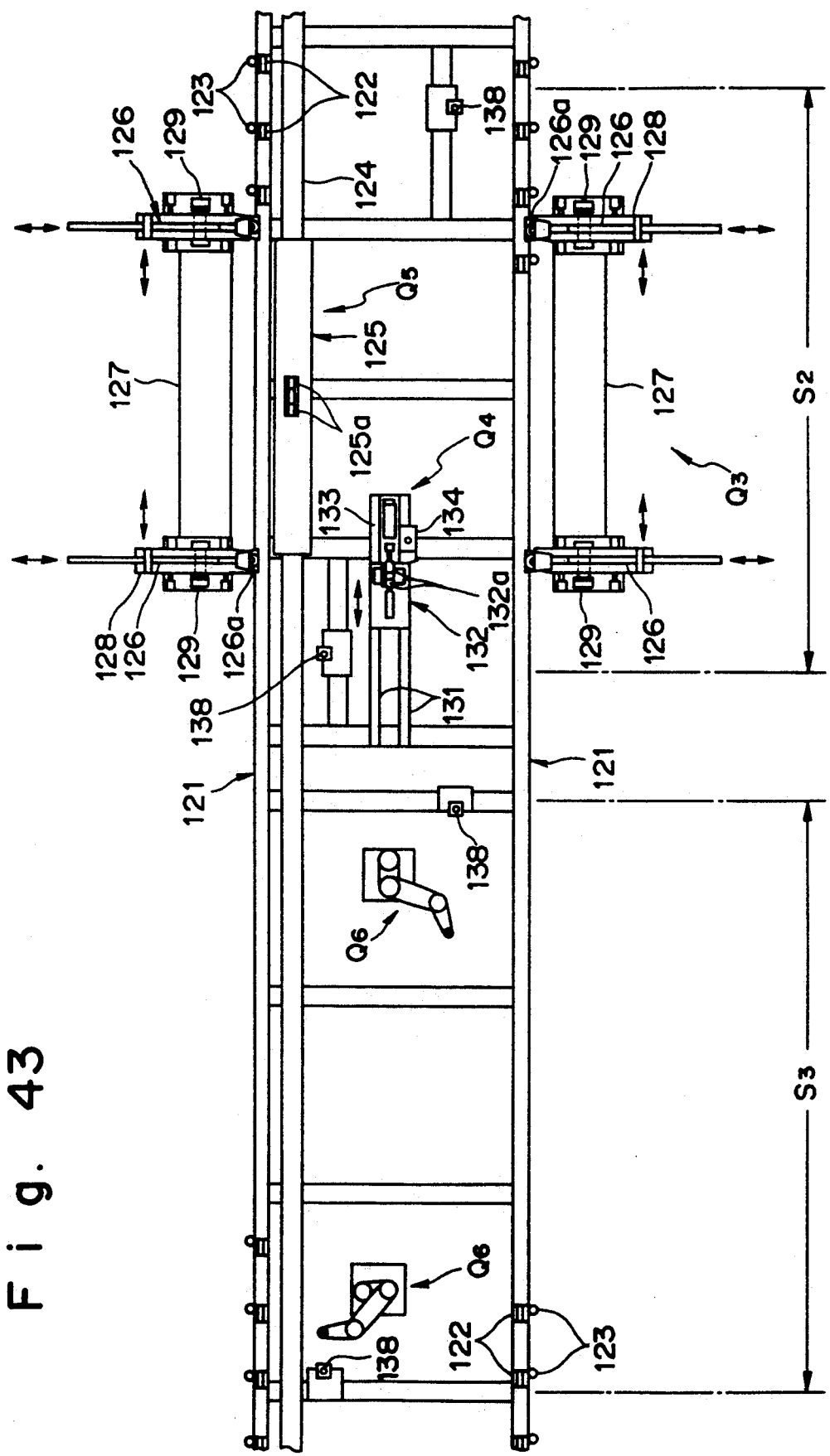
FIG. 43 is a plane view of a docking station and a screwing station.

As indicated in FIG. 43, the pallet carrier device Q5 connecting the docking station S2 and screwing station S3 is provided with a pair of right and left guide portions 121 which have many supporting rollers 122 for receiving right and left lower ends of pallet P and many side rollers 123 for guiding right and left lateral surfaces of pallet P, a carrier rail 124 extending in parallel to the guide portions 121 and, a pallet holding portion 125a for securely holding pallet P. The pallet carrier device Q5 also includes a pallet carrier platform 125 provided in a manner to be movable along the carrier rail 124.

Although it is not clearly seen from the drawing, guide portions 121, 121 and carrier rail 124 are formed in a loop starting from a component feed station (not shown) where the engine 102 and suspension 103, etc. are supplied to the assembling apparatus 101, passing through docking station S2, screwing station S3, and a carrier station (not shown) where the body W finished with screwing work is transferred to a subsequent process to return to the component feed station (not shown). A plurality of pallet carrier platforms 125 on the carrier rail 124 are circulated by a predetermined cycle.

Figure 41:
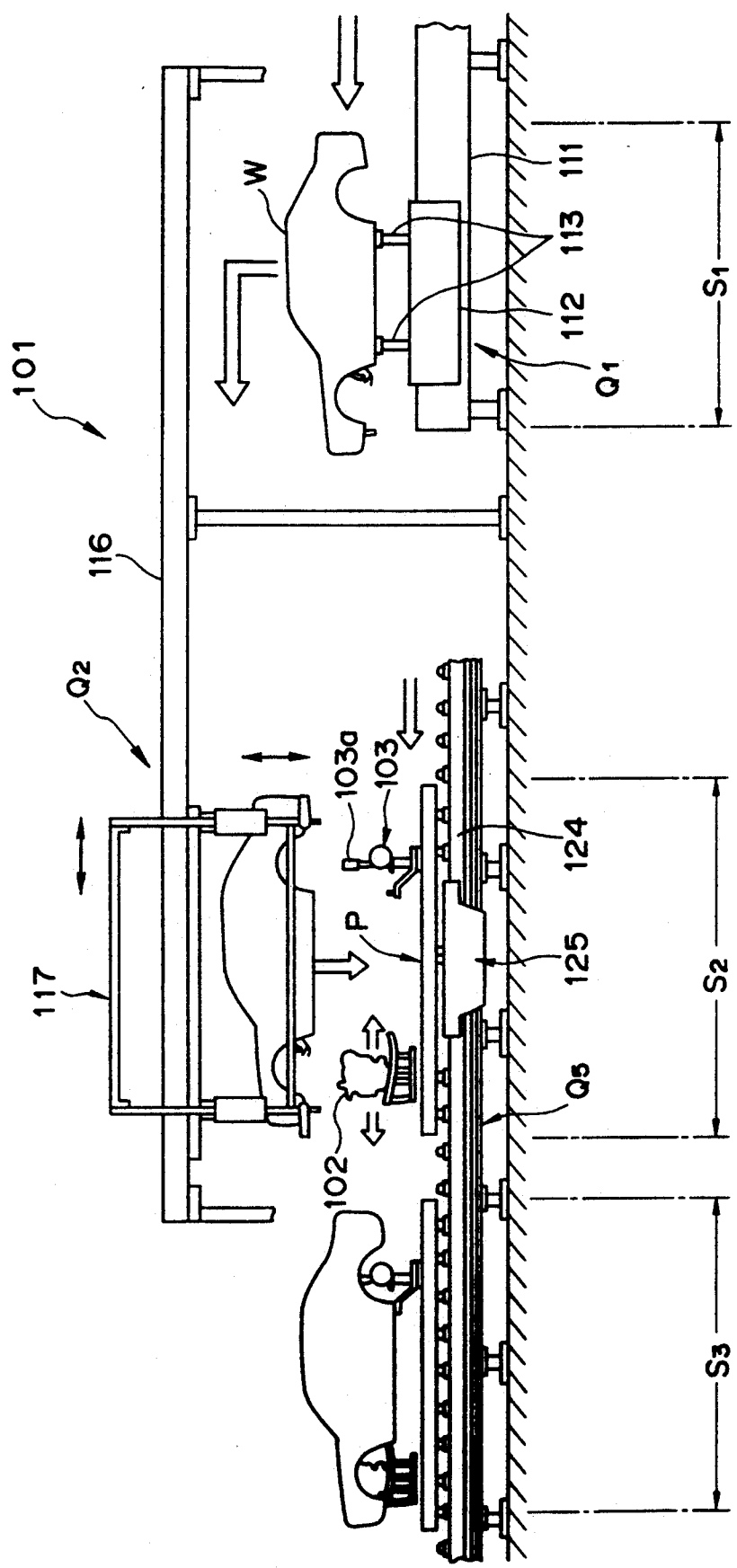
FIG. 41 is a schematic front elevational view showing the total structure of the assembling apparatus according to the first embodiment.

Front and rear clamp arms 126 in pairs are placed in docking station S2 at positions corresponding to where the front and rear suspensions 103 are mounted, so that a damper unit 103a (referring to FIG. 41) which is in a floating state until it is mounted in body W when the suspension 103 is installed is held at a predetermined posture for docking. The guide portions 121 are intervened between the pair of clamp arms 126. Each clamp arm 126 has a hook 126a at its end portion for clamping damper unit 103a, and is mounted in a mounting base 127 provided at the lateral sides of guide portions 121, 121, through a mounting plate 128 in a retractable manner in a right-and-left direction (widthwise direction of the automobile). An arm slide 129 is attached to the mounting plate 128 in order to slide the same in a front-and-rear direction. The arm slide 129 is, e.g., an air cylinder. Because of the arm slide 129, the damper unit 103a is allowed to move right and left and, front and rear while it is clamped. In other words, the clamp arms 126 and arm slides 129 form a part of a docking device Q3 which docks the engine 102 and suspension 103 with the body W.

Moreover, in the docking station S2, a pair of right and left slide rails 131 are placed in parallel to guide portions 121 of the pallet carrier device Q5. A movable body 132 slides along the slide rails 131 in a front-and-rear direction by an electric motor 133. The slide rail 31, movable body 132 and electric motor 133 constitute a slide device Q4. As will be described later in detail, when the engine 102 on the pallet P is moved in a front-and-rear direction by the slide device Q4, the body W can be prevented from being interfered with the engine 102 when they are docked.

A plurality of robots Q6 are arranged in the screwing station S3 so as to tightly screw the engine 102 and suspensions 103, etc. to the body W. At the same time, a plurality of pallet reference pins 138 are so provided as to be movable up and down. The fed pallet P is positioned and locked at a predetermined position by the reference pins 138. The same pallet reference pins as those pins 138 are provided also in the docking station S2.

Figure 44:
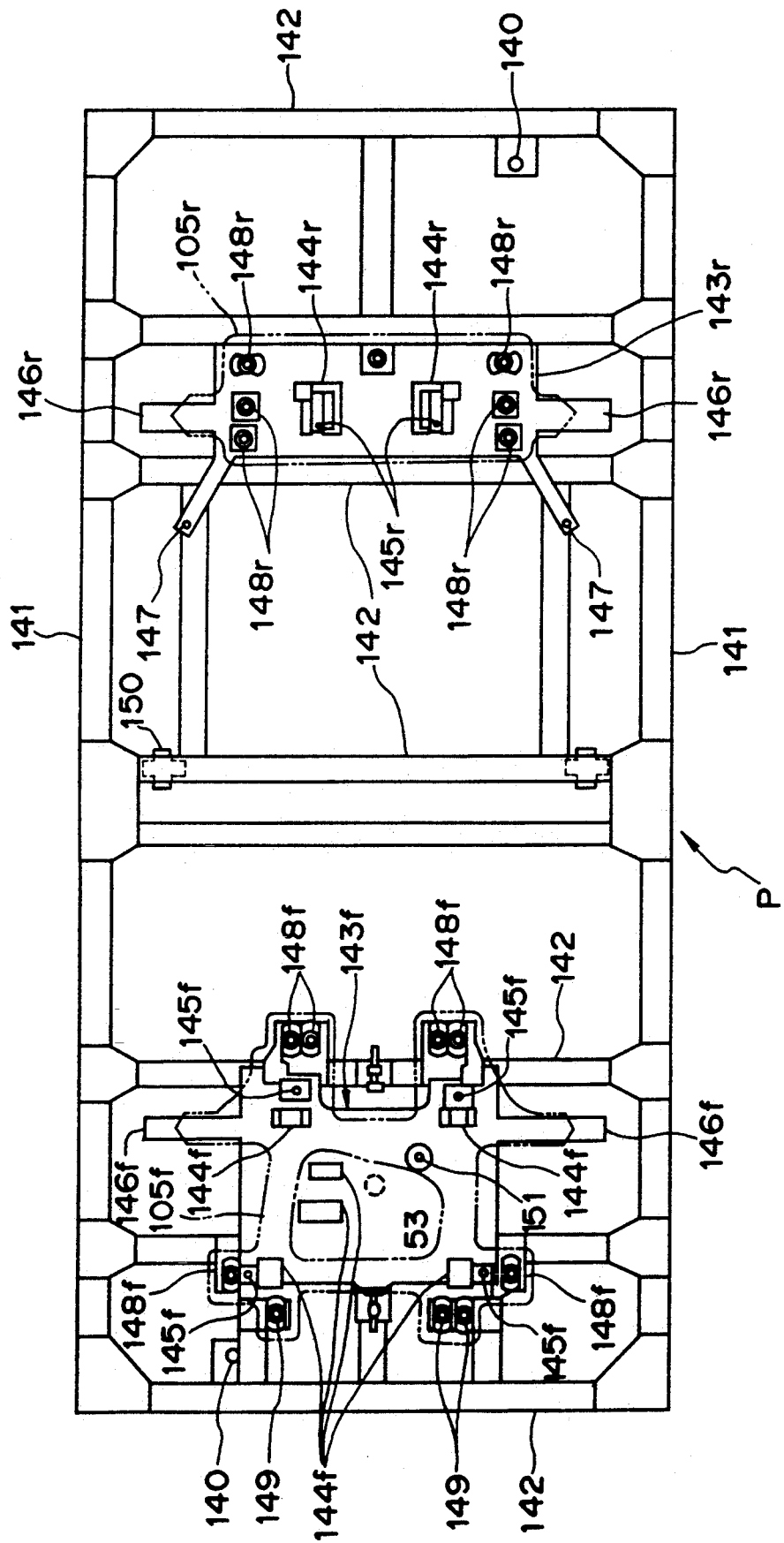
FIG. 44 is a plane view of a pallet.

The pallet P as shown in FIG. 44, is formed in a ladder-like shape by a pair of longitudinal frames 41 extending in a front-and-rear direction and many lateral frames 42 stretching out between the frames 141. In the vicinity of the front and rear end portions of the pallet P are formed a plurality of engaging holes 140 to be engaged with the pallet reference pins 138. Further, in the vicinity of the lateral sides at the central part of the pallet P in a front-and-rear direction are formed to-be-engaged portions 150 which are to be engaged with the engaging portions 125a of the pallet carrier platform 125.

A front supporting base plate 43f is provided in the front part of the pallet P so as to support a front base frame 105f on which are placed the engine 102, front suspension (not shown) and the like. On the other hand, a rear supporting base plate 143r is provided in the rear part of the pallet P so as to support a rear base frame 105r having the rear suspension, etc. placed thereon. As indicated in FIG. 45, the front and rear supporting base plates 143f and 143r have a plurality of supporting members 144f, 144r for supporting the base frames 105f, 105r or body W, a plurality of positioning pins 145f and 145r for positioning base frames 105f, 105r at supporting base plates 143f, 143r, and body receiving elements 146f, 146r for supporting the body W through a bracket (not shown), etc. respectively. The rear supporting base plate 143r is further provided with a plurality of body positioning pins 147 for positioning the body W on the pallet P, and many nut holders 148r which hold nuts to be screwed in the screwing station S3.

Meanwhile, similar nut holders 148 and volt holders 149 to those provided in the rear part of the pallet P are directly attached to the pallet P in the front part thereof. A lock pin 151 is provided so as to lock the front supporting base plate 143f at a predetermined position. It is possible to switch the lock pin 151 in an urged state to the engaging side by a spring (not shown) or to the releasing side by a releasing lever 152. Further, the front supporting base plate 143f is integrally formed with an engaging member 153 extending downwards which is engaged with an engaging hook 132a provided at the upper surface of the movable body 132 (FIG. 43) of the slide device Q4. The slide device Q4 is additionally provided with an air cylinder 134 so as to move the releasing lever 152 to the releasing side. When the body W is to be descended towards the docking station S2, the releasing lever 152 is manipulated and released in accordance with a predetermined descending timing of the body W, and accordingly the lock pin 151 becomes disengaged. Since the front supporting base plate 143f (namely, engine 102) is subsequently moved in a front-and-rear direction by the slide device Q4 through the engaging member 153, the body W can be prevented from being interfered with the engine 102.

As is made clear from the foregoing description, the assembling apparatus 101 according to the present embodiment is comprised of the positioning device Q1, transfer device Q2, docking device Q3, slide device Q4, pallet carrier device Q5 and screwing robot Q6 as main output components constituting the operating system. These output components are sequentially controlled in accordance with programs arranged beforehand.

In the first embodiment, various operations to be carried out by the equipment in the production line are classified into a plurality of operation groups, the operation group being a unit of a series of operations carried out from the start to finish thereof independently at a normal state, and at the same time, each operation group is further classified into a series of operation blocks carried out independently from the start to finish thereof at a normal state. Moreover, each operation block is classified into a plurality of operation steps. In the above-described structure, the equipment is controlled by the sequential program such that the plurality of operation steps in each operation block are sequentially executed in accordance with the predetermined order, and the plurality of operation blocks in each operation group are sequentially carried out in accordance with the predetermined order.

Before the assembling apparatus 101 in the automobile assembling line is concretely depicted hereinbelow, the fundamental concept of the above-described operation groups, operation blocks and operation steps will be explained first.

Referring to FIG. 32, one example of a production line is schematically illustrated for explaining the fundamental concept of the operation groups, operation blocks and operation steps. The production line is fitted with a continuous conveyor line and a plurality of linear transfer lines which carries in and out components, products, etc. by a tact transfer method to the continuous conveyor line. Each transfer line forms an independent station. As shown in FIG. 32, for example, a first station Stn1 and a second station Stn2 are arranged for a fourth station Stn4 which is constituted by a continuous conveyor line, so that components and products, etc. are carried into the fourth station Stn4 therefrom. At the same time, a third station Stn3 is also arranged for the fourth station Stn4 so that the components and products, etc. are transferred to a succeeding station for next process (not shown) in accordance with the timing with which the components, etc. are carried out from the fourth station Stn4. If the operations in the first and second stations Stn1 and Stn2 are normally carried out, the fourth station Stn4 becomes operable. Moreover, if the operations are normally carried out in the fourth and third stations Stn4 and Stn3, then, the succeeding station (not shown) is rendered operable.

Figure 33:
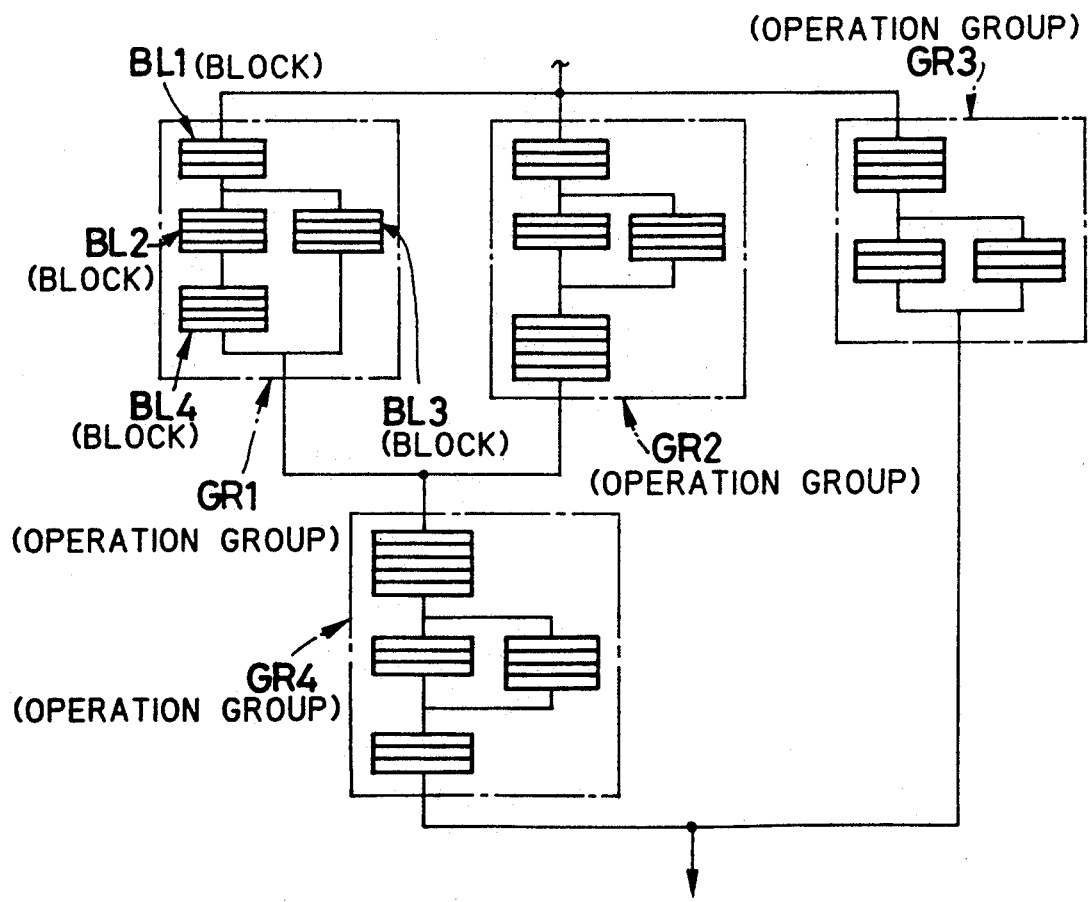
FIG. 33 is a flow-chart showing various operations in the production line classified into operation groups, operation blocks and operation steps.

Referring now to FIG. 33, various operations respectively executed in each of the above stations Stn1, Stn2, Stn3 and Stn4 form operation groups GR1, GR2, GR3 and GR4 as a unit of a series of operations independently carried out from the start to finish thereof at the normal state. Each operation group GR1, GR2, GR3 or GR4 is divided into a plurality of operation blocks as a unit of a series of operations independently carried out from the start to finish thereof at the normal state, which block is further divided into a plurality of operation steps.

More specifically, by the example of the operation group GR1 (a first operation group) consisting of a series of operations in the first station Stn1, the group GR1 is divided into operation blocks BL1, BL2, BL3 and BL4, and each of these blocks is divided into a plurality of operation steps. It is to be noted that it may be possible that the operation group is formed of a single operation block, or the operation block is substantially formed of a single operation step.

The operation steps in each operation block are sequentially executed, and the operation blocks in each operation group are sequentially executed, and further operation groups GR1, GR2, GR3 and GR4 are sequentially executed, in the predetermined order in accordance with a sequential controlling program.

Figure 34:
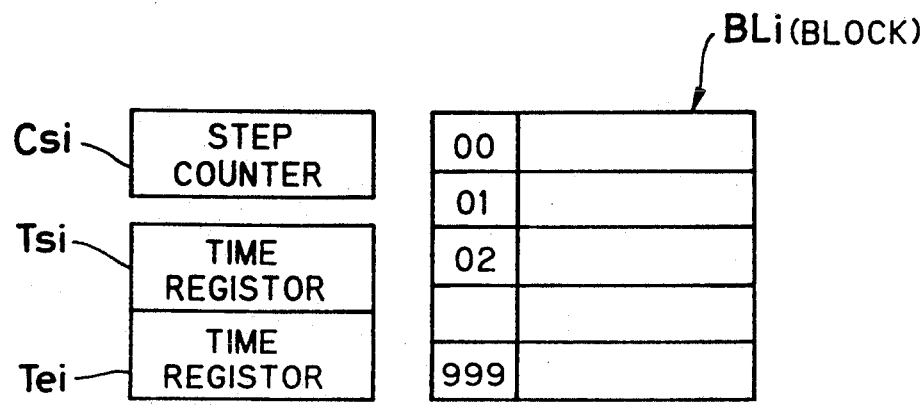
FIG. 34 is a schematic view of the operation block provided with a step counter and a time register.

Hereinbelow, the basic idea of the breakdown diagnosing method in a production line of the present invention will be explained. As shown in FIG. 34, every operation block BLi in the diagnosing device is provided with a step counter Csi and time registers Tsi and Tei. In the step counter Csi, steps executed in the operation steps in the block are inputted. On the other hand, in the time registers Tsi and Tei, a timer value at the start of operation in the block BLi and a timer value at the end of operation in the block BLi are respectively inputted on the basis of a time indicated by a clock built in a microcomputer of the diagnosing device.

The operation time $Txi$ ($=Tei-Tsi$) spent from the start to finish of a series of operation steps in the block BLi is calculated from the data inputted in the time registers Tsi and Tei, which is then stored in a memory in the microcomputer. Meanwhile, a reference time Tsti ($=Txim+3$) for the block BLi which is determined by the average time Txim and standard deviation of the measured operation time measured at the normal operating time for a predetermined number of cycles is inputted beforehand in the microcomputer. It is more preferable if the reference time data is updated every cycle. Accordingly, the presence or absence of an abnormality in the block BLi can be diagnosed by comparing the reference time Tsti and the measured operation time Txi. In other words, when the measured operation time is not larger than the reference time Tsti, it is so diagnosed that the block operates normally. On the contrary, when the measured operation time exceeds the reference time Tsti, the operation of the block BLi is diagnosed abnormal.

In the event block BLi is found abnormal, a count value of the step counter Csi in the block BLi is read, whereby the abnormal operation step can be specified. That is, an operation step following an operation step which has completed operating thereby to have a step number counted by the step counter Csi is specified as a broken step. Thereafter, the abnormal operation step is searched in a reverse direction in the sequence circuit, so that a broken contact point can be concretely identified on the ladder diagram.

Figure 35:
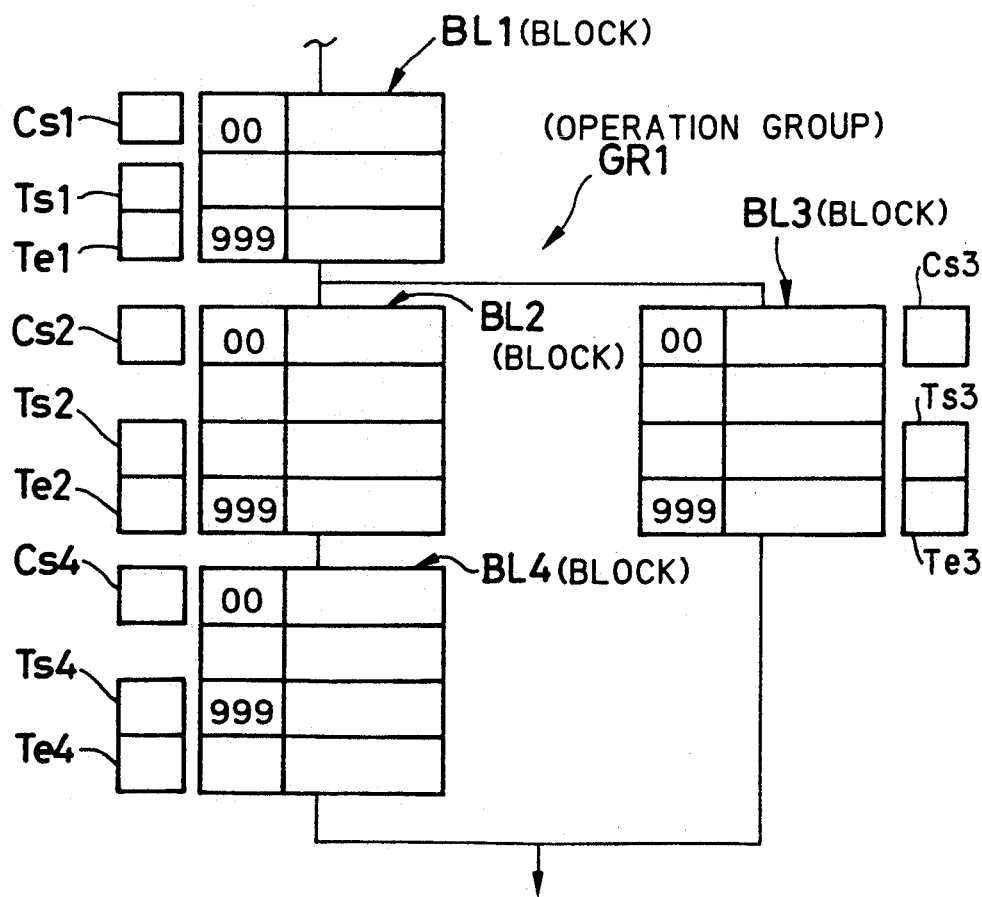
FIG. 35 is an enlarged flow-chart showing various operations in a first operation group in the production line classified into operation blocks and operation steps.

Taking one example of the first operation group GR1 consisting of a series of operations to be carried out in the first station Stn1 of the production line (FIGS. 32 and 33) as seen from FIG. 35, operation blocks BL1, BL2, BL3 and BL4 are fitted with step counters Cs1, Cs2, Cs3 and Cs4, and time registers Ts1/Te1, Ts2/Te2, Ts3/Te3 and Ts4/Te4, respectively. When the operation times Tx1, Tx2, Tx3 and Tx4 for respective operation blocks BL1, BL2, BL3 and BL4 which are inputted from the data of the time registers and stored in the memory of the microcomputer are compared with reference times Tst1, Tst2, Tst3 and Tst4 for respective blocks, the occurrence of a breakdown in each block is monitored.

Although it is not concretely indicated in the drawings, each operation group Gr1, Gr2, Gr3 or Gr4 is provided with a time register in order to measure the operation time from the start to finish of operations in the group. Therefore, when the measured operation time is monitored through comparison with a reference time for the group, an abnormality can be diagnosed for each group. Furthermore, if a count value of a step counter which is provided in each block of the group is detected for the abnormal group, a block representing a number except the number indicative of the completion of operation in the block ("999") can be found, which is accordingly specified as an abnormal block. Moreover, an abnormal step can be also specified by a count value of the step counter.

The assembling apparatus 101 of the automobile assembling line will be discussed with reference to a specifies example thereof (FIGS. 41-45).

A flow-chart of FIG. 36 shows the executing order of operations, for example, mainly of the transfer device Q2 in the operating system of assembling apparatus 1 as well as the operation blocks as a unit of a series of operations independently carried out from the start to finish thereof at the normal state of the apparatus. As indicated in FIG. 36, operations to ba carried out in each operation block are classified into a plurality of operation steps each step executed in a fixed order. In each classified operation block, operation steps are executed from the start to last one independently and separately from operation steps in the other operation blocks without any interference therebetween.

Figure 36B:
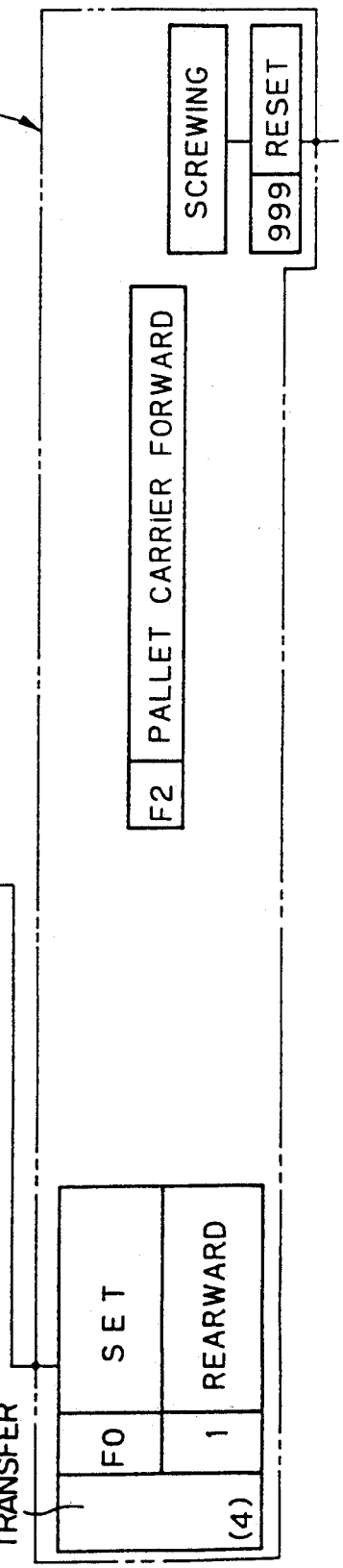

In the present embodiment, the operation steps of each output component in the operating system of apparatus 101 are divided into 6, that is, A through F operation blocks. In FIG. 36, (FIGS. 36(a) and 36(b)) there are shown operation blocks sequentially above from the left, of the positioning device Q1, of the transfer device Q2, of the docking device Q3, of the slide device Q4, of the pallet carrier device Q5 and of the screwing robot Q6. More specifically, the operation steps of positioning device Q1 are divided into A and D blocks, those of transfer device Q2 into B, D, E and F blocks, those of docking device Q3 into C and E blocks, those of slide device Q4 all in E block, and those of pallet carrier device Q5 and screwing robot Q6 respectively all in F block. The executing order has been determined in advance by the program such that the operation blocks proceed in time sequence from above to downwards in FIG. 36.

If a plurality of blocks are indicated on the same line in a horizontal direction in FIG. 36 (referring to A, B and C blocks), it means that these blocks (namely, operation steps in the blocks) are executed in a synchronous manner. On the other hand, if operation steps of a plurality of output components are included in the same block, it indicates that these output components cooperate to execute the operation steps, and the operation steps of output components are combined each other to determine the executing order of the operation steps in the block (referring to D, E and F blocks).

The operation of the assembling apparatus 101 will be discussed hereinbelow with reference to the flow-chart of FIG. 36.

It is to be noted here that when the assembling apparatus 101 is in the initial state before action, the body W supplied from the previous process is placed, but not strictly positioned, on the moving stand 112 of the positioning station S1, while the moving stand 112 is not positioned at a starting end of the transfer device Q2, and the pallet. P is at the docking station S2 in the non-locked state.

When the assembling apparatus 101 is started, first, the positioning device Q1, transfer device Q2 and docking device Q3 start operating concurrently. The positioning device Q1 positions by a series of operating steps in the block A the moving stand 112 in the front-and-rear direction, with body receiving elements 113 in the up-anddown direction and body W on the moving stand 12, respectively, which is a preparatory work for the body W to be held by the carrier 117 of the transfer device Q2 (positioning (1)). The docking device Q3 locks the pallet P at a predetermined position by a series of operation steps in the block C, which is a preparatory work for docking, and at the same time, it maintains the damper unit 3a at a predetermined posture by clamp arms 126 thereby to avoid an interference between the body W and suspension 103 when they are docked (docking (1)).

On the other hand, the transfer device Q2 performs transfer (1) by a series of operation steps in the block B. In other words, the carrier 17 starts descending from the initial state where it is positioned overhead at the starting end (operation step B0) to the positioning station S1 (operation step B1). At this time, the body holding arm 119 at the lower end of the carrier 117 is locked at a retracted position thereby not to interfere with the body W. When the operation step B1 is completed, the operation in the block B is finished, with an operating instruction for the transfer device Q2 being reset (operation step B999).

After completion of the whole operation steps in blocks A and B, the operation in block D is started, namely, the positioning device Q1 performs positioning (2) and the transfer device Q2 performs transfer (2). Specifically, the body holding arm 119 of the transfer device Q2 is released from its locking state, and at the same time, the holding pin 119a of the arm 119 is advanced to a holding position where it is engaged with the body W (operation step D1). Each body holding arm 119 is locked in this state. Thereafter, the carrier 117 is raised in operation step D2 while it holds the body W. In operation step D3, the reference pin (not shown) of the positioning device Q1 is retracted. In subsequent operation step D4, the carrier 117 is advanced above the docking station S2. Then, the body receiving elements 113 of the positioning device Q1 are lowered in operation step D5, thus completing the whole operation in the block D (completion: operation step D999). It is to be noted that the positioning device Q1 is returned to the initial state after one cycle of operation steps of the assembling apparatus 101 is completed.

When operation steps in the block D are finished, operations in block E are started, i.e., the transfer device Q2 starts transferring (3), docking device Q3 starts docking (2) and slide device Q4 starts sliding. In other words, the body W held by the carrier 117 of transfer device Q2 is gradually descended in three stages towards the docking station S2 (operation steps E1, E5 and E10), and assembled with the engine 102 and suspension 103 on the pallet P. During the descent of the body W, each clamp arm 126 and arm slide 129 of the docking device Q3 move the damper unit 103a front and rear, and right and left (operation steps E4, E7 and E9), and also the slide device Q4 moves the engine 102 front and rear (operation steps E2, E3, E6 and E8). Accordingly, an interference between the body W and damper unit 103a or engine 102 at the docking time is avoided. After the docking of the body W with the engine 102 and suspension 103, the body holding arm 119 of the carrier 117 is retracted in operation step E11, thereby completely finishing the docking. Next, the carrier 117 separated from the body W in the operation step E12 is raised, and then, the damper unit 103a is released from its clamped state (operation step E13), clamp arm 126 is retracted (operation step E14) and pallet P is released from its locked state (operation step E15). Thus, all the operations in block E are completed (completion: operation step E999).

When the block E is completely executed, the block F is started. The transfer device Q2 starts transferring (4), pallet carrier device Q5 starts carrying, and robot Q6 starts screwing. In other words, the carrier 117 of the transfer device Q2 is returned to the starting end in the initial state in the operation step F1 (operation step B0). In the operating step F2, the pallet P having the docked body W placed thereon is forwarded to the screwing station S3 by the pallet carrier device Q5. The robot Q6 then performs screwing. Thereafter, in the operation step F999, an operating instruction for the transfer device Q2, pallet carrier device Q5 and robot Q6 is reset.

When the block F is finished, the body W assemble with the engine 102 and suspension 103, etc. is carried out from the screwing station S3 to a succeeding process by the pallet carrier device Q5. Simultaneously, another pallet P for a succeeding cycle is set in the docking station S2. Accordingly, the assembling apparatus is returned to the initial state.

Figure 37:
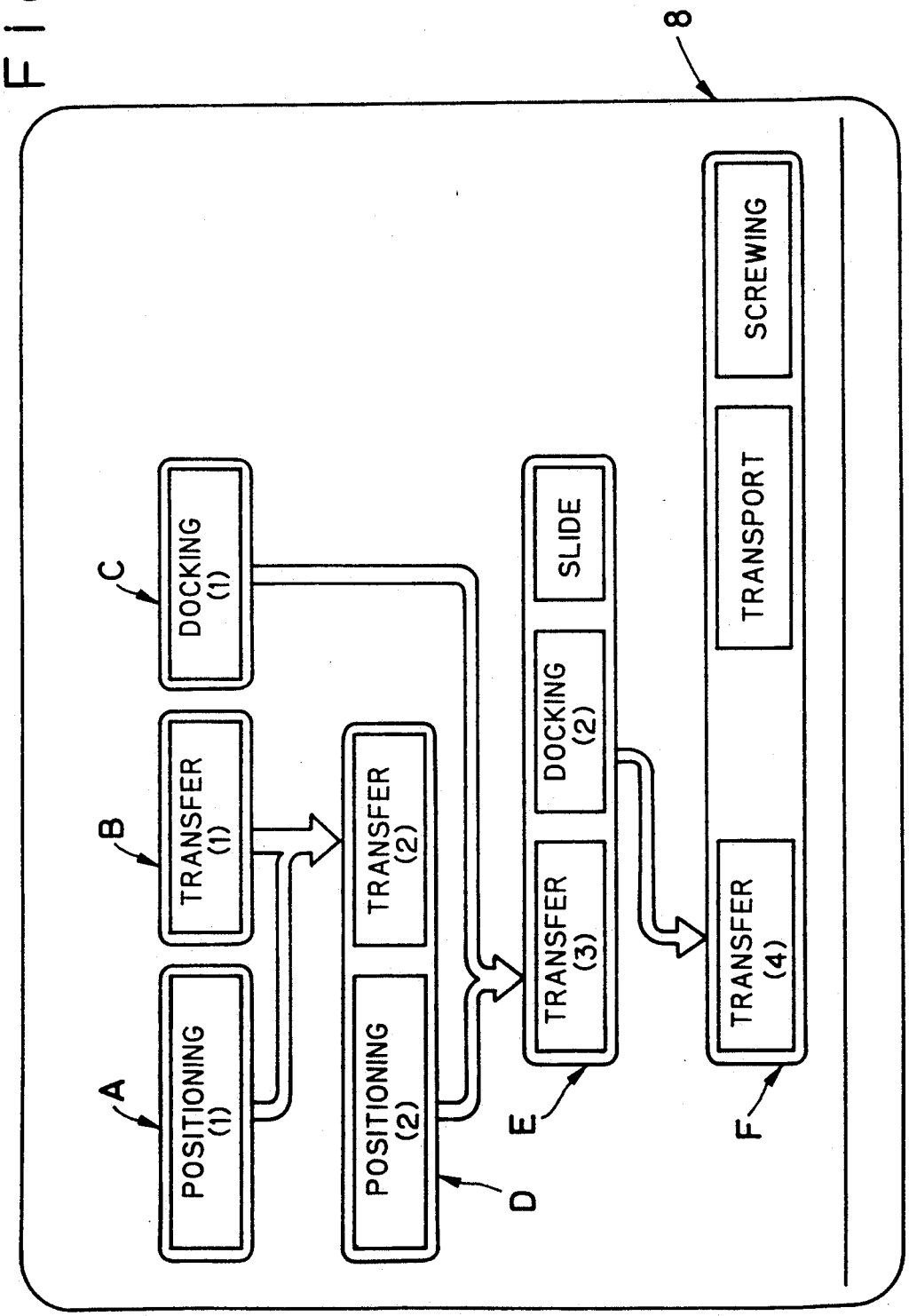
FIGS. 37 and 38 are front elevational views of a monitor screen of a display unit according to the first embodiment.

According to the above-described first embodiment, the assembling apparatus 101 is provided with a breakdown diagnosing device designed to monitor whether or not the apparatus 101 operates normally and to search for a broken position at the occurrence of the breakdown. As shown in FIG. 37, a flow-chart represented by the above-described operation blocks is indicated on a screen of a display unit 108 attached to the diagnosing device, so that the whole operating system of the assembling apparatus 101 can be seen from the monitor screen. The blocks before execution are shown colorless on the monitor screen, while those after execution are drawn by a predetermined color. Moreover, the blocks during execution are indicated in a flickering manner. Furthermore, in the case where some accident occurs in the operating system of the apparatus 1, the monitor screen of the display unit 8 is switched to show a flow-chart of the whole operating system by blocks, a flow-chart of a series of operation steps constituting the broken block, a ladder diagram of the broken point, and a table indicating names of contacts, etc. on the ladder diagram, all at the same time on the same screen.

In the present embodiment, the transition of the executing block and executing step in the breakdown diagnosing program is controlled by a step counter incorporated in the diagnosing device. This step counter for each block is provided with a memory means for storing respective timer values when the step counter shows "0" and "999".

Figure 39:
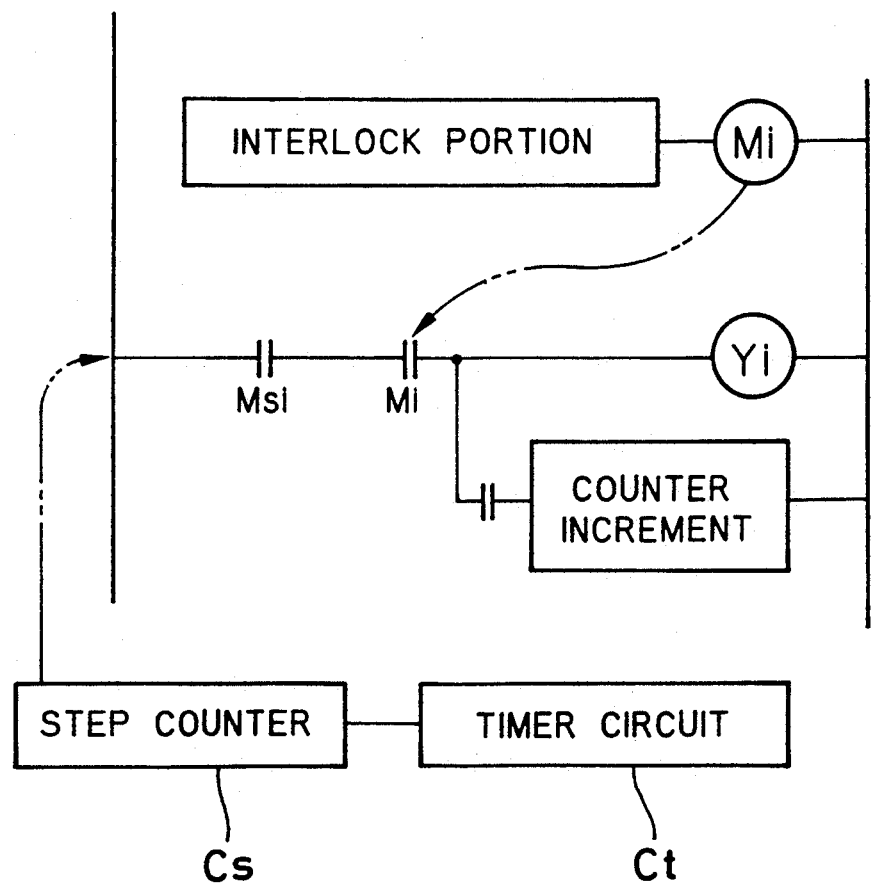
FIG. 39 is a schematic view showing the basic structure of the operation step.

Specifically, as indicated in FIG. 39, each operation step is fundamentally composed of an internal coil Mi of an interlocking section which is turned ON when all the conditions for executing the subject operation step are satisfied, an internal coil Msi which is turned ON when an operating instruction is outputted and an external coil Yi which is turned ON when both the internal coils Mi and Msi are turned ON thereby to produce an output outside. A count value of the step counter Cs which counts the number (register number) of the executing order of operation steps is arranged to be increased when the internal coils Msi and Mi are both turned ON. Therefore, where in the program is executed can be known by monitoring the count value of the step counter Cs. That is to say, not only the operating state of the assembling apparatus 101 can be monitored, but the breakdown can be diagnosed, only with the use of the step counter Cs. Accordingly, even when the sequential program for actuating the apparatus 101 is changed, the program for diagnosing the breakdown is not influence, thereby reducing labors in the change of the system.

The above-mentioned step counter Cs is provided in each operation block. Every one operation step in the block is finished, the count value of the counter Cs is incremented one, and thereafter, a succeeding step following the completed step is started.

Further, the timer circuit Ct provided for each block can measure the time from when an operating instruction for the operation block is set (register number 0) until it is reset (register number 999), i.e., the operation time from the start to finish of the operations in the block. In comparing the measured operation time with a reference operation time for the block, the presence or absence of an abnormality or breakdown in the block can be diagnosed.

It is further arranged in the present embodiment that the cycle time of the whole of the operating system of the apparatus 101 is measured, which is in turn compared with a reference cycle time, whereby the presence or absence of an abnormality in the apparatus 101 can be diagnosed.

In determining the reference operation time for each block, a reference value thereof is updated by a learning function every time the time is measured.

More specifically, for example, in measuring the operation time of one operation block, a trial operation is repeated for a predetermined number of times (e.g., about 100 times) before the apparatus 101 is operated, and the average operation time To in the block and the standard deviation ○ are calculated. This average operation time To is set as the reference operation time for the first cycle. If the measured operation time t exceeds T+3, T being the reference operation time and 3 being the standard deviation, the time t is excluded from the calculation of the reference operation time To as an abnormal value.

After the operation block is executed in the first cycle, a fresh average value T1 (reference operation time) and standard deviation 1 are calculated by adding the measured operation time t1 in the first cycle to the data. The calculation is repeated similarly every operating cycle of the apparatus 101. When the (n)th cycle is completed, a fresh reference operation time Tn and standard deviation n are calculated for the (n+1)th cycle. Thus, when the measured operation time for the (n+1)th cycle is compared with the reference operation time Tn, and if the measured operation time is within the range of Tn+3 n, the measured time is diagnosed normal. On the contrary, if the measured operation time exceeds the range, the time is diagnosed as abnormal. However, even in the case where the measured time is diagnosed abnormal, if the operation of the whole apparatus 101 is normal, only the fact of the abnormality found in the block is recorded, without any alarm indicative of an abnormal operation of the apparatus generated. The measured time in this case is excluded from the next calculation for a reference operation time and standard deviation of a succeeding cycle.

As is described hereinabove, because the learning function is used for determining the reference operation time according to the present embodiment, although the operation time of each output component may change with time during its lengthy use which results in change in the measured operation time of each operation block, the assembling apparatus 101 can be prevented from being erroneously diagnosed as abnormal. In general, if the reference operation time is fixedly set, a trial operation should be repeated many times (for example, about 1000 times) in order to maintain the accuracy of the set value. According to the present embodiment, however, a reference value is arranged to be updated every cycle with exclusion of abnormal values, and accordingly, the more is repeated the cycle, the more the accuracy of the reference value is improved. Therefore, the number of trial operations can be reduced considerably in order to set an initial value of the reference value.

Figure 40:
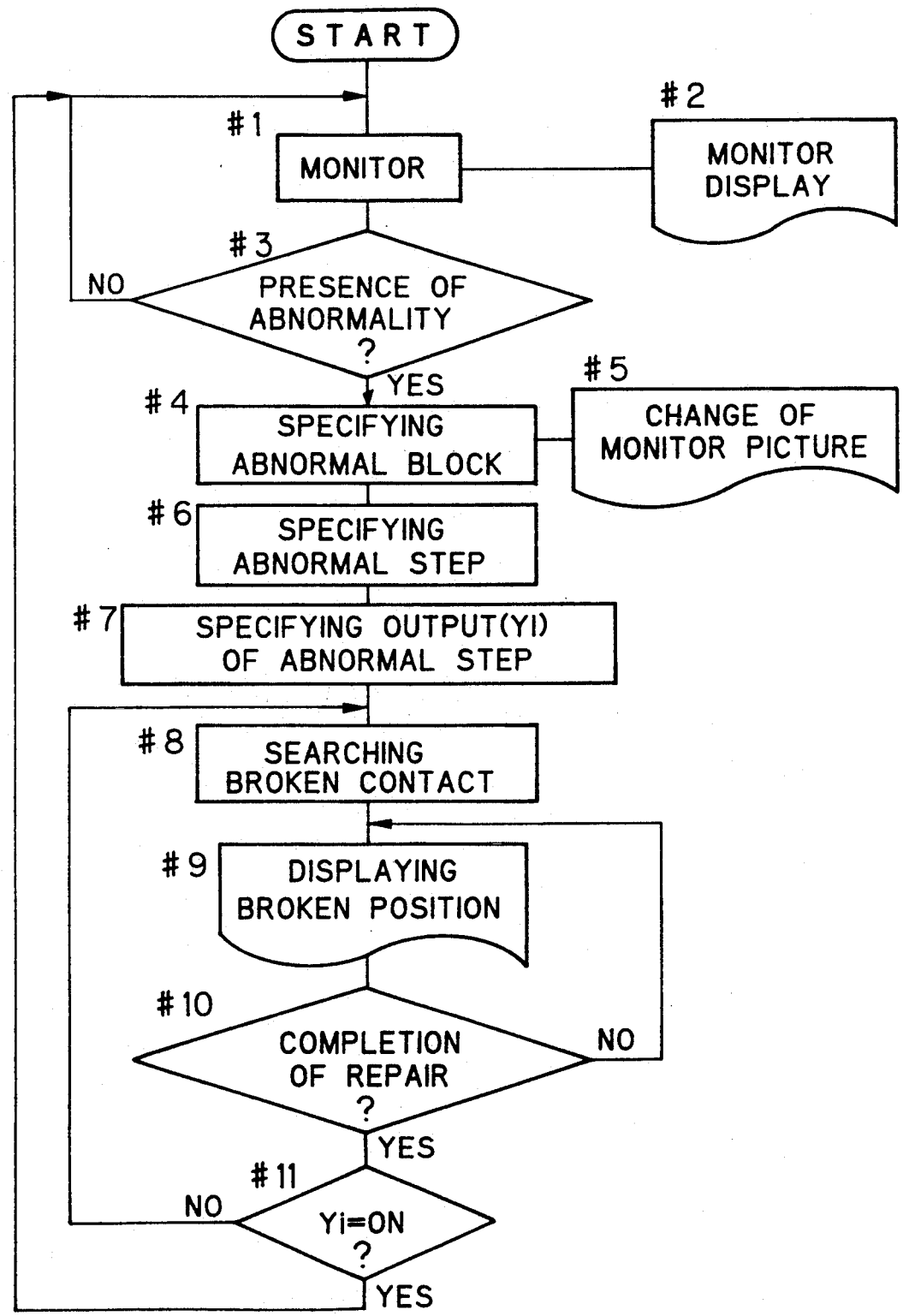
FIG. 40 is a flow-chart explanatory of the operation of a breakdown diagnosing device according to the first embodiment.

A breakdown in the assembling apparatus 101 is diagnosed in the following manner with the use of the above diagnosing device, which will be described below with reference to a flow-chart of FIG. 40.

Prior to the start of the system, each contact point and device on the ladder diagram are assigned to a monitor memory of a microcomputer built in the diagnosing device. The output coil Yi corresponding to the internal coil Mi of the interlocking section in each operation step is registered in the memory. The step counter and output, coil are indicated in a collation map.

In step #1 after the system is started, the cycle time of the apparatus 101 and operation time of each operation block are monitored. At the same time, in step #2, the whole operating system of apparatus 101 is indicated on the monitor screen of the display unit 8 (referring to FIG. 37). In step #3, it is diagnosed whether or not an abnormality is found in the whole of the operating system. Without any abnormality found (in the case of NO), the monitoring in step #1 is continued. The diagnosis in step #3 abnormal only when the measured cycle time of the apparatus 101 is over the reference cycle time by a predetermined value (+3). In other cases than the above-mentioned case, even when the operation time in each block is found abnormal, the apparatus 101 is not diagnosed as abnormal, with no generation of an alarm.

Figure 38:
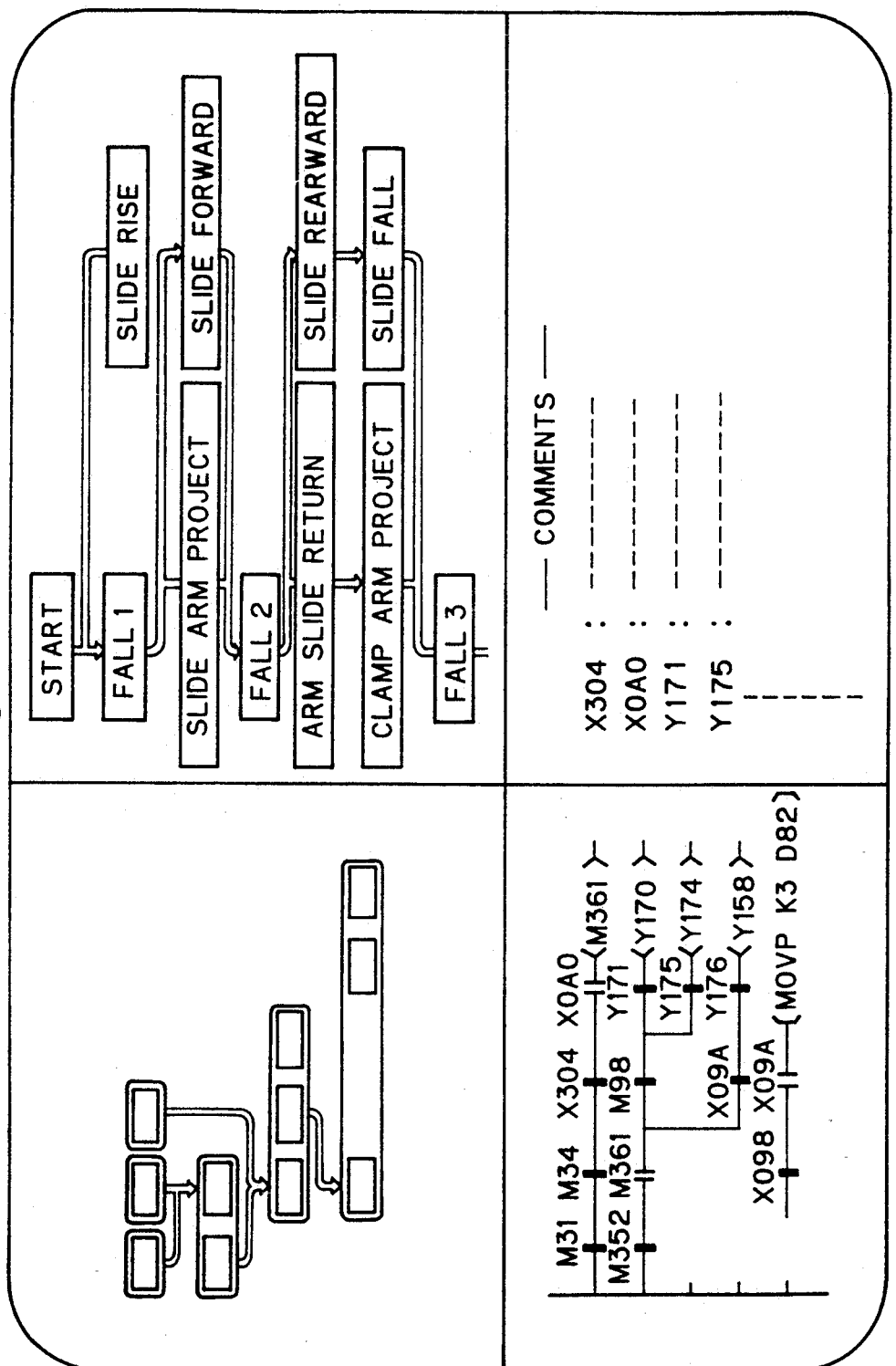

In the case of YES in the diagnosis of step #3, the diagnosis is done for every block thereby to specify the abnormal block. In the present embodiment, the abnormal block can be specified by searching out a block which does not finish operating although the measured cycle time exceeds the reference cycle time by the predetermined value or more, namely, which has the register number of the operation step other than 0 (preparing state) or 999 (completed state). Concurrently with step #4, the monitor screen of the display unit 10 is switched to a screen divided into four sections (referring to FIG. 38) in step #5.

Then, in step #6, each operation step in the abnormal block is diagnosed so as to specify the abnormal operation step. In the present embodiment, the abnormal operation step can be easily specified by the value of step number in the abnormal block indicated at that time by the step counter Cs. The abnormal operation step as well as the abnormal block is emphasized by a predetermined color on the monitor screen divided into four sections or assigned on four-page screen. Thereafter, in step #7, the output coil Yi corresponding to the abnormal operation step is specified on the ladder diagram.

After the output coil Yi is specified in the above manner, a broken contact is searched in step #8. The search is carried out in such a manner that contacts on the ladder diagram are sequentially checked one by one corresponding to the abnormal operation step. However, it is more preferable that the position of each contact on the ladder diagram is designated by an address with a predetermined symbol, and assigned on the memory of the microcomputer incorporated in the diagnosing device, thereby to form an address map of contact points. Accordingly, the broken contact can be automatically searched if the address map is traced.

The searched broken position is emphatically indicated by the predetermined color on the monitor screen (step #9). Therefore, the operator can restore the broken position. At the same time, in step #10, it is confirmed whether or not the repair is completed. If the repair is not completed, the repairing operation is continued. If the repair is completed, it is made sure in step #11 whether or not the output coil Yi of the abnormal operation step is turned ON. If the result of step #11 is NO, it means that the broken position is not yet restored. Therefore, each step after step #8 is repeatedly conducted. If the result of step #11 is YES, then, the flow is returned to step #1, reopening the general monitor.

As is described hereinabove, according to the present embodiment, the operation of the assembling apparatus 101 is diagnosed as a whole by means of the cycle time. Therefore, an abnormality of the individual operation block or operation step which does not influence the entire operation of the apparatus can be prevented from being erroneously diagnosed as abnormal.

Moreover, the abnormal block when the apparatus 1 is found abnormal is easily detected by the step counter provided for each block, and further the abnormal operation step can be speedily and correctly detected.

In the foregoing embodiment (hereinafter, referred to as a first embodiment), the description is directed to the assembling apparatus 101 for installing basic components such as suspensions and the like and an engine in the body of an automobile. However, the present invention is not restricted to the assembling apparatus 101, but is applicable to other devices or equipments and further for diagnosing breakdowns of the whole production line.

SECOND EMBODIMENT OF MALFUNCTION DIAGNOSIS

A second embodiment will be described hereinbelow, in which the diagnosing method is applied to diagnose the whole production line of an automobile assembling factory and to specify the breakdown position.

Figure 46:
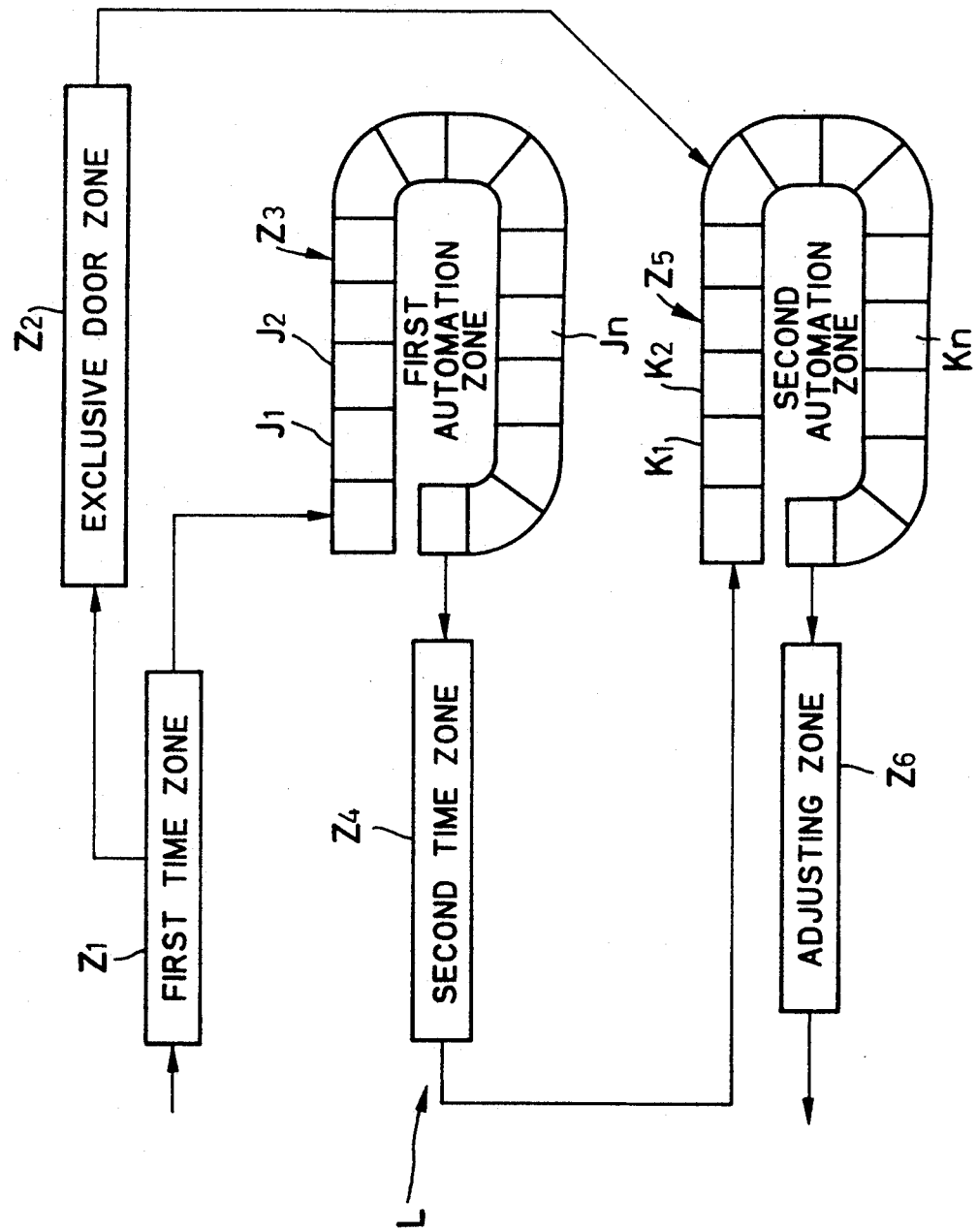
FIG. 46 is a diagram schematically showing the total structure of an automobile assembling line according to the second embodiment of the malfunction diagnosis system.

With reference to FIG. 46, an assembling line L of automobiles according to the second embodiment is divided into 6 zones, namely, a first and a second trim zones Z1, Z4, a first and a second automation zones Z3, Z5, an exclusive door zone Z2 and an adjusting zone Z6. Many automatic assembling devices are arranged in a loop in the automation zones Z3 and Z5. Almost all of the operations are automatically conducted in the automation zones Z3 and Z5. On the other hand, manual assembling is mainly carried out in the remaining four zones.

In the first trim zone Z1, an external wiring harness, an antenna feeder wire, a top sealing, a brake pedal and a reserve tank are mounted in the body of an automobile supplied into the assembling line L after the painting process, which should be done before the automatic assembling in the first automation zone Z1. Although the automobile is carried in the trim zone Z1 with the door attached, the door is once detached from the body in the first trim zone Z1, and the detached door is sent to the exclusive door zone Z2. The exclusive door zone Z2 works only to equip the door.

Then, the body after passing the first trim zone Z1 is sent to the first automation zone Z3 in which various automatic assembling devices J1, J2,...,Jn... are arranged in a predetermined order of assembling operations. In the first automation zone Z3, functional components such as an engine, a transmission, etc., carrier components such as a suspension and the like, and a base floor are automatically installed in the body. By the way, the assembling apparatus 101 of the first embodiment is placed in this first automation zone Z3.

After the first automation zone Z3, the body is sent to the second trim zone Z4 wherein an instrumental panel, a speaker and an ash tray are installed. The assembling operations in the second trim zone Z4 should be done before the automatic assembling in the second automation zone Z5.

The body sent in the second automation zone Z5 is automatically fitted with tires, front/rear window glasses and sheets by various kinds of automatic mounting devices K1, K2,...,Kn... arranged in a predetermined order of operations. Further, the completed door is mounted in the body in the second automation zone Z5.

Then, when the automobile is sent to the adjusting zone Z6, the step difference between the body and door when the door is closed is adjusted. After the adjustment, the automobile is sent to a tester line in a succeeding process (not shown).

In the assembling line L in the above-described structure, a breakdown diagnosing unit is provided for every class in the total assembling line L, in zones and in mounting devices in the zones. Therefore, when an accident takes place in the total assembling line L, a diagnosis is carried out in the order from zones, mounting devices, operation blocks in the operating system and operation steps in the block.

Figure 47:
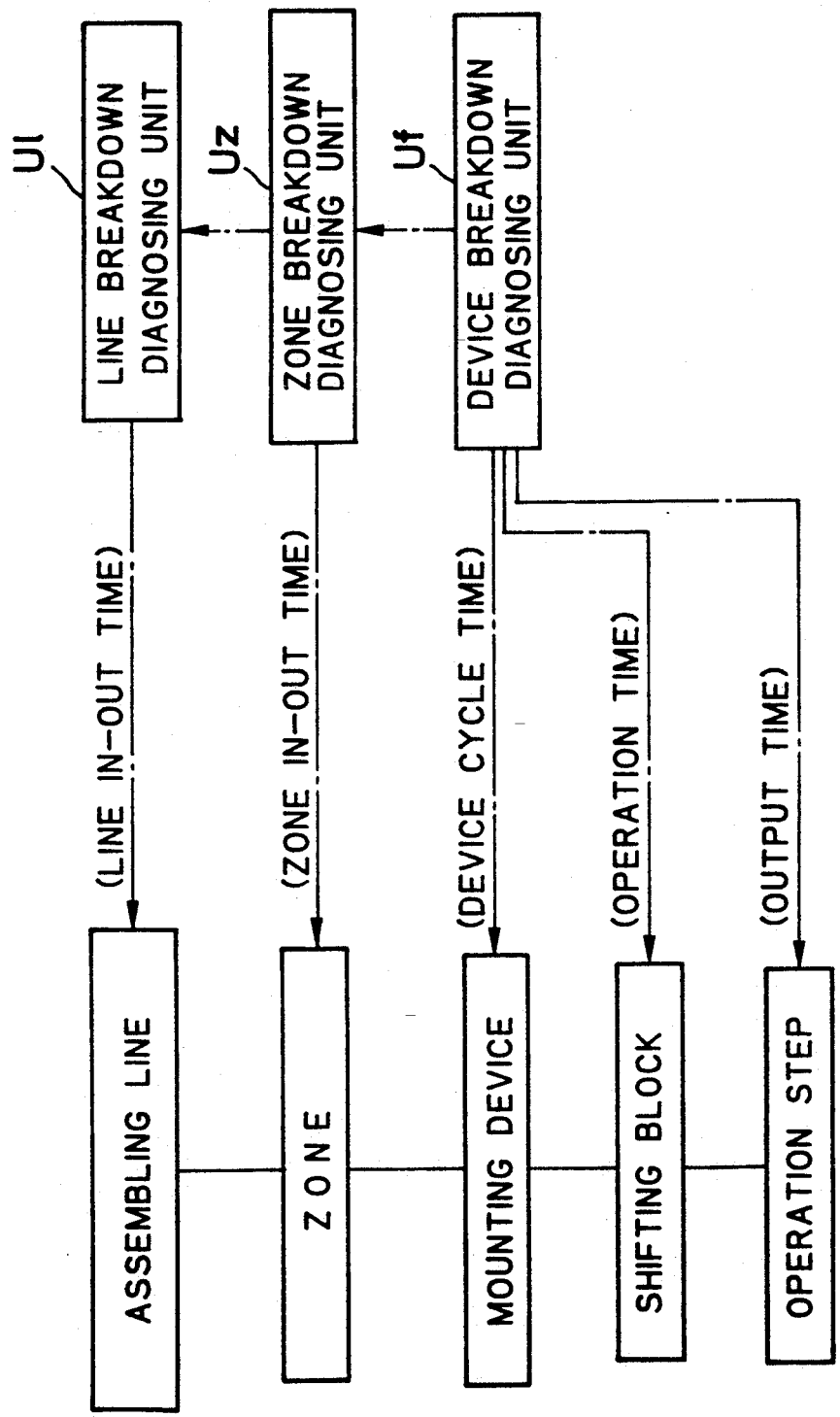
FIG. 47 is a block diagram showing the construction of classes of the automobile assembling line and breakdown diagnosing units according to the second embodiment.

FIG. 47 is a block diagram showing the structure of classes in the assembling line L and a breakdown diagnosing unit for each class. As is clear from FIG. 47, the assembling line L has a line breakdown diagnosing unit U for diagnosing a breakdown in the total line L, zone breakdown diagnosing units Uz,...,Uz respectively provided for each zone Z1-Z6 for diagnosing each zone, and device breakdown diagnosing units Uf,...,Uf provided respectively for each automatic mounting device J1, J2,...,Jn,... in the first automation zone Z3 and for each automatic mounting device K1, K2,...,Kn,... in the second automation zone Z5 for diagnosing the each device. The breakdown diagnosing device according to the first embodiment corresponds to the above-mentioned device breakdown diagnosing unit Uf.

In the line breakdown diagnosing unit U, the time (line IN-OUT time) since the to-be-assembled body is sent into the first trim zone Z1 (IN) until it is sent out from the adjusting zone Z6 (OUT) is measured. By comparing the measured time with a reference time, the assembling line L is diagnosed as a whole.

In the zone breakdown diagnosing unit Uz, the time (zone IN-OUT time) since the body is sent into the subject zone (IN) until it is sent out to a zone of a succeeding process (OUT) is measured, and compared with a reference time. Accordingly, the zone is diagnosed as a whole. The result of diagnosis by the zone breakdown diagnosing device Uz is inputted to the line breakdown diagnosing device U. When the line L as a whole is determined to be abnormal, the broken zone can be specified. On the other hand, when the line IN-OUT time is within the reference range, even when the zone IN-OUT time of each zone is over the reference range, the line L as a whole is not decided to be abnormal, and no alarm is generated for the line L.

Moreover, in the device diagnosing unit Uf, the cycle time of the subject device is measured and compared with a reference cycle time, whereby the presence or absence of the breakdown in the device is diagnosed. The diagnosing result by the device breakdown diagnosing unit Uf is inputted to the zone diagnosing unit Uz belonging to the subject device. Therefore, when the zone is found abnormal, it can be specified which device is broken down. In this case also, if the zone is not abnormal as a whole, no alarm is generated for the zone even when individual devices are found abnormal.

Furthermore, the device breakdown diagnosing unit Uf measures, as is fully described in the first embodiment, the operation time in each block of the operating system of the device and the output time of operation steps in each block. When an abnormality is observed in the device, the measured operation time and output time are respectively compared with the reference operation time and reference output time, so that the abnormal block and step can be specified. Thus, which point or position is broken down in the device can be strictly identified.

As is explained in the foregoing description, according to the second embodiment of the present invention, the line breakdown diagnosing unit U diagnoses the presence or absence of a breakdown in the total line L, and at the same time, when a breakdown is observed, the broken zone can be specified, and then the broken device can be specified by the zone breakdown diagnosing unit Uz. Moreover, the device breakdown diagnosing unit Uf can specify the broken position of the device. Further, since the presence or absence of breakdown in each class is diagnosed only by the respective IN-OUT time, even the abnormality resulting from an inadvertent manipulation of the operator, not because of the breakdown in the actuator, device, etc. can be detected.

In the first embodiment, operation steps to be carried out by main output components constituting the operating system of the assembling apparatus 101 (positioning device Q1, transfer device Q2, docking device Q3, slide device Q4, pallet transfer device Q5 and screwing robot Q6) are divided into operation blocks. Therefore, in the event a series of operations are carried out in cooperation with a plurality of the output components, the operation steps of every output component are combined each other, i.e., the operation steps are so divided as to overlap for each output component (with reference to D, E and F blocks). It may be possible to divide the blocks such that each block is constituted by a group of operation steps for one output component.

The present invention is not limited to the above embodiment and various changes and modifications can be made within the spirit and scope of the present invention. Therefore, to apprise the public of the scope of the present invention the following claims are made.

What is claimed is:

1. A method in which operations to be successively performed by various equipment units for a production line are grouped into blocks of operation each having a sequence of unit operations to automatically compose a sequential control program describing the operations of the production line with respect to the operation blocks, the operation blocks being grouped so that each operation block can be conducted independently of the other operation blocks from the start to the end of the block, said method comprising the steps of:
    a) previously forming and storing at least one standardized step ladder pattern for operation steps constituting each of the operation blocks before the program composition;
    b) inputting and storing first data for describing the operation blocks representing the program composition object production line, and the ordinal relationship between the operation blocks;
    c) inputting and storing second data for describing specific operations of the operation steps constituting each of the operation blocks along with third data designating the order of execution of the operation steps in each operation block;
    d) reading out of the memory the step ladder pattern corresponding to one of the operation steps constituting each operation block along with the second data input for this operation step;
    e) appending the second data to the read step ladder pattern to complete a step ladder element;
    f) successively performing the operations of the steps d and e with respect to the operation steps in order of upper to lower operation steps based on the third data; and
    g) performing the operation of the step f with respect to all the operation blocks based on the first data.

2. The method according to claim 1, wherein each of the operation step is characterized by having one output.

3. The method according to claim 1, wherein the operation of the step g is executed in order of upper to lower blocks.

4. The method according to claim 1, wherein the step a includes previously storing, with respect each of all the equipment units, data on a discriminator for the equipment unit and operating devices included in the equipment unit, and the step c includes inputting the discriminators of the equipment units used for the actual production line.

5. The method according to claim 1, wherein the operation blocks are defined by setting a unit block which is one of possible blocks each capable of being conducted independently of the other blocks from the start to the end, and which has a maximum number of operation steps.

6. The method according to claim 1, wherein the standardized step ladder pattern includes a portion in which the operation of an operation step is described, a portion in which an interlock condition for this operation step, and an output portion.

7. A method in which operations to be successively performed by various equipment units for a production line are grouped into blocks of operation each having a sequence of unit operations to automatically compose a sequential control program describing the operations of the production line with respect to the operation blocks, the operation blocks being grouped so that each operation block can be conducted independently of the other operation blocks from the start to the end of the block, each of the operation blocks being divided into a plurality of operation steps, said method comprising the steps of:
    a) previously storing a step ladder pattern including a device set formed of a plurality of unit operating devices for each of the operation steps, and connection data for describing the connection relationship between the unit operating devices constituting this device set;
    b) forming and storing a step data map containing various categories of device data on a minimum unit operating device relating to the device set of each operation step;
    c) reading out the standardized step ladder pattern with respect to the device set of one of the operation steps;
    d) appending the connection data and the device data to the unit operating devices constituting the set of operating devices of the step ladder pattern read out in the step c, and storing the set of operating devices as an element of a step ladder program.

8. An apparatus in which operations to be successively performed by various equipment units for a production line are grouped into blocks of operation each having a sequence of unit operations to automatically compose a sequential control program describing the operations of the production line with respect to the operation blocks, the operation blocks being grouped so that each operation block can be conducted independently of the other operation blocks from the start to the end of the block, said apparatus comprising:

memory means for previously forming and storing at least one standardized step ladder pattern for operation steps constituting each of the operation blocks before the program composition;

first data processing means for forming a first map by inputting first data for describing the operation blocks representing the program composition object production line and the ordinal relationship between the operation blocks, the first map showing the relationship between the operation blocks;

second data processing means for forming a second map by inputting second data for describing specific operations of the operation steps constituting each operation block and by inputting third data designating the order of execution of the operation steps in each operation block, the second map showing the relationship between the operation steps with respect to each operation block; and ladder element forming means for forming a step ladder element by appending the second data input for one of the operation steps constituting each operation block to the step ladder pattern corresponding to this operation step.

* * * * *